(12) United States Patent
Ishida et al.

(10) Patent No.: US 11,079,430 B2
(45) Date of Patent: Aug. 3, 2021

(54) ELECTRONIC COMPONENT HANDLER AND ELECTRONIC COMPONENT TESTER

(71) Applicant: NS Technologies, Inc., Nagano (JP)

(72) Inventors: Daisuke Ishida, Chino (JP); Shuichi Wakabayashi, Okaya (JP); Yasushi Mizoguchi, Suwa (JP); Hirokazu Ishida, Kanazawa (JP); Tatsunori Takahashi, Shiojiri (JP); Kensuke Ogasawara, Matsumoto (JP); Takahito Sanekata, Shiojiri (JP)

(73) Assignee: NS TECHNOLOGIES, INC.

( * ) Notice: Subject to any disclaimer, the term of this patent is extended or adjusted under 35 U.S.C. 154(b) by 191 days.

(21) Appl. No.: 16/464,368

(22) PCT Filed: Nov. 28, 2017

(86) PCT No.: PCT/JP2017/042673
§ 371 (c)(1),
(2) Date: May 28, 2019

(87) PCT Pub. No.: WO2018/101276
PCT Pub. Date: Jun. 7, 2018

(65) Prior Publication Data
US 2021/0156909 A1  May 27, 2021

(30) Foreign Application Priority Data

Nov. 29, 2016 (JP) .............................. JP2016-230939
Nov. 29, 2016 (JP) .............................. JP2016-230940
(Continued)

(51) Int. Cl.
*G01R 31/28* (2006.01)
*G01R 31/26* (2020.01)

(52) U.S. Cl.
CPC ..... *G01R 31/2887* (2013.01); *G01R 31/2893* (2013.01)

(58) Field of Classification Search
CPC ............ G01R 31/2887; G01R 31/2893; G01R 31/28; G01R 31/2867; G01R 31/26;
(Continued)

(56) References Cited

U.S. PATENT DOCUMENTS

2009/0136118 A1   5/2009   Ichikawa

FOREIGN PATENT DOCUMENTS

CN   101180549 A   5/2008
JP   H04-200892 A   7/1992
(Continued)

*Primary Examiner* — Neel D Shah
(74) *Attorney, Agent, or Firm* — Harness, Dickey & Pierce, P.L.C.

(57) ABSTRACT

An electronic component handler includes a first holder that is movable in a first direction and a second direction different from the first direction and is capable of holding an electronic component, a second holder that is movable in the first direction and the second direction independently of the first holder and is capable of holding the electronic component, a light irradiation section that is arranged so as to be capable of irradiating an electronic component placement portion on which the electronic component is placed with light through a gap between the first holder and the second holder, and an imaging section that is capable of imaging the electronic component placement portion irradiated with the light in the first direction, and determines whether or not the electronic component is placed on the electronic component placement portion based on the imaging result obtained by imaging by the imaging section.

20 Claims, 56 Drawing Sheets

(30) Foreign Application Priority Data

| Dec. 9, 2016 | (JP) | ................................ JP2016-239897 |
| Dec. 28, 2016 | (JP) | ................................ JP2016-257051 |
| May 17, 2017 | (JP) | ................................ JP2017-097940 |
| Nov. 15, 2017 | (JP) | ................................ JP2017-220300 |

(58) Field of Classification Search
CPC ........... G01R 31/2851; H05K 13/0812; H05K 13/041; H05K 13/0413; H05K 13/0813; H05K 13/0815; H05K 13/18; H05K 13/0069; H05K 13/04; H05K 13/0452; H05K 13/021

See application file for complete search history.

(56) References Cited

FOREIGN PATENT DOCUMENTS

| JP | H08-179236 | A | 7/1996 |  |  |
| JP | H11-244926 | A | 9/1999 |  |  |
| JP | 2007-200914 | A | 8/2007 |  |  |
| JP | 2013-232549 | A | 11/2013 |  |  |
| JP | 2014-196908 | A | 10/2014 |  |  |
| JP | 2014-220269 | A | 11/2014 |  |  |
| JP | 2019128285 |   | * 8/2019 | ............ | G01R 31/26 |
| WO | WO-2006-109358 | A1 | 10/2006 |  |  |

* cited by examiner

Fig. 73

| Status: Nomal Layout ID: 4-2-40-60-130 | Slots | | | | Hand speed | | | | | |
|---|---|---|---|---|---|---|---|---|---|---|
| | 1 | 2 | 3 | 4 | 100% | 80% | 60% | 40% | 20% | |
| Camera 1 | Processing setup for slot2 at speed 80%··· | | | | Set | Not set | Not set | Not set | Not set | |
| Camera 2 | Processing setup for slot2 at speed 80%··· | | | | Set | Not set | Not set | Not set | Not set | |
| Camera 3 | Processing setup for slot2 at speed 80%··· | | | | Set | Not set | Not set | Not set | Not set | |
| Camera 4 | Processing setup for slot2 at speed 80%··· | | | | Set | Not set | Not set | Not set | Not set | |

Trigger point setting

300

Start  Pause  Quit

ELECTRONIC COMPONENT HANDLER AND ELECTRONIC COMPONENT TESTER

BACKGROUND

1. Technical Field

The present invention relates to an electronic component handler and an electronic component tester.

2. Related Art

In the related art, for example, an electronic component tester that tests electrical characteristics of an electronic component such as an IC device is known. In this electronic component tester, an electronic component handler for transporting the IC device is incorporated (see, for example, International Publication No. 2006/109358).

In the electronic component handler described in International Publication No. 2006/109358, an image of a socket (test unit) that tests the electronic component is captured in a state where the electronic component is not transported, and the image is stored in advance as reference image data. Then, the electronic component handler is configured such that the image of the socket is captured during the transport of the electronic component and the image is compared with the reference image data. With this configuration, it is possible to detect transport abnormality and the like in the socket.

However, in the electronic component tester described in International Publication No. 2006/109358, depending on a positional relationship between a transport unit (hand) and the socket or the like, the socket is shielded by the transport unit, which makes it difficult to image the socket. As a result, there is a possibility of overlooking transport abnormality or the like in the socket.

Depending on a thickness of the electronic component and a color of the electronic component, it may be difficult to detect the transport abnormality or the like.

SUMMARY

The present invention has been made to solve at least a part of the problems described above, and may be realized as follows.

An electronic component handler of the present invention includes a first hold portion that is movable in a first direction and a second direction different from the first direction and is capable of holding an electronic component, a second hold portion that is movable in the first direction and the second direction independently of the first hold portion and is capable of holding the electronic component, a light irradiation section that is arranged so as to be capable of irradiating an electronic component placement portion on which the electronic component is placed with light through a gap between the first hold portion and the second hold portion, and an imaging section that is capable of imaging the electronic component placement portion irradiated with the light in the first direction, and determines whether or not the electronic component is placed on the electronic component placement portion based on the imaging result obtained by imaging by the imaging section.

With this configuration, it is possible to detect whether or not the electronic component remains on the electronic component placement portion after an operation of transporting the electronic component to the electronic component placement portion is performed. In particular, since a configuration in which light is emitted from between the first hold portion and the second hold portion to the electronic component placement portion to capture the image thereof is adopted, it is possible to detect whether or not the electronic component remains on the electronic component placement portion even with the configuration including the first hold portion and the second hold portion.

In the electronic component handler of the present invention, it is preferable that the first hold portion and the second hold portion are arranged in the second direction.

With this configuration, the first hold portion and the second hold portion can be configured to be able to move in the second direction while the first hold portion and the second hold portion are in a state of being aligned in the second direction. Therefore, for example, when a movable range of the first hold portion and the second hold portion is a shape extending in the second direction, a movement distance of the first hold portion and the second hold portion can be reduced and transport efficiency is excellent.

In the electronic component handler of the present invention, it is preferable that the first hold portion and the second hold portion are simultaneously movable in the second direction.

With this configuration, for example, the first hold portion and the second hold portion can perform different operations. Therefore, it is possible to improve transport efficiency and test efficiency.

In the electronic component handler of the present invention, it is preferable that the first hold portion is positioned between the imaging section and the electronic component when pushing the electronic component against the electronic component placement portion, and the second hold portion is positioned between the imaging section and the electronic component when pushing the electronic component against the electronic component placement portion.

When the first hold portion or the second hold portion pushes the electronic component against the electronic component placement portion, it is difficult for the imaging section to image the electronic component. When the imaging section is configured to capture an image only when the electronic component can be imaged, imaging may be omitted when the first hold portion or the second hold portion pushes the electronic component against the electronic component placement portion, and it is possible to easily set at which timing imaging is to be omitted.

In the electronic component handler of the present invention, it is preferable that the light irradiation section performs irradiation with the light in a direction at least intersecting the first direction and not orthogonal to the first direction.

With this configuration, it is possible to easily recognize change in the position of irradiated light depending on the presence or absence of the electronic component. Therefore, it is possible to more accurately detect whether or not the electronic component remains on the electronic component placement portion.

In the electronic component handler of the present invention, it is preferable that the direction of the light with which the light irradiation section performs irradiation can be adjusted.

With this configuration, for example, it is possible to cope with an electronic component placement portion where arrangement positions of the electronic components are different.

In the electronic component handler of the present invention, it is preferable to include an irradiation position determination unit for determining whether or not the direction in which the light irradiation section performs irradiation with the light is a predetermined direction.

With this configuration, it is possible to determine whether or not the direction in which the light irradiation section performs irradiation with light is the predetermined direction.

In the electronic component handler of the present invention, it is preferable that the light irradiation section performs irradiation with the light whose irradiation shape at an irradiation destination is a linear shape extending in the second direction.

With this configuration, it is possible to easily recognize the change in the position of the irradiated light in accordance with the presence or absence of the electronic component in the imaging result obtained by imaging by the imaging section. Therefore, it is possible to more accurately detect whether or not the electronic component remains on the electronic component placement portion.

In the electronic component handler of the present invention, it is preferable that a plurality of the light irradiation sections are provided.

With this configuration, a plurality of locations of the electronic component placement portion can be irradiated with light. Therefore, it is possible to determine whether or not the electronic component remains on the electronic component placement portion at the plurality of locations on the electronic component placement portion.

In the electronic component handler of the present invention, it is preferable that the electronic component placement portions include a plurality of recesses arranged along a third direction intersecting the first direction and the second direction and accommodate the electronic component, and the light irradiation sections are arranged along the third direction.

With this configuration, the light irradiation directions of the respective light irradiation sections can be made to be the same direction.

In the electronic component handler of the present invention, it is preferable to include a light reflection portion that reflects the light emitted from the light irradiation section.

With this configuration, the degree of freedom of arrangement of the light irradiation section can be increased.

In the electronic component handler of the present invention, it is preferable that the light reflection portion is configured to be pivotable, the light reflection portion has a light reflection surface that reflects the light, and a pivot axis of the light reflection portion is positioned on the light reflection surface.

With this configuration, when the irradiation direction of light is adjusted by pivoting the light reflection portion, the adjustment can be accurately performed.

In the electronic component handler of the present invention, it is preferable that a plurality of the light irradiation sections and the light reflection portions provided and the light reflections portions are arranged in the third direction intersecting the first direction and the second direction.

With this configuration, it is possible to simplify arrangement form of the light reflection portion and to contribute to space saving.

In the electronic component handler of the present invention, it is preferable that an optical axis of the imaging section intersects an extension line in a direction in which the light reflection portions are aligned.

With this configuration, the imaging section can image the portion of the electronic component placement portion irradiated with the light reflected by each light reflection portion.

In the electronic component handler of the present invention, it is preferable to include light reflection portion driving units for pivoting the light reflection portion, the respective light reflection portion driving units are arranged along the third direction intersecting the first direction and the second direction, and the light reflection portion driving units adjacent in the third direction are arranged to be shifted in the second direction.

With this configuration, even if an interval between the light reflection portion driving units is made relatively small, it is possible to prevent the light reflection portion driving units adjacent in the third direction from interfering with each other, and it is possible to save space.

In the electronic component handler of the present invention, it is preferable to include a position detection unit that detects the position of the first hold portion or the second hold portion.

With this configuration, for example, the position of the first hold portion or the second hold portion when the imaging section is capable of imaging the electronic component placement portion can be detected.

In the electronic component handler of the present invention, it is preferable that the imaging section capable of imaging the electronic component placement portion through a gap between the first hold portion and the second hold portion, between the imaging start time and the imaging end time.

With this configuration, it is possible to prevent the electronic component placement portion from being imaged when the electronic component placement portion is shielded by the first hold portion or the second hold portion. Therefore, imaging can be performed without waste.

In the electronic component handler of the present invention, it is preferable that the light irradiation section performs irradiation with the light before the imaging start time and stops irradiation with the light after the imaging end time.

With this configuration, while the imaging section is imaging, the light irradiation section can be in a state of irradiating light.

In the electronic component handler of the present invention, it is preferable that the light irradiation section performs irradiation with the light when imaging is possible.

With this configuration, for example, it is possible to prevent the electronic component placement portion from being imaged when the electronic component placement portion is shielded by the first hold portion or the second hold portion. Therefore, imaging can be performed without waste.

In the electronic component handler of the present invention, it is preferable that the electronic component placement portion is a test unit by which the electronic component is tested.

With this configuration, it is possible to detect whether or not the electronic component remains on the electronic component placement portion which is the test unit. Therefore, it is possible to efficiently test the electronic component.

In the electronic component handler of the present invention, it is preferable that the first direction and the second direction are orthogonal to each other.

With this configuration, it is possible to easily perform a control operation of activating the respective units of the electronic component handler.

In the electronic component handler of the present invention, it is preferable that the electronic component placement portion includes a recess for accommodating the electronic component, the recess has an inner circumferential surface inclined with respect to the third direction which is the direction intersecting the first direction and the second direction, and an incident angle of the light emitted from the light irradiation section is smaller than an angle between the inner circumferential surface of the recess and the third direction.

With this configuration, it is possible to irradiate the electronic component in the recess with light. As a result, it is possible to detect whether or not the electronic component remains on the electronic component placement portion.

In the electronic component handler of the present invention, it is preferable that the determination can be performed on the electronic component having a thickness of 0.2 mm or more.

With this configuration, even a relatively thin electronic component can be detected whether or not it remains on the electronic component placement portion.

An electronic component tester of the present invention includes a first hold portion that is movable in a first direction and a second direction different from the first direction and is capable of holding an electronic component, a second hold portion that is movable in the first direction and the second direction independently of the first hold portion and is capable of holding the electronic component, a light irradiation section that is arranged so as to be capable of irradiating an electronic component placement portion on which the electronic component is placed with light through a gap between the first hold portion and the second hold portion, an imaging section that is capable of imaging the electronic component placement portion irradiated with the light in the first direction, and a test unit that tests the electronic component, and determines whether or not the electronic component is placed on the electronic component placement portion based on the imaging result obtained by imaging by the imaging section.

With this configuration, it is possible to detect whether or not the electronic component remains on the electronic component placement portion after an operation of transporting the electronic component to the electronic component placement portion is performed. In particular, since a configuration in which light is emitted from between the first hold portion and the second hold portion to the electronic component placement portion to capture the image thereof is adopted, it is possible to detect whether or not the electronic component remains on the electronic component placement portion even with the configuration including the first hold portion and the second hold portion.

An electronic component handler of the present invention is capable of arranging an electronic component placement portion on which the electronic component can be placed and includes a light irradiation section arranged so as to be capable of irradiating the electronic component placement portion with light and capable of irradiating the electronic component placed on the electronic component placement portion with the light, and an imaging section that is capable of imaging the electronic component placement portion irradiated with the light, and it is determined whether or not the electronic component is placed on the electronic component placement portion based on at least one of a first image obtained by emitting the light of first luminance and imaging the electronic component placement portion by the light irradiation section and a second image obtained by emitting the light of second luminance which is smaller than the first luminance and imaging the electronic component placement portion by the light irradiation section.

With this configuration, it is possible to detect whether or not the electronic component remains on the electronic component placement portion after an operation of transporting the electronic component to the electronic component placement portion is performed. In particular, it is determined whether or not the electronic component remains on the electronic component placement portion, based on at least one of the two images captured by irradiating light having different luminance. In performing this determination, for example, determination can be more accurately performed by using an image with which a more accurate determination can be performed among two images or by using both of the two images.

In the electronic component handler of the present invention, it is preferable that an image to be used in performing the determination is selected from the first image and the second image, based on at least one condition of the irradiation condition of light irradiation section, a color of the electronic component placement portion, and a color of the electronic component.

With this configuration, it is possible to use an image with better conditions in performing the determination. Therefore, it is possible to more accurately determine whether or not the electronic component remains on the electronic component placement portion.

The electronic component handler of the present invention preferably includes a first light irradiation section capable of emitting light of the first luminance and a second light irradiation section capable of emitting light of the second luminance.

With this configuration, the light irradiation section can emit light having different luminance.

In the electronic component handler of the present invention, it is preferable that the second light irradiation section can adjust luminance of light to be emitted.

With this configuration, it is possible to adjust an illuminance of the light to be emitted from the second light irradiation section. Therefore, an image with better conditions can be used for the determination.

In the electronic component handler of the present invention, it is preferable that the determination is performed based on the second image after the determination is performed based on the first image.

As such, since it is determined whether or not the electronic component remains on the electronic component placement portion in two stages by using two images obtained by irradiating light having different luminance, the determination can be accurately performed.

In the electronic component handler of the present invention, it is preferable to include a hold portion for holding the electronic component, and stops the activation of the hold portion when it is determined that the electronic component is arranged on the electronic component placement portion.

With this configuration, it is possible to prevent continuation of the transport operation in a state where the electronic component unintentionally remains on the electronic component placement portion.

In the electronic component handler of the present invention, it is preferable to include a notification unit for notifying the result of the determination.

With this configuration, it is possible to notify an operator of the electronic component handler of the result of the determination.

In the electronic component handler of the present invention, it is preferable that the imaging section includes a first imaging section for capturing the first image and a second imaging section for capturing the second image.

For example, when the first imaging section has relatively high resolution and the second imaging section has lower resolution than the first imaging section, it is possible to shorten the time required for exchanging data between the control unit and the second imaging section in the determination using the second image.

An electronic component handler of the present invention preferably includes a first hold portion that is movable in a first direction and a second direction different from the first direction and is capable of holding an electronic component, and a second hold portion that is movable in the first direction and the second direction independently of the first hold portion and is capable of holding the electronic component.

With this configuration, the electronic component can be moved in the first direction and the second direction.

An electronic component tester of the present invention is capable of arranging an electronic component placement portion on which an electronic component can be placed and includes a light irradiation section arranged so as to be capable of irradiating the electronic component placement portion with light and capable of irradiating the electronic component placed on the electronic component placement portion with the light, an imaging section that is capable of imaging the electronic component placement portion irradiated with the light, and a test unit that tests the electronic component, and it is determined whether or not the electronic component is placed on the electronic component placement portion based on at least one of a first image obtained by emitting the light of first luminance and imaging the electronic component placement portion by the light irradiation section and a second image obtained by emitting the light of second luminance which is smaller than the first luminance and imaging the electronic component placement portion by the light irradiation section.

With this configuration, it is possible to detect whether or not the electronic component remains on the electronic component placement portion after an operation of transporting the electronic component to the electronic component placement portion is performed. In particular, it is determined whether or not the electronic component remains on the electronic component placement portion, based on at least one of the two images captured by irradiating light having different luminance. In performing this determination, for example, determination can be more accurately performed by using an image with which a more accurate determination can be performed among two images or by using both of the two images.

An electronic component handler of the present invention includes a first hold portion that is movable in a first direction and a second direction different from the first direction and is capable of holding an electronic component, a second hold portion that is arranged in the second direction with respect to the first hold portion, is movable in the first direction and the second direction, and is capable of holding the electronic component, a first imaging section that is capable of imaging the electronic component placement portion on which the electronic component can be placed, and a second imaging section that is arranged in the second direction with respect to the first imaging section and is capable of imaging the electronic component placement portion, and the first imaging section is capable of capturing an image of the electronic component placement portion from between the first hold portion and the second hold portion, and the second imaging section is capable of capturing an image of the electronic component placement portion from between the first hold portion and the second hold portion.

With this configuration, the first imaging section and the second imaging section can respectively image the electronic component placement portion from between the first hold portion and the second hold portion. Therefore, for example, it is possible to detect whether or not the electronic component remains on the electronic component placement portion after performing the operation of transporting the electronic component to the electronic component placement portion, based on these images.

In the electronic component handler of the present invention, it is preferable that the first imaging section and the second imaging section have directions of incidence of light opposite to each other.

With this configuration, even if a space between the first hold portion and the second hold portion is relatively narrow, the first imaging section and the second imaging section can image the electronic component placement portion, respectively, for example, by adopting a configuration in which a first light reflection portion and a second light reflection portion are provided between the first imaging section and the second imaging section.

In the electronic component handler of the present invention, it is preferable that the first imaging section and the second imaging section have different positions in the first direction.

With this configuration, it is possible, for example, to make an area that can be imaged by the first imaging section through the first light reflection portion and an area that can be imaged by the second imaging section through the second light reflection portion different from each other.

In the electronic component handler of the present invention, it is preferable that the first direction is a direction in which the first imaging section and the second imaging section image the electronic component placement portion.

With this configuration, the first imaging section and the second imaging section are arranged so as to be shifted in an imaging direction.

In the electronic component handler of the present invention, it is preferable that the first direction is a direction along a vertical direction.

With this configuration, the first imaging section and the second imaging section are arranged so as to be shifted in the vertical direction.

In the electronic component handler of the present invention, it is preferable that the first imaging section and the second imaging section image areas having different positions in the electronic component placement portion.

With this configuration, it is possible to image more areas of the electronic component placement portion.

In the electronic component handler of the present invention, it is preferable that a first imaging area imaged by the first imaging section in the electronic component placement portion and the second imaging area imaged by the second imaging section in the electronic component placement portion have different sizes.

With this configuration, for example, a position of a boundary portion between the first imaging area and the second imaging area can be shifted from the center portion of the electronic component placement portion in the second direction. Therefore, an image at the center portion of the electronic component placement portion in the second direction can be made clear.

In the electronic component handler of the present invention, it is preferable to be able to determine whether or not the electronic component is placed on the electronic component placement portion based on images captured by the first imaging section and the second imaging section.

With this configuration, it is possible to detect whether or not the electronic component remains on the electronic component placement portion.

In the electronic component handler of the present invention, it is preferable to include a first light reflection portion that is provided between the first imaging section and the second imaging section, reflects an image of the electronic component placement portion toward the first imaging section, and enables the first imaging section to capture the image of the electronic component placement portion from between the first hold portion and the second hold portion, and a second light reflection portion that is provided between the second imaging section and the first light reflection portion, reflects an image of the electronic component placement portion, and enables the second imaging section to capture an image of the electronic component placement portion from between the first hold portion and the second hold portion.

With this configuration, even if the space between the first hold portion and the second hold portion is relatively narrow, the first imaging section and the second imaging section can image the electronic component placement portion, respectively.

In the electronic component handler of the present invention, it is preferable that an optical axis up to the first light reflection portion of the first imaging section and an optical axis of the second imaging section are along the second direction.

With this configuration, it is possible to easily install the first light reflection portion and the second light reflection portion.

In the electronic component handler of the present invention, it is preferable that the second light reflection portion has a light reflection surface for reflecting light, and an optical axis of the first imaging section from the first light reflection portion to the electronic component placement portion intersects an intersection point of a virtual plane including the light reflection surface and the optical axis of the second imaging section.

With this configuration, an image captured by the first imaging section and an image captured by the second imaging section can be captured at the same angle.

In the electronic component handler of the present invention, it is preferable that the first light reflection portion has a first light reflection surface for reflecting light, the second light reflection portion has a second light reflection surface for reflecting light, and an angle between a normal line of the first light reflection surface and a normal line of the second light reflection surface is 85 degrees or more and 95 degrees or less.

With this configuration, if the first imaging section and the second imaging section are installed such that the optical axis of the first imaging section up to the first light reflection portion and the optical axis of the second imaging section are along the second direction, the image captured by the first imaging section and the image captured by the second imaging section can be images captured at the same angle.

An electronic component tester of the present invention includes a first hold portion that is movable in a first direction and a second direction different from the first direction and is capable of holding an electronic component, a second hold portion that is arranged in the second direction with respect to the first hold portion, is movable in the first direction and the second direction, and is capable of holding the electronic component, a first imaging section that is capable of imaging an image of an electronic component placement portion on which the electronic component can be placed, a second imaging section that is arranged in the second direction with respect to the first imaging section and is capable of imaging the electronic component placement portion, and a test unit that tests the electronic component, and the first imaging section is capable of imaging an image of the electronic component placement portion from between the first hold portion and the second hold portion, and the second imaging section is capable of capturing an image of the electronic component placement portion from between the first hold portion and the second hold portion.

With this configuration, even with the configuration including the first hold portion and the second hold portion, it is possible to image the electronic component placement portion from between the first hold portion and the second hold portion. Therefore, for example, it is possible to detect whether or not the electronic component remains on the electronic component placement portion after performing the operation of transporting the electronic component to the electronic component placement portion, based on this image.

An electronic component handler of the present invention is capable of arranging an electronic component placement portion that includes a placement portion on which an electronic component placed and includes a first hold portion that is movable in a first direction and a second direction different in the first direction and is capable of holding the electronic component, a second hold portion that is movable in the first direction and the second direction and is capable of holding the electronic component, an imaging section that is capable of imaging the electronic component placement portion from between the first hold portion and the second hold portion, and a position detection unit that is capable of detecting position information of at least one of the first hold portion and the second hold portion, and the first hold portion and the second hold portion are movable in the second direction with respect to the imaging section, and the imaging section captures a first image of the electronic component placement portion based on first position information detected by the position detection unit.

With this configuration, imaging can be performed based on the position information of the hold portion. Therefore, it is possible to image the electronic component placement portion from between the first hold portion and the second hold portion. As a result, for example, when it is determined, based on the imaging result, whether or not the electronic component is arranged on the placement portion, the determination can be performed more accurately.

In the electronic component handler of the present invention, it is preferable that second position information is created based on the first image captured by the imaging section.

With this configuration, for example, when performing the determination, it is possible to capture an image suitable for the determination.

In the electronic component handler of the present invention, it is preferable that the second position information is different from the first position information.

With this configuration, for example, when performing the determination, it is possible to capture an image suitable for the determination.

In the electronic component handler of the present invention, it is preferable that the second position information is decided based on an image of the at least one hold portion included in the first image and an image of the placement portion included in the first image.

With this configuration, for example, when performing the determination, it is possible to capture an image suitable for the determination.

In the electronic component handler of the present invention, it is preferable that the imaging section captures a second image of the electronic component placement portion based on the second position information.

With this configuration, for example, when performing the determination, it is possible to capture an image suitable for the determination.

In the electronic component handler of the present invention, it is preferable that third position information is created based on the second image captured by the imaging section.

With this configuration, for example, when performing the determination, it is possible to capture an image suitable for the determination.

In the electronic component handler of the present invention, it is preferable that the third position information is different from the first position information and the second position information.

With this configuration, for example, when performing the determination, it is possible to capture an image suitable for the determination.

In the electronic component handler of the present invention, it is preferable that the third position information is decided based on the image of the at least one hold portion included in the second image and the image of the placement portion included in the second image.

With this configuration, for example, when performing the determination, it is possible to capture an image suitable for the determination.

In the electronic component handler of the present invention, it is preferable to include a light irradiation section arranged to allow the electronic component placement portion to be irradiated with light through a gap between the first hold portion and the second hold portion.

With this configuration, based on light with which the electronic component placement portion is irradiated, it is possible to perform a determination to be described later.

In the electronic component handler of the present invention, it is preferable to include a control unit capable of adjusting the timing at which an imaging instruction signal is transmitted to the imaging section.

With this configuration, it is possible to adjust so that the placement portion appears in the image captured by the imaging section.

In the electronic component handler of the present invention, it is preferable that the control unit can adjust the timing at which the imaging section starts imaging.

With this configuration, it is possible to accurately adjust the image captured by the imaging section so that the placement portion appears.

In the electronic component handler of the present invention, it is preferable that the electronic component placement portion performs a test of the electronic component, and the control unit adjusts the timing at which the imaging instruction signal is transmitted prior to the test.

With this configuration, it is possible to adjust so that the placement portion appears in the image captured during the test. Therefore, an accurate determination can be performed based on the captured image.

In the electronic component handler of the present invention, it is preferable that the control unit can adjust the timing of the start of imaging by the imaging section based on the position of the at least one hold portion and the position of the placement portion in the image captured by the imaging section.

With this configuration, it is possible to adjust so that the placement portion appears in the image captured by the imaging section.

In the electronic component handler of the present invention, it is preferable that the control unit can adjust the timing of the start of imaging by the imaging section according to the moving direction of the first hold portion and the second hold portion.

With this configuration, the imaging timing can be adjusted regardless of the moving direction of the first hold portion and the second hold portion.

In the electronic component handler of the present invention, it is preferable that the imaging section includes imaging elements, and the control unit is capable of adjusting the exposure time of the imaging elements.

With this configuration, it is possible to adjust brightness of the captured image.

In the electronic component handler of the present invention, it is preferable that the control unit adjusts the exposure time according to brightness of the image captured by the imaging section.

With this configuration, it is possible to obtain an image suitable for performing more accurate determination.

In the electronic component handler of the present invention, it is preferable that the imaging section omit imaging in a state where the placement portion is shielded by the first hold portion or the second hold portion.

With this configuration, it is possible to perform imaging without waste, and it is possible to prevent unnecessary increase of image data.

In the electronic component handler of the present invention, it is preferable to include a control unit that performs a first adjustment for adjusting the timing at which an imaging instruction signal is transmitted to the imaging section based on the imaging result of the imaging section and the first position information and a second adjustment for adjusting the timing at which the imaging instruction signal is transmitted to the imaging section based on the movement amount of the at least one hold portion from when the transmission of the imaging instruction signal until when the imaging section starts imaging after the first adjustment.

With this configuration, it is possible to transmit the imaging instruction signal at the optimal timing in consideration of a time lag from when the imaging instruction signal is transmitted to when the imaging section actually starts imaging, regardless of an individual difference of the imaging section.

An electronic component tester of the present invention is capable of arranging an electronic component placement portion that includes a placement portion on which an electronic component placed and includes a first hold portion that is movable in a first direction and a second direction different from the first direction and is capable of holding the electronic component, a second hold portion that is movable in the first direction and the second direction and is capable of holding the electronic component, an imaging section that is capable of imaging the electronic component placement portion from between the first hold portion and the second hold portion, a position detection unit that is capable of detecting position information of at least one of the first hold portion and the second hold portion, and a test unit that tests the electronic component, and the first hold portion and the second hold portion are movable in the second direction with respect to the imaging section, and the imaging section captures a first image of the electronic component placement portion based on the first position information detected by the position detection unit.

With this configuration, imaging can be performed based on the position information of the hold portion. Therefore, it is possible to image the electronic component placement portion from between the first hold portion and the second hold portion. As a result, for example, when it is determined, based on the imaging result, whether or not the electronic component is arranged on the placement portion, the determination can be performed more accurately.

BRIEF DESCRIPTION OF THE DRAWINGS

FIG. 73 is a view illustrating an example of a setting screen of a monitor.

DESCRIPTION OF EXEMPLARY EMBODIMENTS

Hereinafter, an electronic component handler and an electronic component tester according to the present invention will be described in detail based on preferred embodiments illustrated in the accompanying drawings.

First Embodiment

Figure 1:
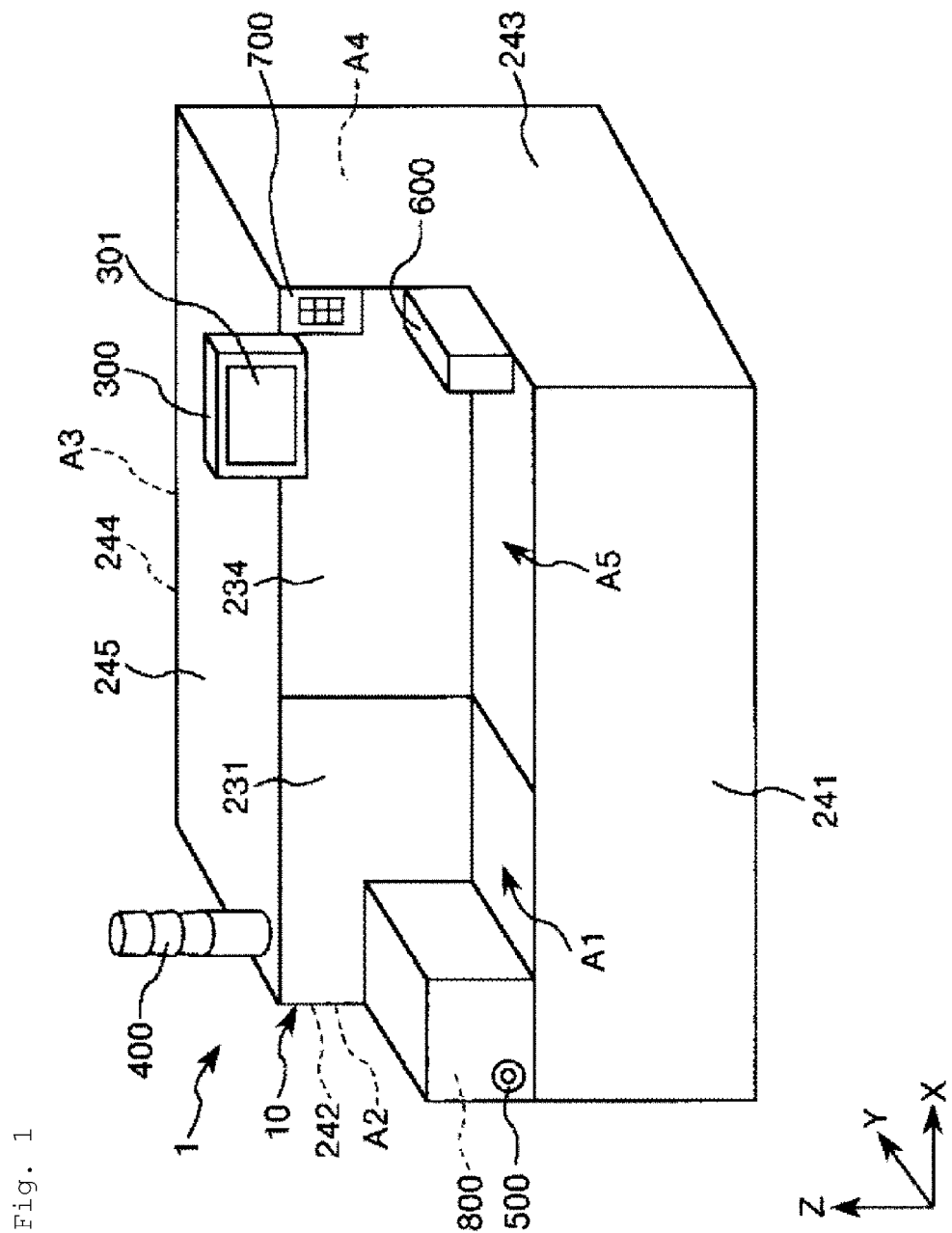
FIG. 1 is a schematic perspective view of a first embodiment of an electronic component tester of the present invention when viewed from a front side.

Hereinafter, a first embodiment of an electronic component handler and an electronic component tester of the present invention will be described with reference to FIGS. 1 to 20. In the following description, for convenience of explanation, as illustrated in FIG. 1, three axes orthogonal to each other are set as an X axis, a Y axis, and a Z axis. The XY plane including the X axis and the Y axis horizontal, and the Z axis vertical. A direction parallel to the X axis also referred to as an "X direction (third direction)", a direction parallel to the Y axis also referred to as a "Y direction (second direction)", and a direction parallel to the Z axis also referred to as a "Z direction (first direction)". The direction in which an arrow points in each direction is referred to as "positive (+)" and the opposite direction is referred to as "negative (−)". The term "horizontal" as used in the specification of the present application is not limited to complete horizontal but includes a state slightly inclined with respect to the horizontal (for example, less than approximately 5 degrees) unless transport of the electronic component is hindered. The upper side in FIGS. 1, 4 to 11, and 16 to 19 may be referred to as "upper" or "above", and the lower side may be referred to as "lower" or "below". In particular, since the first direction and the second direction are orthogonal to each other, it is possible to easily perform a control operation of activating each unit of the electronic component handler 10.

In FIGS. 16 to 19, a size of a test unit is illustrated in an exaggerated manner, which is greatly different from an actual size.

The electronic component handler 10 of the present invention includes a device transport head (first hold portion) 17A that is movable in the Z direction which is a first direction and the Y direction which is a second direction different from the Z direction and is capable of holding an IC device 90, a device transport head (second hold portion) 17B that is movable in the Y direction and the Z direction independently of the device transport head (first hold portion) 17A and is capable of holding the IC device 90, a laser light source (light irradiation section) 41 that is arranged so as to be capable of irradiating a test unit 16 which is an electronic component placement portion on which the IC device 90 is placed with laser light L1 through a gap between the device transport head 17A and the device transport head 17B, and a camera 31 as an imaging section that is capable of imaging the test unit 16 irradiated with the laser light L1 from the Z direction, and determines whether or not the IC device 90 is placed on the test unit 16 based on the imaging result obtained by imaging by the camera 31.

With this configuration, it is possible to detect whether or not the IC device 90 remains on the test unit 16 after an operation of transporting the IC device 90 to the test unit 16 is performed. In particular, since a configuration in which light L2 is emitted from between the device transport head 17A and the device transport head 17B to the test unit 16 to capture the image is adopted, it is possible to detect whether or not the IC device 90 remains on the test unit 16 even with the configuration including the device transport head 17A and the device transport head 17B.

The electronic component tester 1 of the present invention includes a device transport head (first hold portion) 17A that is movable in the Z direction which is a first direction and the Y direction which is a second direction different from the Z direction and is capable of holding an IC device 90, a device transport head (second hold portion) 17B that is movable in the Y direction and the Z direction independently of the device transport head (first hold portion) 17A and is capable of holding the IC device 90, a laser light source (light irradiation section) 41 that is arranged so as to be capable of irradiating a test unit 16 which is an electronic component placement portion on which the IC device 90 is placed with laser light L through a gap between the device transport head 17A and the device transport head 17B, a camera 31 as an imaging section that is capable of imaging the test unit 16 irradiated with the laser light L from the Z direction, and the test unit 16 that tests the IC device 90, and determines whether or not the IC device 90 is placed on the test unit 16 based on the imaging result obtained by imaging by the camera 31.

With this configuration, the electronic component tester 1 having an advantage of the electronic component handler 10 described above is obtained. The IC device 90 can be transported to the test unit 16, so that the test of the IC device 90 can be performed by the test unit 16. Further, the IC device 90 after the test can be transported from the test unit 16.

In this specification, second luminance may be smaller than first luminance, and includes a state of zero, that is, a state where the light irradiation section is not irradiating light.

Figure 2:
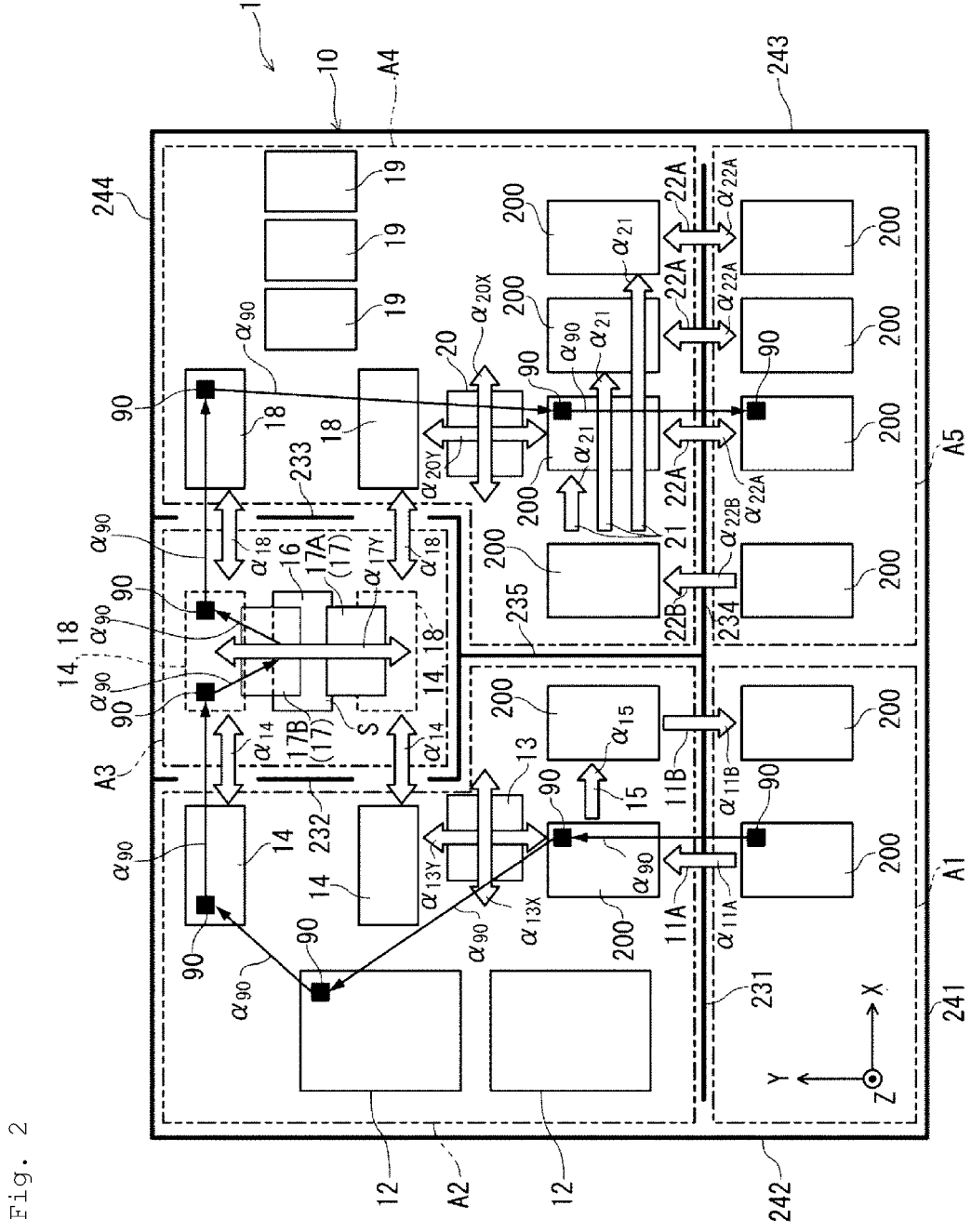
FIG. 2 is a schematic plan view illustrating an operation state of the electronic component tester illustrated in FIG. 1.

Hereinafter, a configuration of each part will be described. As illustrated in FIGS. 1 and 2, the electronic component tester 1 incorporating the electronic component handler 10 is an apparatus which transports an electronic component such as an IC device which is a ball grid array (BGA) package, for example, and inspects and tests (hereinafter, simply referred to as "test") electrical characteristics of the electronic component. In the following description, for convenience of explanation, a case where an IC device is used as an electronic component will be described as a representative, and the electronic component will be referred to as the "IC device 90". In this embodiment, the IC device 90 has a flat plate shape.

As the IC devices, in addition to those described above, for example, a large scale integration (LSI), a complementary MOS (CMOS), a charge coupled device (CCD), a "module IC" packaged with a plurality of IC devices, a "quartz device", a "pressure sensor", an "inertial sensor (acceleration sensor)", a "gyro sensor", and a "fingerprint sensor" are included.

The electronic component tester 1 (the electronic component handler 10) is used by placing in advance a so-called "change kit" which is exchanged for each type of the IC device 90. In this change kit, there is a placement portion on which the IC device 90 is placed, and the placement portion includes, for example, a temperature adjustment unit 12, a device supply portion 14, and the like which will be described later. As the placement portion on which the IC device 90 is placed, there are also the test unit 16 and a tray 200 prepared by a user in addition to the change kit described above.

The electronic component tester 1 includes a tray supply area A1, a device supply area (hereinafter, simply referred to as "supply area") A2, a test area A3, a device collection area (hereinafter simply referred to as "collection area") A4, and a tray removal area A5, and these areas are divided by respective wall portions as will be described later. Then, the IC device 90 sequentially passes through the respective areas from the tray supply area A1 to the tray removal area A5 in the direction of the arrow $\alpha_{90}$ and is tested at a test area A3 on the path. As such, the electronic component tester 1 includes a handler that is the electronic component handler 10 that transports the IC device 90 in each area, the test unit 16 that tests in the test area A3, and a control unit 800. In addition, the electronic component tester 1 includes a monitor 300, a signal lamp 400, and an operation panel 700.

In the electronic component tester 1, a side on which the tray supply area A1 and the tray removal area A5 are arranged, that is, the lower side in FIG. 2 is the front side and a side on which the test area A3 is arranged, that is, the upper side in FIG. 2 is used as the back side.

The tray supply area A1 is a supply portion to which a tray 200 on which a plurality of IC devices 90 in an untested state are arranged is supplied. In the tray supply area A1, a large number of trays 200 can be stacked.

The supply area A2 is an area in which a plurality of IC devices 90 on the tray 200 transported from the tray supply area A1 are respectively transported and supplied to the test area A3. Tray transport mechanisms 11A and 11B for transporting the trays 200 one by one in the horizontal direction are provided so as to straddle the tray supply area A1 and the supply area A2. The tray transport mechanism 11A is a movement portion capable of moving the tray 200 in the positive side in the Y direction with respect to the IC device 90 placed on the tray 200, that is, in the direction of the arrow $\alpha_{11A}$ in FIG. 2. With this configuration, the IC device 90 can be stably fed to the supply area A2. The tray transport mechanism 11B is a movement portion capable of moving an empty tray 200 in the negative side in the Y direction, that is, in the direction of the arrow $\alpha_{11B}$ in FIG. 2. With this configuration, the empty tray 200 can be moved from the supply area A2 to the tray supply area A1.

In the supply area A2, a temperature adjustment unit (soak plate (English notation: Chinese notation (one example):

temperature adjusting plate)) 12, a device transport head 13, and a tray transport mechanism 15 are provided.

The temperature adjustment unit 12 is configured as a placement portion on which a plurality of IC devices 90 are placed, and is referred to as a "soak plate" which can collectively heat or cool the placed IC devices 90. With this soak plate, the IC device 90 before being tested by the test unit 16 can be heated or cooled in advance and adjusted to a temperature suitable for the test (high temperature test or low temperature test). In the configuration illustrated in FIG. 2, two temperature adjustment units 12 are arranged and fixed in the Y direction. Then, the IC device 90 on the tray 200 carried in from the tray supply area A1 by the tray transport mechanism 11A is transported to any of the temperature adjustment units 12. The temperature adjustment unit 12 as the placement portion can stably adjust the temperature of the IC device 90 on the temperature adjustment unit 12, by being fixed.

The device transport head 13 is supported so as to be movable in the X direction and the Y direction within the supply area A2 and includes a portion that is movable also in the Z direction. With this configuration, the device transport head 13 can be responsible for transporting the IC device 90 between the tray 200 carried in from the tray supply area A1 and the temperature adjustment unit 12, and transporting the IC device 90 between the temperature adjustment unit 12 and a device supply unit 14 to be described later. In FIG. 2, the movement of the device transport head 13 in the X direction is indicated by an arrow $\alpha_{13X}$, and the movement of the device transport head 13 in the Y direction is indicated by an arrow $\alpha_{13Y}$.

The tray transport mechanism 15 is a mechanism for transporting the empty tray 200 with all the IC devices 90 removed in the positive side in the X direction, that is, in the direction of the arrow $\alpha_{15}$ in the supply area A2. After this transport, the empty tray 200 is returned from the supply area A2 to the tray supply area A1 by the tray transport mechanism 11B.

The test area A3 is an area for testing the IC device 90. In this test area A3, the test unit 16 that tests the IC device 90 and a device transport head 17 are provided. The device supply unit 14 that moves so as to straddle the supply area A2 and the test area A3 and a device collection unit 18 that moves so as to straddle the test area A3 and the collection area A4 are also provided.

The device supply unit 14 is configured as a placement portion on which the IC device 90 whose temperature has been adjusted by the temperature adjustment unit 12 is placed, and is a so-called "supply shuttle plate" or simply a "supply shuttle" that can transport the IC device 90 to the vicinity of the test unit 16.

The device supply unit 14 as the placement portion is supported so as to be capable of reciprocating between the supply area A2 and the test area A3 in the X direction, that is, along the direction of the arrow aid. With this configuration, the device supply unit 14 can stably transport the IC device 90 from the supply area A2 to the vicinity of the test unit 16 of the test area A3, and the IC device 90 can be returned to the supply area A2 again after the IC device 90 is removed by the device transport head 17 in the test area A3.

In the configuration illustrated in FIG. 2, two device supply units 14 are arranged in the Y direction, and the IC device 90 on the temperature adjustment unit 12 is transported to any one of the device supply units 14. Similar to the temperature adjustment unit 12, the device supply unit 14 is configured to be able to heat or cool the IC device 90 placed on the device supply unit 14. With this configuration, the temperature adjustment state of the IC device 90 adjusted in temperature by the temperature adjustment unit 12 can be maintained and the IC device 90 can be transported to the vicinity of the test unit 16 of the test area A3.

The device transport head 17 is an operation unit that holds the IC device 90 whose temperature adjustment state is maintained and transports the IC device 90 within the test area A3. The device transport head 17 is supported so as to be capable of reciprocating in the Y direction and the Z direction within the test area A3, and is a part of a mechanism called "index arm". With this configuration, the device transport head 17 can transport the IC device 90 on the device supply unit 14 carried in from the supply area A2 onto the test unit 16 and place IC device 90 thereon. In FIG. 2, reciprocating movement of the device transport head 17 in the Y direction is indicated by an arrow $\alpha_{17Y}$. Although the device transport head 17 is supported so as to be capable of reciprocating in the Y direction, but is not limited thereto, and the device transport head 17 may be supported so as to be reciprocable also in the X direction.

Figure 18:
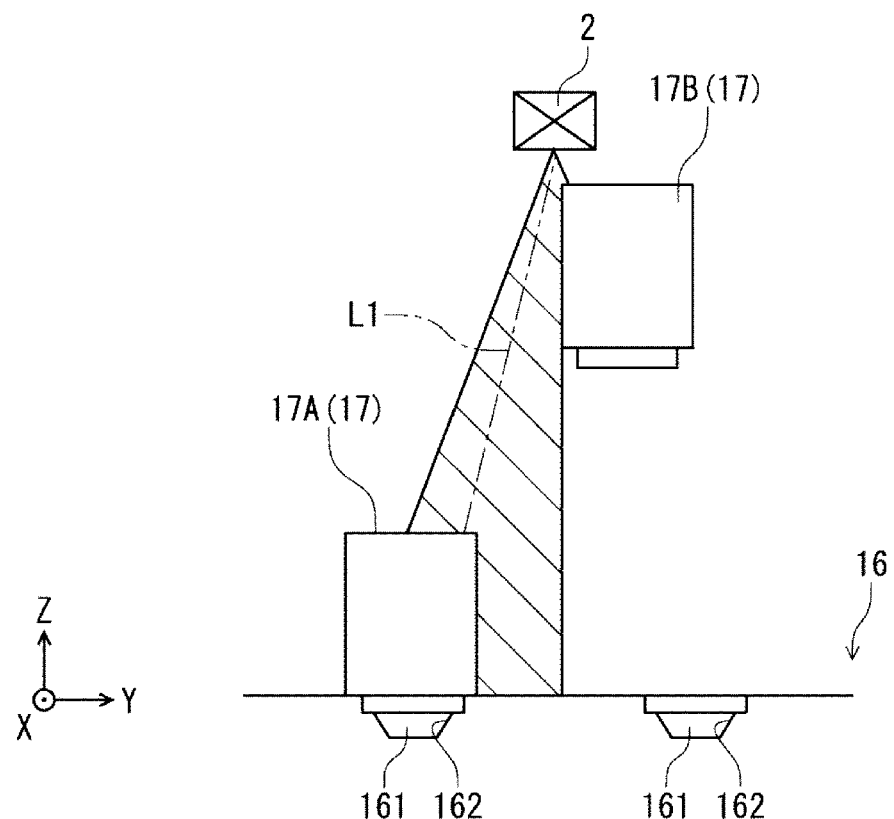
FIG. 18 is a side view of the device transport head of the electronic component tester illustrated in FIG. 1, and is a view for explaining the positional relationship between the device transport head and the detection unit.
Figure 19:
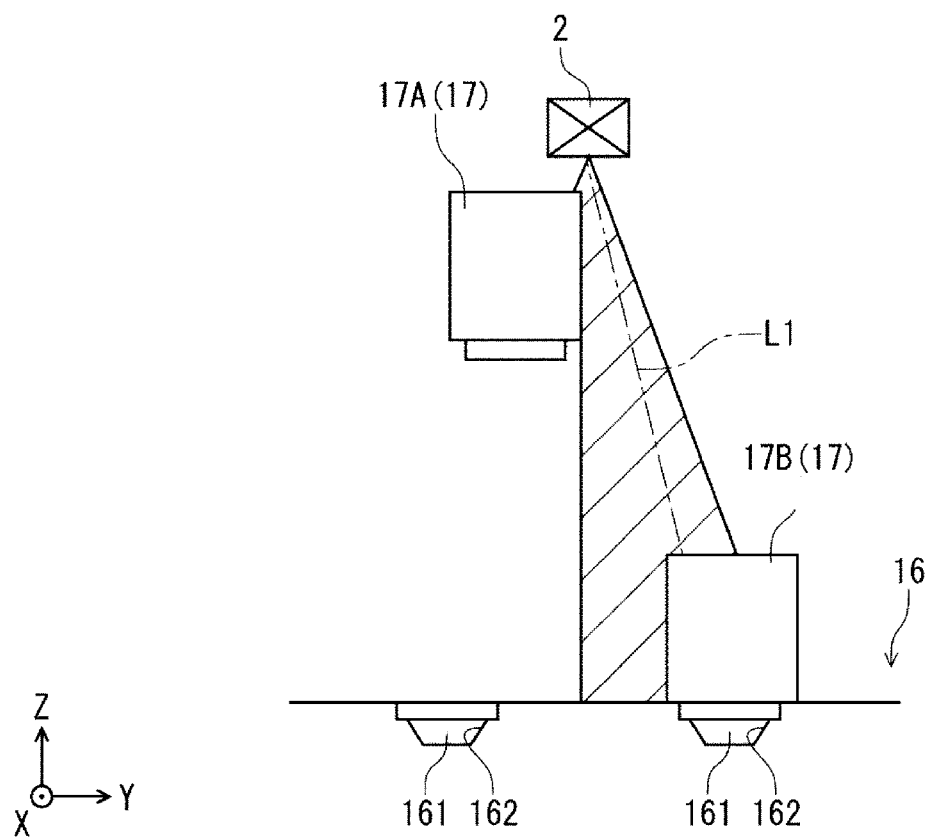
FIG. 19 is a side view of the device transport head of the electronic component tester illustrated in FIG. 1, and is a view for explaining the positional relationship between the device transport head and the detection unit.

The device transport head 17 includes a device transport head 17A as a first hold portion which is movable in the Z direction which is the first direction and the Y direction which is the second direction different from the Z direction and is capable of holding the IC device 90 and a device transport head 17B as a second hold portion which is movable in the Y direction and the Z direction independently of the device transport head 17A and is capable of holding the IC device 90. In particular, as illustrated in FIGS. 18 and 19, by configuring the device transport head 17A and the device transport head 17B to move independently in the Z direction, it is possible to prevent both the device transport head 17A and the device transport head 17B from descending and an image-capturable area from becoming small.

The device transport head 17A as the first hold portion and the device transport head 17B as the second hold portion are arranged in the Y direction which is the second direction and are separated from each other. With this configuration, for example, a configuration in which the device transport head 17A is responsible for transporting the IC device 90 between the device supply unit 14 or the device collection unit 18 and test unit 16 on the −Y side of the test unit 16 and the and the test unit and the device transport head 17B is responsible for transporting the IC device 90 between the device supply unit 14 or the device collection unit 18 and test unit 16 on the +Y side of the test unit 16 and the and the test unit can be adopted. Therefore, it is possible to reduce the movement distance when viewed as a whole of the device transport head 17 and transport efficiency is excellent.

The device transport head 17A as the first hold portion and the device transport head 17B as the second hold portion can simultaneously move in the Y direction which is the second direction. With this configuration, for example, when the device transport head 17A pushes the IC device 90, the device transport head 17B performs a different operation (exchange of the IC device 90 with the device supply unit 14 or the device collection unit 18 or the like) and vice versa. Therefore, it is possible to improve the transport efficiency and test efficiency.

Figure 3:
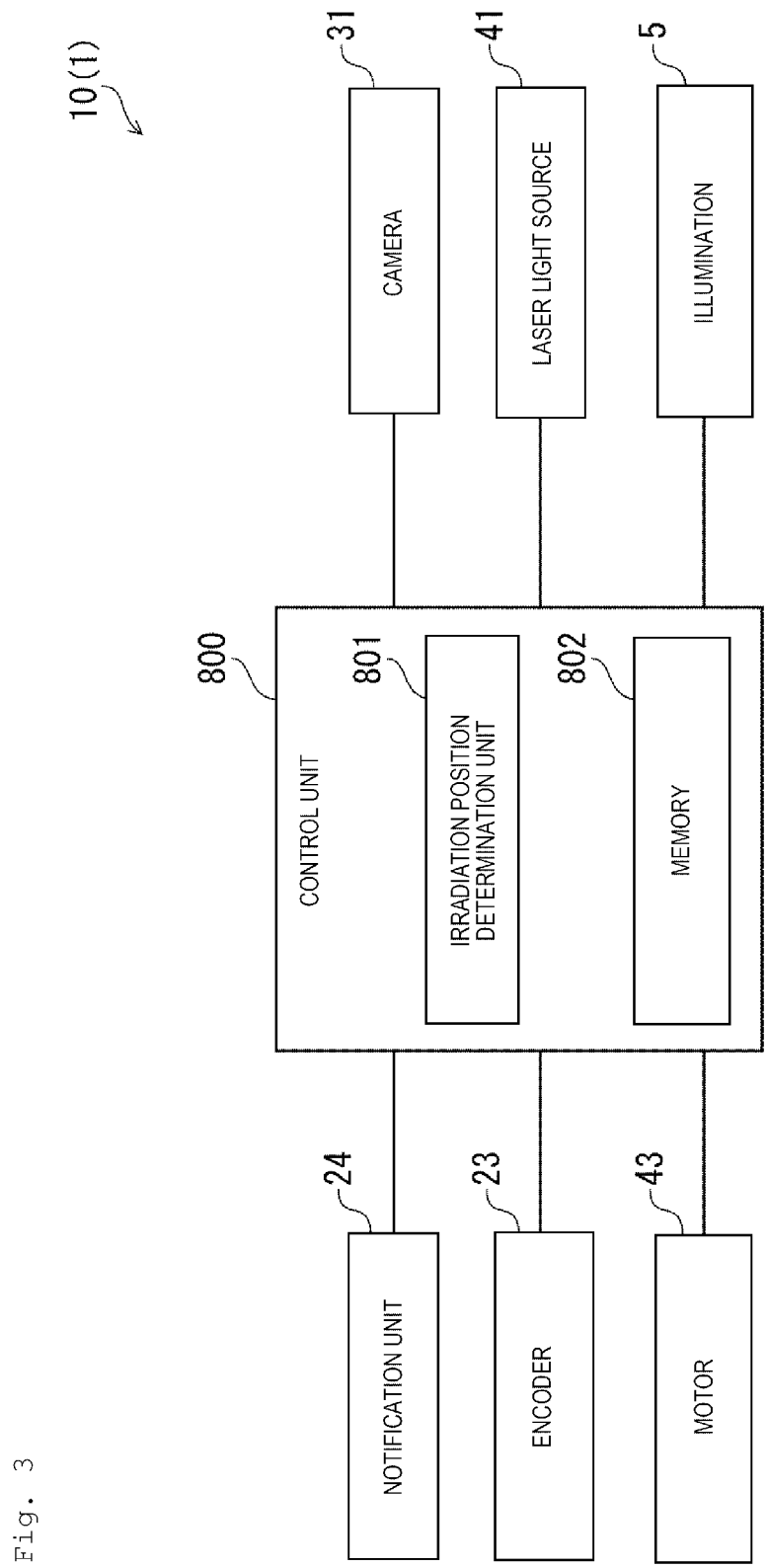
FIG. 3 is a block diagram of the electronic component tester illustrated in FIG. 1.

As illustrated in FIG. 1, the electronic component handler 10 includes an encoder 23 as a position detection unit that detects positions of the device transport head 17A as the first hold portion or the device transport head 17B as the second hold portion. In this embodiment, the encoder 23 detects the positions of each of the device transport head 17A and the device transport head 17B in the Y direction and the Z direction. With this configuration, as will be described later, for example, the positions of the device transport head 17A and the device transport head 17B can be detected when the camera 31 is capable of imaging the test unit 16. As illustrated in FIG. 3, the encoder 23 is electrically connected to the control unit 800, and position information of the device transport head 17A and the device transport head 17B is transmitted to the control unit 800.

Similar to the temperature adjustment unit 12, such a device transport head 17 is configured to be able to heat or cool the held IC device 90. With this configuration, the temperature adjustment state in the IC device 90 can be continuously maintained from the device supply unit 14 to the test unit 16.

Figure 4:
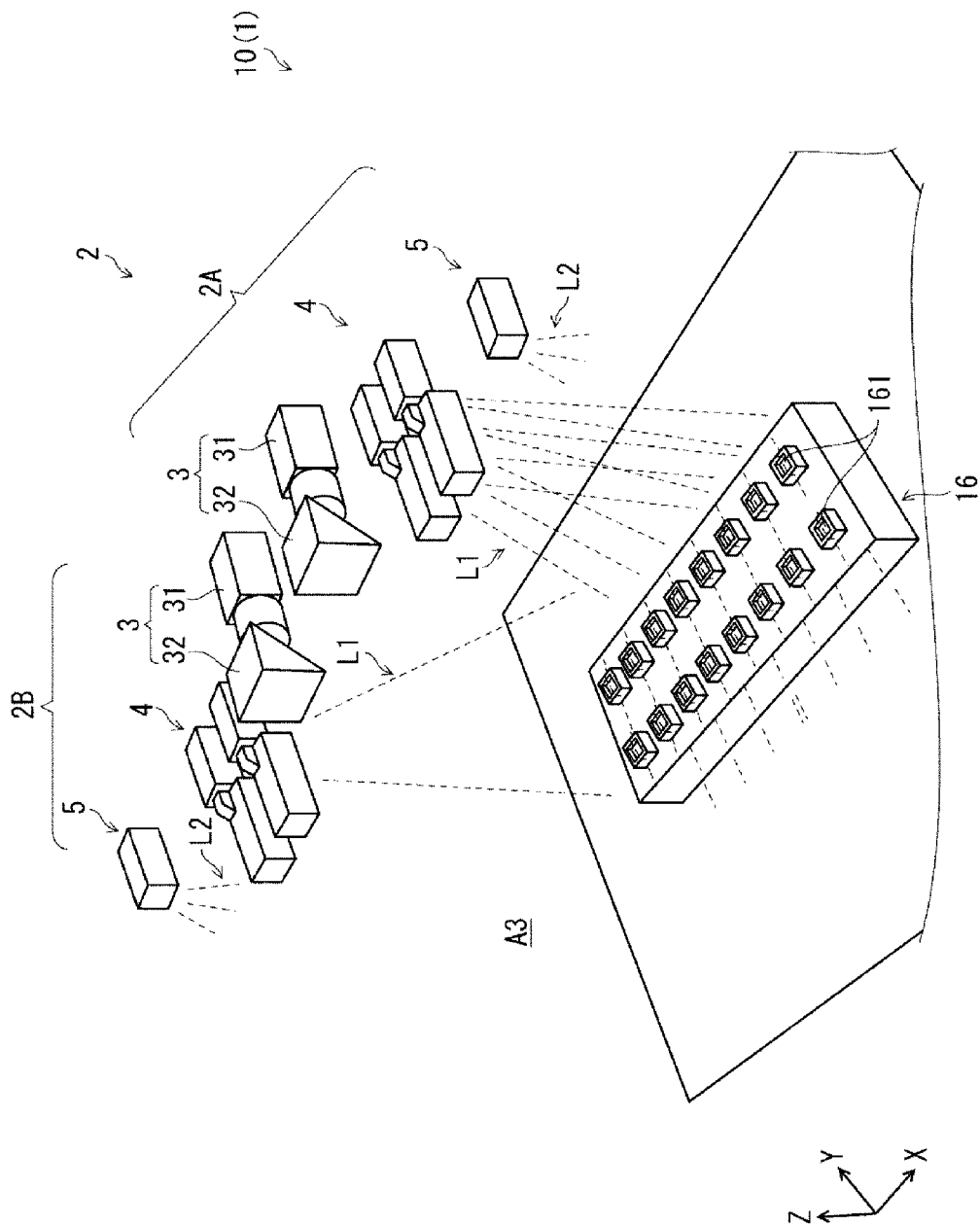
FIG. 4 is a perspective view illustrating a test area of the electronic component tester illustrated in FIG. 1, in which illustration of a device transport head is omitted.
Figure 5:
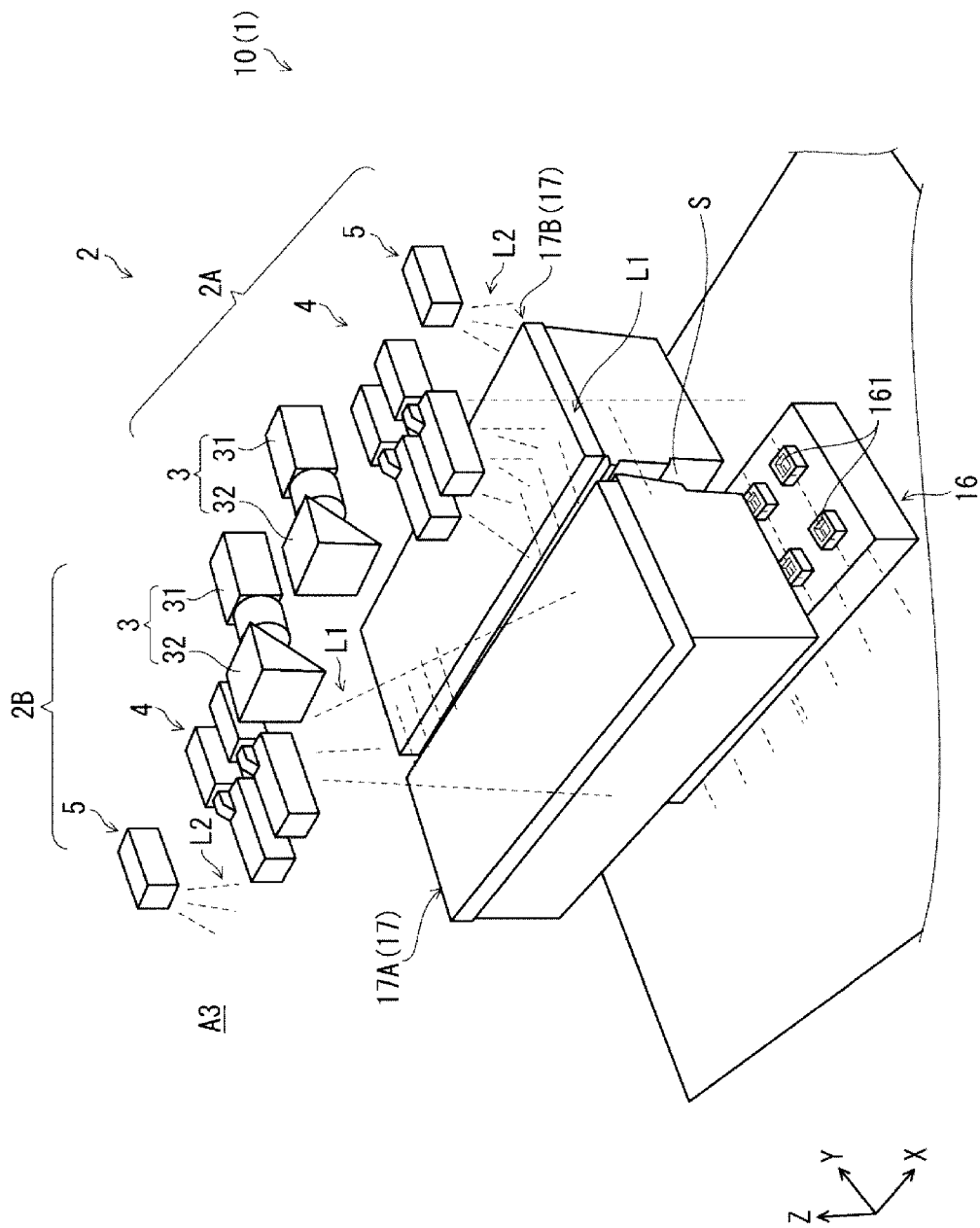
FIG. 5 is a perspective view illustrating the test area of the electronic component tester illustrated in FIG. 1.
Figure 11:
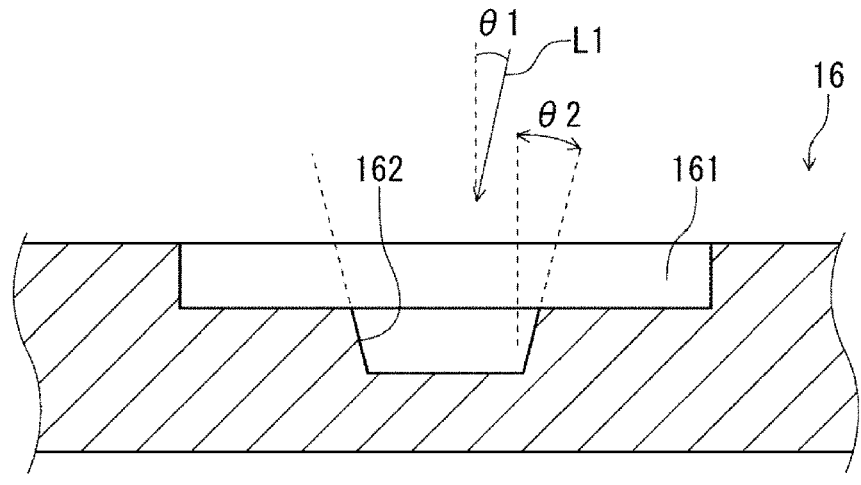
FIG. 11 is a cross-sectional view of a test unit included in the electronic component tester.
Figure 11:
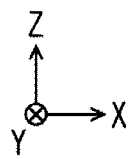

As illustrated in FIGS. 4 and 5, the test unit 16 is an electronic component placement portion on which the IC device 90 which is an electronic component is placed and which tests the electrical characteristics of the IC device 90. When viewed from the Z direction, the test unit 16 is in a form of a rectangular plate extending in the X direction. The test unit 16 includes a plurality (in this embodiment, recesses) of recesses 161 for accommodating the IC devices 90. Respective recesses are arranged in a lattice pattern in which eight recesses are arranged in the X direction and two rows each of which includes eight recesses are provided in the Y direction. As illustrated in FIG. 11, the inner circumferential surface of each recess 161 is tapered. That is, each recess 161 has an inner circumferential surface 162 which is inclined with respect to the X direction which is the third direction. In the configurations illustrated in FIGS. 4 and 5, each recess 161 is configured to open to the upper surface of a block body projecting toward the +Z side from the upper surface of the test unit 16, but the present invention is not limited thereto. For example, the recess may be configured to omit the block body and open to the upper face of the test unit 16.

A plurality of probe pins (not illustrated) electrically connected to terminals (not illustrated) of the IC device 90 are provided at the bottom portion of the recess 161. Then, the IC device 90 can be tested by electrically connecting the end of the IC device 90 and the probe pin to each other, that is, by being brought into contact with each other. The test of the IC device 90 is performed based on a program stored in a test control unit included in a tester connected to the test unit 16. Similar to the temperature adjustment unit 12, even in the test unit 16, it is possible to adjust the IC device 90 to a temperature suitable for test by heating or cooling the IC device 90.

The device collection unit 18 is configured as a placement portion on which the IC device 90 whose test is ended by the test unit 16 is placed, is capable of transporting the IC device 90 to the collection area A4, and is referred to as a "collection shuttle plate" or simply as a "collection shuttle".

The device collection unit 18 is supported so as to be capable of reciprocating between the test area A3 and the collection area A4 in the X direction, that is, along the direction of the arrow aid. In the configuration illustrated in FIG. 2, similar to the device supply unit 14, two device collection units 18 are arranged in the Y direction, and the IC device 90 on the test unit 16 is connected to any one of the device collection units 18 and placed thereon. This transport is performed by the device transport head 17.

The collection area A4 is an area in which the plurality of IC devices 90 which are tested in the test area A3 and whose test is ended are collected. In this collection area A4, a collecting tray 19, a device transport head 20, and a tray transport mechanism 21 are provided. An empty tray 200 is also prepared in the collection area A4.

The collecting tray 19 is a placement portion on which the IC device 90 tested by the test unit 16 is placed, and is fixed so as not to move within the collection area A4. With this configuration, even in the collection area A4 in which a relatively large number of various movable parts such as the device transport head 20 are arranged, the tested IC device 90 is stably placed on the collecting tray 19. In the configuration illustrated in FIG. 2, three collecting trays 19 are arranged along the X direction.

Three empty trays 200 are arranged along the X direction. The empty tray 200 also serves as a placement portion on which the IC device 90 tested by the test unit is placed. Then, the IC device 90 on the device collection unit 18 that has moved to the collection area A4 is transported to and placed on one of the collecting tray 19 and the empty tray 200. With this configuration, the IC device 90 is classified for each test result and collected.

The device transport head 20 is supported so as to be movable in the X direction and the Y direction within the collection area A4, and further includes a portion movable also in the Z direction. With this configuration, the device transport head 20 can transport the IC device 90 from the device collection unit 18 to the collecting tray 19 and the empty tray 200. In FIG. 2, the movement of the device transport head 20 in the X-direction is indicated by an arrow $\alpha_{20X}$, and the movement of the device transport head 20 in the Y direction is indicated by an arrow $\alpha_{20Y}$.

The tray transport mechanism 21 is a mechanism for transporting the empty tray 200 carried in from the tray removal area A5 in the X direction, that is, in the direction of the arrow $\alpha_{21}$ within the collection area A4. After this transport, the empty tray 200 is arranged at the position where the IC device 90 is collected, that is, the empty tray 200 can be any one of the three empty trays 200.

The tray removal area A5 is an excluded portion in which the tray 200 on which the plurality of IC devices 90 in a tested state are arranged is collected and removed. In the tray removal area A5, a large number of trays 200 can be stacked.

Tray transport mechanisms 22A and 22B for transporting the trays 200 one by one in the Y direction are provided so as to straddle the collection area A4 and the tray removal area A5. The tray transport mechanism 22A is a movement part capable of reciprocating the tray 200 in the Y direction, that is, in the direction of the arrow $\alpha_{22A}$. With this configuration, the tested IC device 90 can be transported from the collection area A4 to the tray removal area A5. The tray transport mechanism 22B can move the empty tray 200 for collecting the IC device 90 in the positive side in the Y direction, that is, in the direction of the arrow $\alpha_{22B}$. With this configuration, the empty tray 200 can be moved from the tray removal area A5 to the collection area A4.

The control unit 800 can control, for example, the activation of each unit of the tray transport mechanism 11A, the tray transport mechanism 11B, the temperature adjustment unit 12, the device transport head 13, the device supply unit 14, the tray transport mechanism 15, the test unit 16, the device transport head 17, the device collection unit 18, the device transport head 20, the tray transport mechanism 21, the tray transport mechanism 22A, and the tray transport mechanism 22B.

As illustrated in FIG. 3, the control unit 800 includes a memory 802 (storing unit). The memory 802 includes, for example, an electrically erasable programmable read-only memory (EEPROM) or the like which is a type of a nonvolatile semiconductor memory, and stores various kinds of programs such as the test described above and the like.

As illustrated in FIG. 3, the control unit 800 includes an irradiation position determination unit 801 that determines whether or not a direction in which a laser light source 41, which is a light irradiation section to be described later, irradiates the laser light L1 is a predetermined direction. With this configuration for example, it can be determined whether or not the direction in which a laser light source 41 irradiates the laser light L1 is a desired direction.

The operator can set or check the operating condition and the like of the electronic component tester 1 through the monitor 300. The monitor 300 includes a display screen 301 configured by, for example, a liquid crystal screen, and is arranged on the front upper side of the electronic component tester 1. As illustrated in FIG. 1, on the right side of the tray removal area A5 in the figure, a mouse base 600 on which a mouse is placed is provided. This mouse is used when operating the screen displayed on the monitor 300.

The operation panel 700 is arranged on the lower right side of FIG. 1 with respect to the monitor 300. The operation panel 700 instructs the electronic component tester 1 to perform a desired operation separately from the monitor 300.

The signal lamp 400 can notify an activation state and the like of the electronic component tester 1 by a combination of colors of light to emit. The signal lamp 400 is arranged on the upper part of the electronic component tester 1. The electronic component tester 1 incorporates a speaker 500, and it is also possible to notify the activation state and the like of the electronic component tester 1 by the speaker 500.

The monitor 300 and the speaker 500 function as a notification unit 24 for notifying the result of determination as to whether or not the IC device 90 is arranged in the recess 161 of the test unit 16 as will be described later. With this configuration, it is possible to notify the operator of the electronic component handler 10 of the result of the determination.

In the electronic component tester 1, the tray supply area A1 and the supply area A2 is partitioned by a first partition wall 231, the supply area A2 and the test area A3 is partitioned by a second partition wall 232, the test area A3 and the collection area A4 is partitioned by a third partition wall 233, and the collection area A4 and the tray removal area A5 is partitioned by a fourth partition wall 234. The supply area A2 and the collection area A4 is also partitioned by a fifth partition wall 235.

The electronic component tester 1 is covered with a cover at the outermost, and the cover includes, for example, a front cover 241, a side cover 242, a side cover 243, a rear cover 244, and a top cover 245.

Next, a detection unit 2 will be described with reference to FIGS. 4 to 9. The detection unit 2 includes a first detection unit 2A and a second detection unit 2B. The first detection unit 2A and the second detection unit 2B are provided on the +Z side of the device transport head 17 (see FIG. 5) and are arranged in this order from the +X direction.

As illustrated in FIGS. 4 and 5, each of the first detection unit 2A and the second detection unit 2B includes an imaging unit 3, a light irradiation unit 4, and an illumination 5. Since the first detection unit 2A and the second detection unit 2B have the same configuration except that the arrangement positions of the imaging unit 3, the light irradiation unit 4, and the illumination 5 are different, the first detection unit 2A will be representatively described below.

The imaging unit 3 includes a camera (imaging section) and a mirror 32. For the camera 31, for example, a charge coupled device (CCD) camera can be used. The camera 31 is arranged facing the −Y direction. As illustrated in FIG. 3, the camera 31 is electrically connected to the control unit 800, and its activation is controlled.

As illustrated in FIGS. 4 and 5, the mirror 32 is provided on the −Y side of the camera 31. The mirror 32 has a light reflection surface 321 that reflects light, and the mirror 32 is installed in a state where the light reflection surface 321 is inclined (for example, 45 degrees) with respect to the Y axis direction. For that reason, the camera 31 can capture an image on the −Z side through the light reflection surface 321. That is, the camera 31 can image the test unit 16 side.

The camera 31, which is the imaging section, is arranged such that its optical axis intersects an extension line in the direction (X direction) in which the mirrors 42 which are light reflection portions to be described later are arranged. With this configuration, the camera 31 can image a portion of the test unit 16 irradiated with light reflected by each mirror 42.

Figure 6:
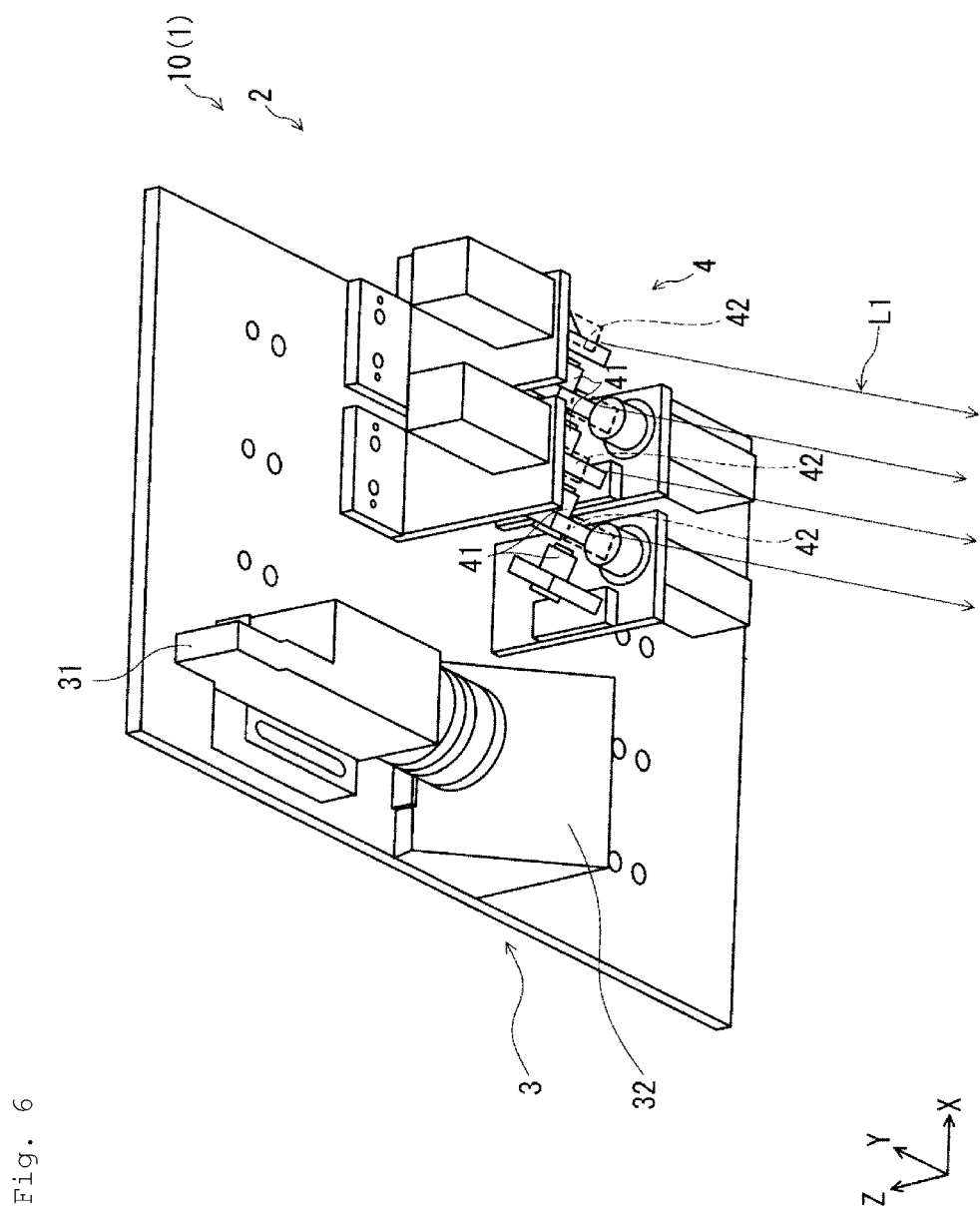
FIG. 6 is a perspective view of a detection unit included in the electronic component tester illustrated in FIG. 1.
Figure 7:
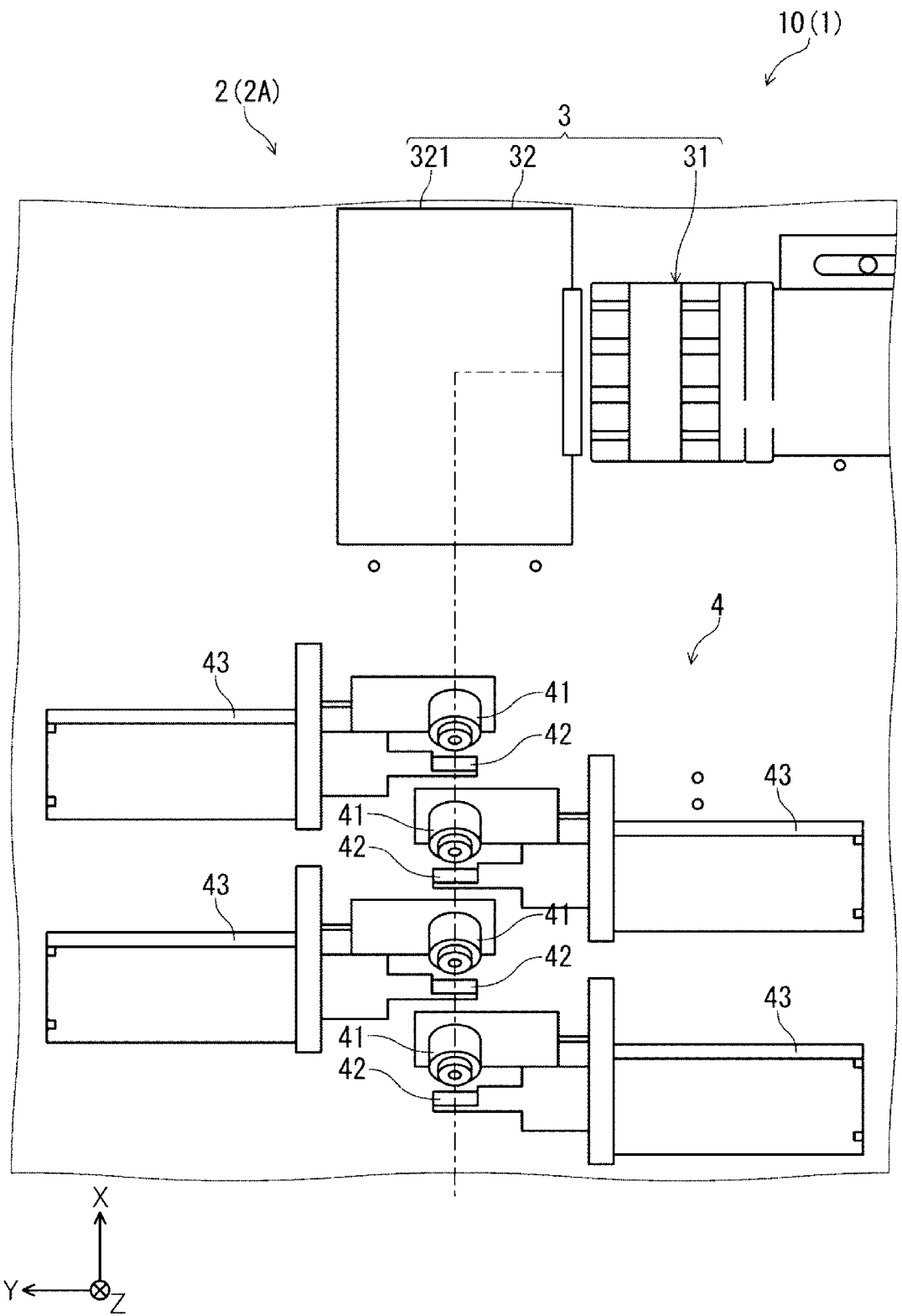
FIG. 7 is a view of the detection unit included in the electronic component tester illustrated in FIG. 1, when viewed from the bottom.

As illustrated in FIGS. 6 and 7, the light irradiation unit 4 includes four laser light sources (light irradiation sections) 41, four mirrors 42 provided corresponding to the respective laser light sources 41 and reflecting laser light L1 emitted from the laser light sources 41, and four motors 43 for pivoting the respective mirrors 42. That is, in the light irradiation unit 4, a plurality (four) of laser light sources 41, which are light irradiation sections, and mirrors 42, which are light reflection portions, are provided.

As the laser light source 41, a known laser light source can be used, and a color of laser light L1 to be the emitted is not particularly limited. The laser light source 41 as the light irradiation section irradiates linear laser light (light) L1 whose irradiation shape at the irradiation destination (the test unit 16 or the IC device 90 on the test unit 16) extends in the Y direction (second direction). With this configuration, as will be described later, it is possible to make change in the position of the irradiated laser light L1 easier to understand in the image captured by the camera 31 depending on the presence or absence of the IC device 90. Therefore, it is possible to detect more accurately whether or not the IC device 90 remains on the test unit 16.

As illustrated in FIGS. 4 and 5, the laser light L1 emitted by the laser light source 41 is configured so as to cover two recesses 161 aligned in the Y direction at the irradiation destination test unit 16. That is, one laser light source 41 collectively irradiates two recesses 161 arranged in the Y axis direction with the laser light L1. Four (multiple) laser light sources (light irradiation sections) 41 are provided and arranged along the X direction, which is the third direction, so that it is possible to irradiate the eight recesses 161 with the laser light L1 by the four laser light sources 41. Since the total of eight laser light sources 41 are provided in the first detection unit 2A and the second detection unit 2B, each of the sixteen recesses 161 can be irradiated with the laser light L1.

Figure 8:
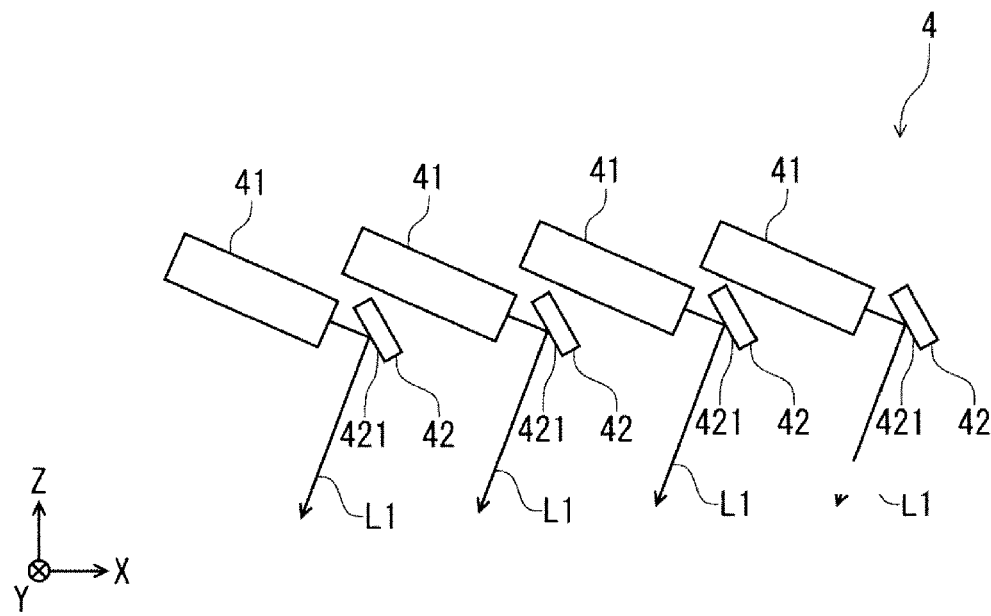
FIG. 8 is a side view of a light irradiation unit included in the electronic component tester illustrated in FIG. 1.

As illustrated in FIG. 8, when viewed from the Y direction, the laser light sources 41 are arranged to be inclined with respect to the X direction. For that reason, it is possible to prevent the laser light source 41 from interfering with the adjacent mirror 42. As a result, the distance between the laser light source 41 and the mirror in the X direction can be made as small as possible, which contributes to miniaturization of the light irradiation unit 4. In particular, in the electronic component handler 10, the space is limited on the +Z side of the device transport head 17, and miniaturization of the light irradiation unit 4 is achieved, thereby contributing to miniaturization of the entire electronic component handler 10.

Such a laser light source 41 is electrically connected to the control unit 800, and its activation is controlled (see FIG. 3).

As illustrated in FIGS. 4 to 9, the light irradiation unit 4 includes the mirrors 42 as light reflection portions for reflecting the laser light L1 emitted from the laser light sources 41 which are the light irradiation sections. With this configuration, the laser light sources 41 can be arranged regardless of the direction of the laser light sources 41. Therefore, the degree of freedom of arrangement of the laser light sources 41 can be increased.

As illustrated in FIG. 8, the mirror 42 has a reflection surface 421 that reflects the laser light L1, and is arranged so that the reflection surface 421 faces the laser light source 41.

The mirrors 42 are arranged in the X direction (third direction) intersecting the Z direction (first direction) and the Y direction (second direction). With this configuration, it is possible to match with an arrangement form of the laser light sources 41, and it is possible to simplify the arrangement form of the respective mirrors 42.

The light irradiation unit 4 has four motors 43 as a light reflection portion driving unit for pivoting the mirror 42 as the light reflection portion. The mirror 42 is configured to be pivotable to thereby make it possible to adjust an orientation of the reflection surface 421 of the mirror 42 and adjust an irradiation position of the laser light L1.

Figure 9:
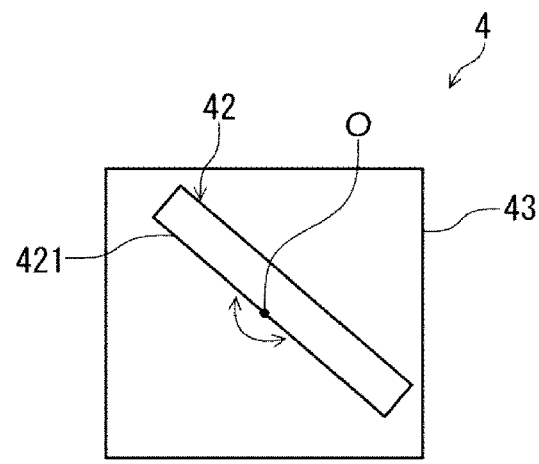
FIG. 9 is a view for explaining a position of a pivot axis of a mirror included in the light irradiation unit illustrated in FIG. 8.

As illustrated in FIG. 9, the mirror 42 is coupled to the motor 43 so that its pivot axis O is positioned on the reflection surface 421. With this configuration, when the irradiation direction of the laser light L1 is adjusted by pivoting the mirror 42, the adjustment can be performed accurately.

As such, in the electronic component handler 10, since the direction of the laser light L1 to be emitted by the laser light source 41 as the light irradiation section can be adjusted, it is possible to adjust the irradiation position of the laser light L1 at the test unit 16 or to cope with a test unit in which the arrangement position of the recess 161 is different from the configuration illustrated in FIGS. 4 and 5.

By adjusting the laser light source 41 which is the light irradiation section so as to irradiate the laser light L1 in at least a direction inclined with respect to the Z direction which is the first direction, that is, in a direction not intersecting and not orthogonal, as will be described later, it is possible to make the change in the position of the irradiated laser light L1 easier to understand in accordance with the presence or absence of the IC device 90.

The respective motors 43 as the light reflection portion driving unit are arranged along the X direction which is the third direction. Then, the motors 43 adjacent to each other in the X direction are arranged so as to be shifted in the Y direction which is the second direction, and are arranged in a so-called staggered arrangement. With this configuration, it is possible to prevent the motors 43 adjacent to each other in the X direction from interfering with each other even if the interval between the motors 43 in the X direction is made relatively small. As a result, it is possible to achieve miniaturization of the light irradiation unit 4.

The illumination (second light irradiation section) 5 irradiates light L2 having lower luminance than the laser light L1. The light L2 has a lower directivity than the laser light L1, and is configured to illuminate the entire test unit 16. The illumination 5 is a second light irradiation section (light irradiation section) that emits the light L2 having lower luminance than the laser light source 41 which is a light irradiation unit. With this configuration, it is possible to irradiate light L2 having an insufficient irradiation condition (for example, directivity lower than the laser light L1) for light to be irradiated by the laser light source 41. The illumination 5 is arranged on the +X side of the light irradiation unit 4. In the present invention, the light irradiation section includes the laser light source 41 which is the first light irradiation section and the illumination 5 which is the second light irradiation section.

The illumination 5 which is the second light irradiation section can adjust luminance of light to be emitted. With this configuration, the illuminance of the light L2 to be emitted from the illumination 5 can be adjusted. Therefore, when performing a determination to be described later, an image with better conditions can be used.

Such a detection unit 2 can detect the presence or absence of the IC device 90 in the recess 161 of the test unit 16. Hereinafter, this principle will be described with reference to FIGS. 10 to 13, but since similar detection is performed in each recess 161, detection in one recess 161 will be representatively described.

Figure 10:
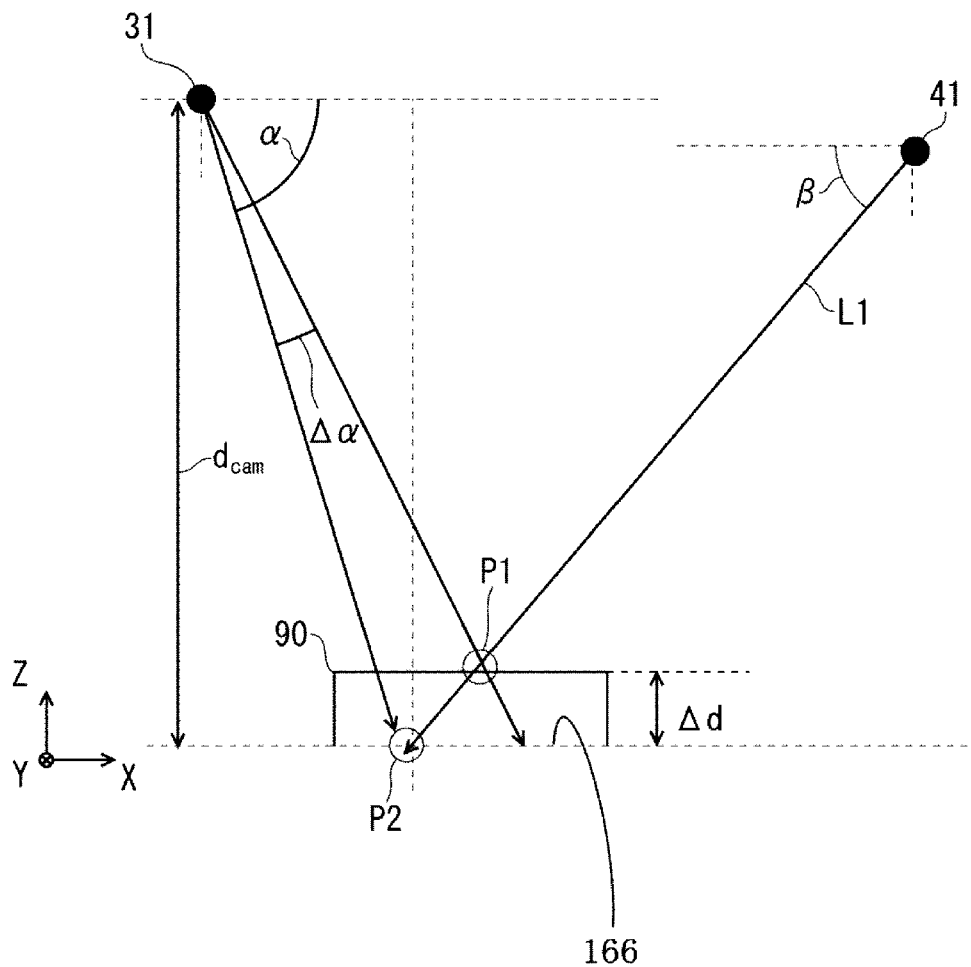
FIG. 10 is a schematic diagram for explaining a detection principle of the detection unit included in the electronic component tester illustrated in FIG. 1.

FIG. 10 is a view schematically illustrating the detection unit 2, and is a view of the detection unit 2 when viewed from the Y direction. In FIG. 10, the laser light L1 is emitted from the laser light source 41 toward the test unit 16. When the IC device 90 is placed on the test unit (hereinafter, this state is referred to as a "residual state"), a position P1 on the IC device 90 is irradiated with the laser light L1, and a line having a linear irradiation shape is formed at this position P1. On the other hand, when the IC device 90 is not on the test unit (hereinafter, this state is referred to as a "removal state"), a position P2 of the bottom portion of the recess 161 of the test unit 16 is irradiated with the laser light L1, and a line having a linear irradiation shape is formed at this position P2. In the present specification, the "linear" refers to a single straight line, an aggregate of points spaced apart from each other and aligned in one direction, and an elongated shape such as an elliptical shape or a rectangular shape.

Figure 12:
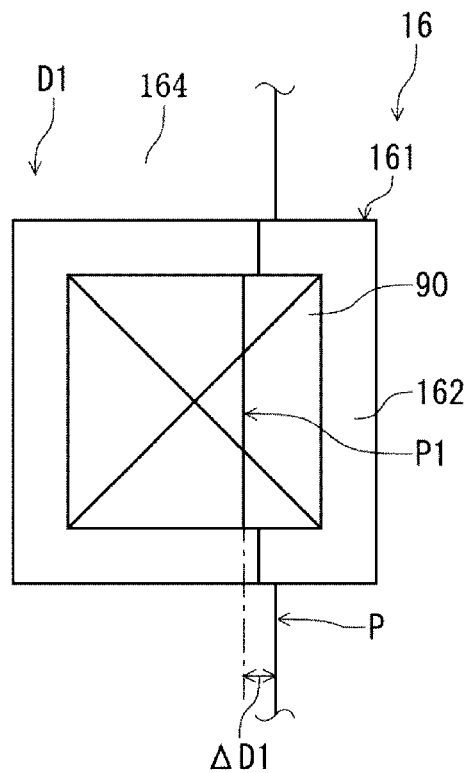
FIG. 12 illustrates an image (first image) of a recess of the test unit included in the electronic component tester illustrated in FIG. 1, and illustrates a residual state.

The camera 31 captures an image (first image) in the residual state and the removal state, respectively. FIG. 12 illustrates a part of an image D1 captured by the camera 31 in the residual state, and FIG. 13 illustrates a part of an image D2 captured by the camera 31 in the removal state.

As illustrated in FIG. 12, in the image D1, the position P1 of the line of the laser light L1 on the IC device 90 is shifted to the −X side (left direction in the figure) from the position P of the line of the laser light L1 on the upper surface of the test unit 16. This is because the upper surface of the IC device 90 is lower than the upper surface of the test unit 16, that is, the upper surface of the IC device 90 is positioned on the −Z side. A shift amount in the X direction between the position P and the position P1 is set as a shift amount ΔD1.

Figure 13:
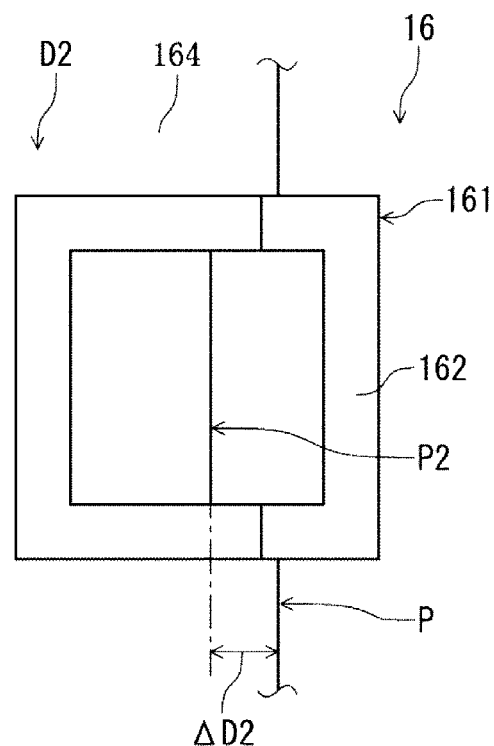
FIG. 13 illustrates the image (first image) of the recess of the test unit included in the electronic component tester illustrated in FIG. 1, and illustrates a removal state.

On the other hand, as illustrated in FIG. 13, in the image D2, the position P2 of the line of the laser light L1 on the bottom portion of the recess 161 is shifted to the −X side from the position P of the line of the laser light L1 on the upper surface of the test unit 16. This is because the bottom portion of the recess 161 is lower than the upper surface of the test unit 16, that is, the bottom portion of the recess 161 is positioned on the −Z side. A shift amount in the X direction (left-and-right direction in the figure) between the position P and the position P2 is set as a shift amount ΔD2.

The shift amount ΔD1 is smaller than the shift amount ΔD2. This is because the upper surface of the IC device 90 is positioned on the +Z side of the bottom portion of the recess 161. In the electronic component handler 10, it is possible to detect (determine) whether it is the residual state or the removal state, depending on whether the shift amount in the images D1 and D2 is the shift amount ΔD1 or the shift amount ΔD2, for example.

Here, as the thickness Δd of the IC device 90 becomes thinner, it is difficult to discriminate whether it is the shift amount ΔD1 or the shift amount ΔD2. Accordingly, in the relatively thin IC device 90, it is necessary to use a camera 31 having relatively high resolution in order to determine whether it is a residual state or a removal state. Specifically, in FIG. 10, if the camera 31 capable of recognizing an angle Δα between a line segment connecting the position P1 and the center (optical axis) of the camera 31 and a line segment connecting the position P2 and the center (optical axis) of the camera 31 is used, it can be determined whether it is a residual state or a removal state. For example, in order to know what degree of the angle Δα can be used to recognize the camera if the thickness Δd of the IC device 90 is known, and in order to know what degree of the determination can be performed in the IC device 90 having the thickness Δd if the resolution of the camera 31 is known, the present inventors derived the following two equations (1) and (2).

When it is assumed that an angle formed by the line connecting the position P2 and the center (optical axis) of the camera 31 and the X axis α, an angle formed by the optical axis of the laser light L1 and the X axis β, and the distance between the optical axis of the camera 31 and the bottom portion of the recess 161 is $d_{cam}$, the thickness Δd of the IC device 90 can be pushed by the equation (1) and the angle Δα can be pushed by the equation (2).

Equation 1
$$\Delta d = \frac{\tan(\beta)\|\tan(\alpha) - \tan(\alpha - \Delta\alpha)\|}{\tan(\alpha)[\tan(\alpha - \Delta\alpha) + \tan(\beta)]} d_{com} \quad (1)$$

Equation 2
$$\Delta\alpha = \alpha - \tan^{-1}\left[\frac{\tan(\alpha) \cdot \tan(\beta) \cdot (d_{com} + \Delta d)}{d_{com}\tan(\beta) - \Delta d \tan(\alpha)}\right] \quad (2)$$

For example, if the angle Δα is known, the angle Δα is substituted into the equation (1), thereby making it possible to know the minimum thickness Δd of the IC device 90 for which the determination can be performed. If the thickness Δd is known, the thickness Δd is substituted into the equation (2), thereby making it possible to know resolution necessary for the camera 31.

It is preferable that the determination described above can be performed for the IC device 90 having the thickness Δd of 0.2 mm or more, and it is more preferable that the determination can be performed for the electronic component of 0.1 mm or more. With this configuration, even with a relatively thin IC device 90, it can be detected whether or not the IC device 90 remains on the test unit 16. If the thickness Δd is too small, it is necessary to use the camera 31 having relatively high resolution, which is costly.

As illustrated in FIG. 11, an angle θ1 of the laser light L1 to be emitted from the laser light source 41 which is the light irradiation section is smaller than an angle θ2 between the inner circumferential surface 162 of the recess 161 and the X direction which is the third direction. With this configuration, the inside of the recess 161 can be irradiated with the laser light L1. As a result, it can be detected whether or not the IC device 90 remains in the recess 161.

As described above, a determination (first determination) using the laser light L1 has been described. The electronic component handler 10 can make a determination (second determination) even in a system different from the first determination. Hereinafter, this will be described with reference to FIGS. 14 and 15.

Figure 14:
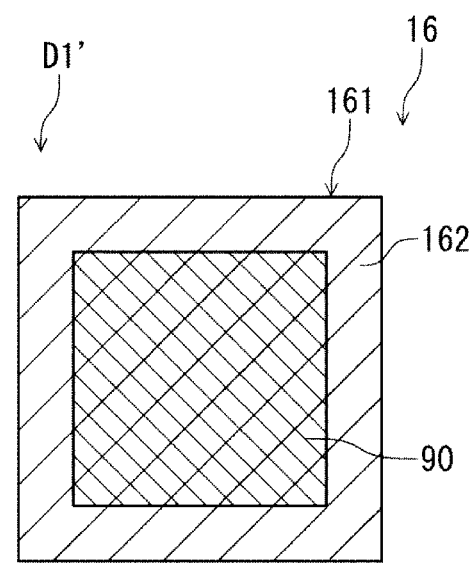
FIG. 14 illustrates an image (second image) of the recess of the test unit included in the electronic component tester illustrated in FIG. 1, and illustrates the residual state.
Figure 15:
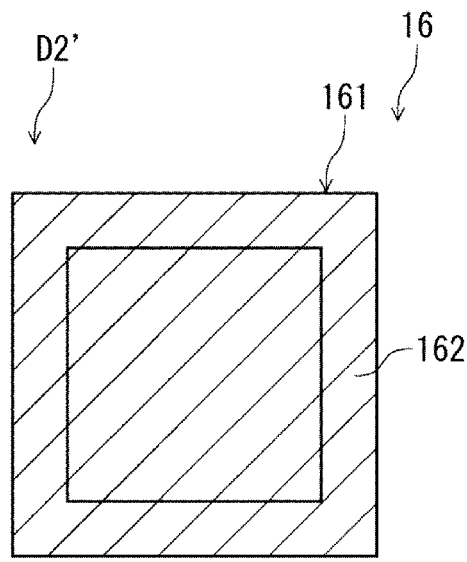
FIG. 15 illustrates the image (second image) of the recess of the test unit included in the electronic component tester illustrated in FIG. 1, and illustrates the removal state.

FIG. 14 and FIG. 15 illustrate images (second image) obtained by irradiating the test unit 16 with the light L2 by the illumination 5 and imaging the test unit 16 using the camera 31 in this state. FIG. 14 illustrates a part of an image D1' in the residual state and FIG. 15 illustrates a part of an image D2' in the removal state.

In the electronic component handler 10, based on the captured images D1' and D2', it is possible to detect (determination) the difference in color or the difference in brightness of the IC device 90 and determine whether it is a residual state or a removal state. As such, the electronic component handler 10 can perform the first determination and the second determination.

In the electronic component handler 10, it is difficult to secure a space for installing the detection unit 2. For example, even if the detection unit 2 is arranged in the vicinity of the test unit 16, that is, at the position shifted from the test unit 16 when viewed from the Z direction, a range in which the laser light L1 and the light L2 can be irradiated is limited, and an image-capturable area of the camera 31 is limited. In view of these facts, it is preferable to arrange the device directly above the test unit 16, that is, on the +Z side of the test unit 16, but the device transport head 17 is provided on the +Z side of the test unit 16.

Therefore, the electronic component handler 10 is configured such that the detection unit 2 is arranged on the +Z side of the device transport head 17 and detection is performed through a gap S between the two device transport heads 17A and 17B. That is, a configuration in which the test unit 16 is irradiated at least one of the laser light L1 and the light L2 through the gap S, an image is captured using the camera 31 through the gap S, and at least one of the first determination and the second determination is performed is adopted. With this configuration, even with the configuration, it is possible to accurately detect (determine) whether it is the residual state or the removal state.

Figure 16:
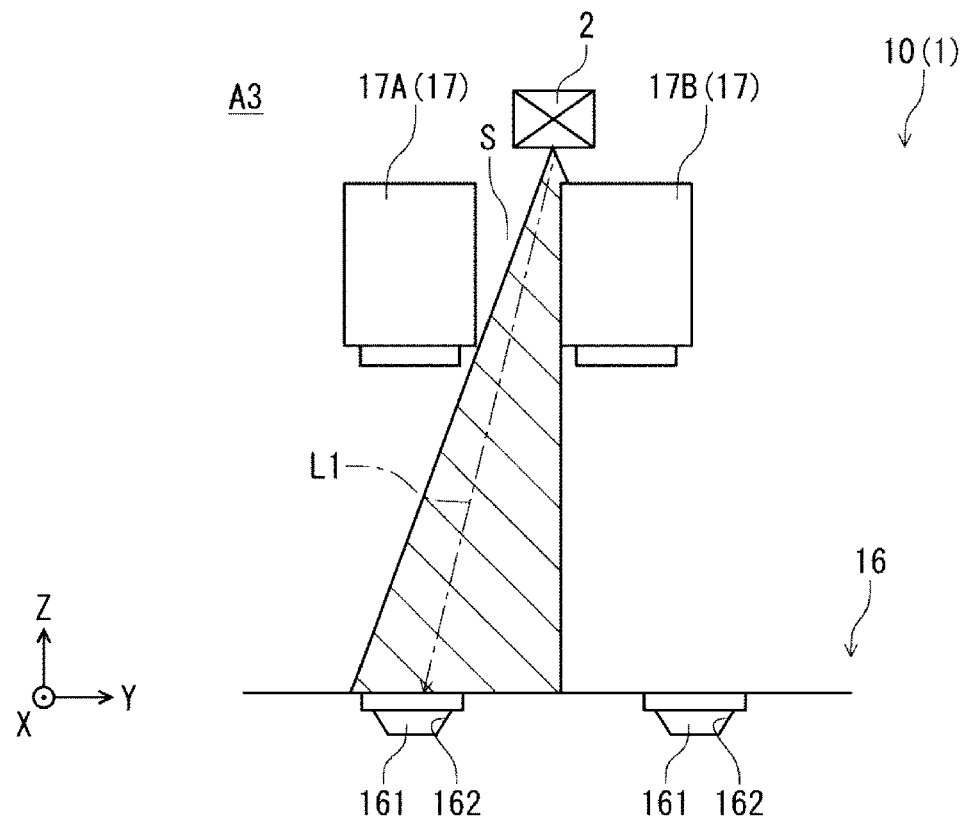
FIG. 16 is a side view of the device transport head of the electronic component tester illustrated in FIG. 1, and is a view for explaining a positional relationship between the device transport head and the detection unit.
Figure 17:
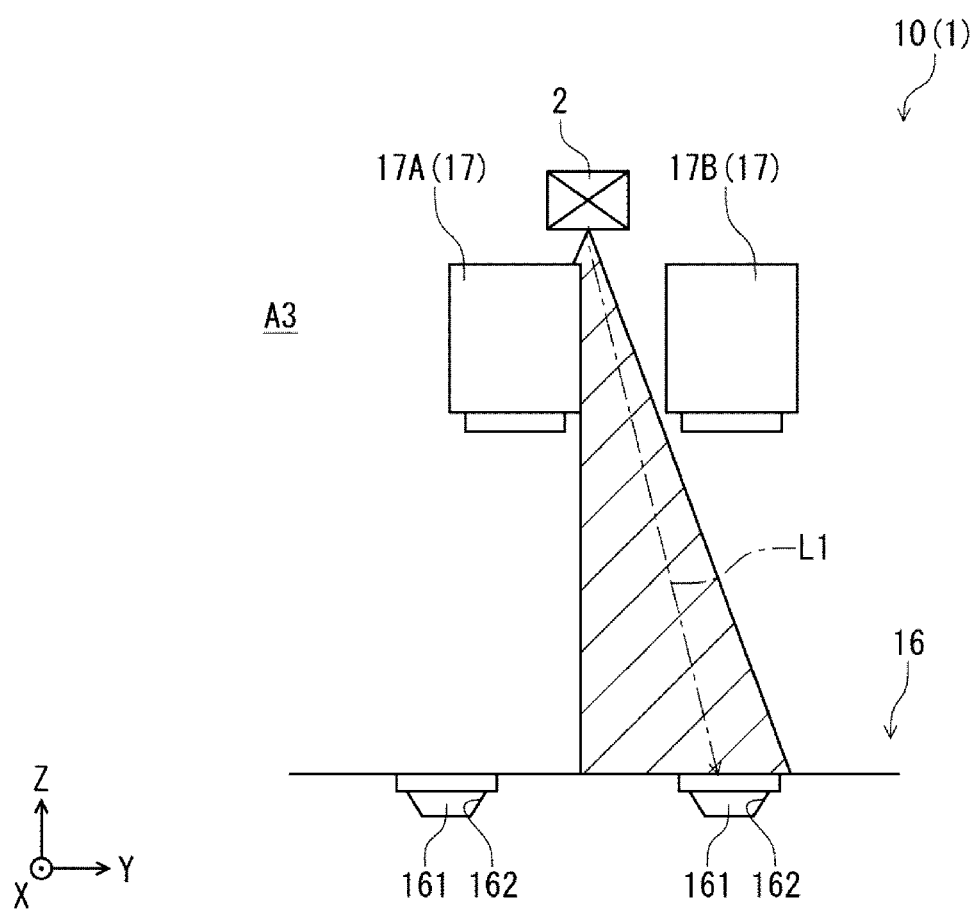
FIG. 17 is a side view of the device transport head of the electronic component tester illustrated in FIG. 1, and is a view for explaining the positional relationship between the device transport head and the detection unit.

Since the gap S is relatively narrow, there are cases where it is difficult for the camera 31 to image the entire area of the test unit 16, in particular, the entire area of the test unit 16 in the Y axis direction. Therefore, while moving the device transport head 17, among the sixteen recesses 161, imaging is performed when eight recesses 161 on the −Y side can be imaged as illustrated in FIG. 16 and imaging is performed when eight recesses 161 on the +Y side can be imaged as illustrated in FIG. 17. With this configuration, even if it is difficult to capture the image of the entire area of the test unit 16 in the Y-axis direction, it is possible to capture images of the respective recesses 161 based on a plurality of images, and it is possible to detect (determine) whether each of the recesses 161 is in a residual state or a removal state. The position of the device transport head 17 in the image-capturable state is detected by the encoder 23, and an encoder value when imaging is possible is stored in the memory 802.

In the electronic component handler 10, when the device transport head (first hold portion) 17A pushes the IC device 90 against the test unit (electronic component placement portion) 16, the device transport head 17A may be positioned between the camera (imaging section) 31 and the IC device 90 (see FIG. 18). In this case, the device transport head 17A shields the eight recesses 161 on the −Y side, making it difficult to image the eight recesses 161. On the other hand, when the device transport head (second hold portion) 17B pushes the IC device 90 against the test unit (electronic component placement portion) 16, the device transport head 17B may be positioned between the camera (imaging section) 31 and the IC device 90 (see FIG. 19). In this case, the device transport head 17B shields the eight recesses 161 on the +Y side, making it difficult to image the eight recesses 161. Utilizing this problem, for example, when the camera 31 is configured to capture images only when the IC device 90 can be imaged, since the timing at which imaging is difficult is known, it is possible to easily set at which timing imaging is to be omitted. As a result, it is possible to prevent useless images from being captured.

The camera 31 which is the imaging section can image the test unit (electronic component placement portion) 16 through a gap between the device transport head (first hold portion) 17A and the device transport head (second hold portion) 17B, between the imaging start time and the imaging end time. That is, imaging is omitted when the test unit is shielded by the device transport head 17A or the device transport head 17B. Therefore, it is possible to perform imaging without waste, and it is possible to prevent unnecessary increase in image data.

Figure 20:
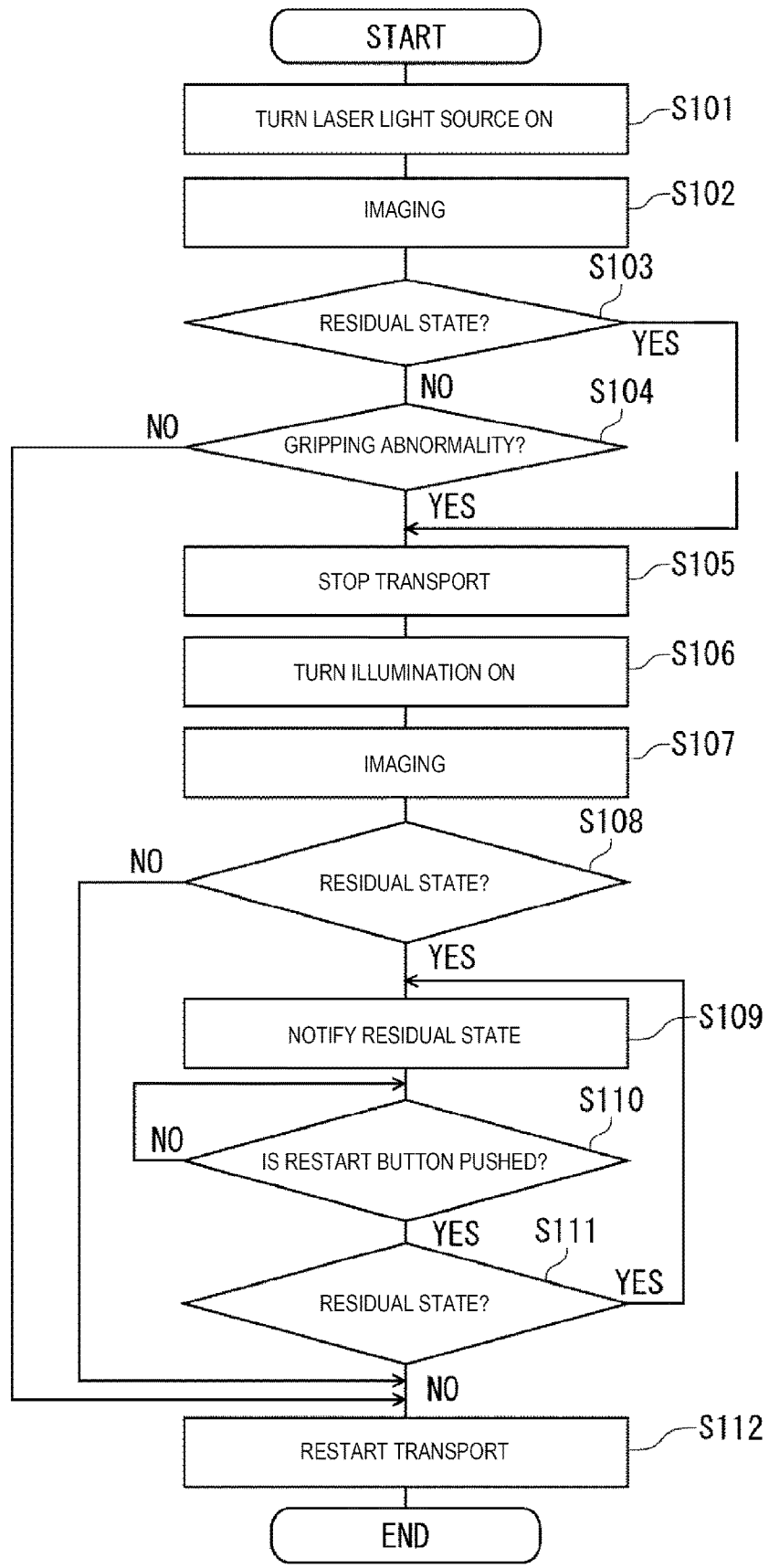
FIG. 20 is a flowchart illustrating a control operation of a control unit included in the electronic component tester illustrated in FIG. 1.

Next, a control operation of the control unit 800 will be described based on a flowchart illustrated in FIG. 20. The following control operation is a control operation in a state where the IC device 90 is transported to the test unit 16 and is subjected to test, and the IC device 90 is removed from the test unit 16.

First, in step S101, the laser light source 41 is activated to irradiate each recess 161 with the laser light L1 (see FIG. 5). In this case, in this embodiment, the illumination 5 is kept turned off. With this configuration, it is possible to make lines of the laser light L1 stand out in the image D1 or the image D2 obtained in the next step S102.

Next, in step S102, the test unit 16 is imaged using the camera 31. With this configuration, the image (first image) D1 or the image (first image) D2 as illustrated in FIG. 12 or FIG. 13 can be obtained. Imaging in step S102 is performed in the image-capturable state illustrated in FIGS. 16 and 17. When imaging is ended, irradiation with the laser light L1 is stopped.

Next, in step S103, it is determined whether the state is a residual state or a removal state. In this embodiment, the image D2 having the shift amount ΔD2 is acquired and stored in the memory 802 in advance, and it is determined whether the state is the residual state or the removal state, based on the shift amount of the laser light L1 in the image D2. When it is determined in step S103 that the state is the residual state, the process proceeds to step S105 to be described later.

In step S104, when it is determined that the state is the removal state, it is determined whether or not a holding abnormality has occurred in the device transport head 17. The holding abnormality means, for example, a state where the IC device 90 is not held by the device transport head 17. This holding abnormality is carried out, for example, by detecting a suction pressure of the device transport head 17.

When it is determined in step S104 that the holding abnormality has occurred, that is, when it is determined that the IC device (electronic component) 90 is arranged in the test unit 16 which is the electronic component placement portion, the activation of the device transport head 17 is stopped. In step S105, the movement is stopped while holding the IC device 90 is being held. With this configuration, it is possible to prevent continuation of the transport operation in the residual state.

Then, in step S106, the illumination 5 is turned on to irradiate the entire test unit 16 with the light L2.

Next, in step S107, the camera 31 images the test unit 16. With this configuration, it is possible to obtain an image (second image) D1' or an image (second image) D2' as illustrated in FIG. 14 or 15. Imaging in step S107 is performed in the imaging enabled state illustrated in FIGS. 16 and 17.

Next, in step S108, it is determined whether the state is a residual state or a removal state. In step S108, as described above, based on the captured images D1' and D2', a difference in color of the IC device 90 or a difference in brightness is detected to determine whether the state is a residual state or a removal state. In this embodiment, the image D2' in the removal state is acquired and stored in the memory 802 in advance, and is compared with the obtained image D1' or image D2'.

When it is determined in step S108 that the state is the residual state, it is notified in step S109 that the state is the residual state. This notification is performed by activating the notification unit 24. By this notification, the operator can remove the IC device 90 of the test unit 16 and can eliminate the residual state. Then, for example, the operator can push a transport restart button through the operation panel 700.

When it is determined in step S110 that the restart button is pushed, it is determined in step S111 whether the state is a residual state or a removal state. In this step, when the restart button is pushed, a new image is captured and, similarly to step S108, it is determined whether the state is the residual state or the removal state, based on the image. When it is determined in step S111 that the state is the removal state, the transport is restarted in step S112.

As such, in this embodiment, after a determination (first determination) is performed based on the image D1 or D2 which is the first image, a determination (second determination) is performed based on the image D1' or the image D2' which is the second image. As such, since it is determined whether the state is the residual state or the removal state in two stages using the first image and the second image captured by irradiating the light having different luminance, the determination can be performed more accurately.

In the electronic component handler 10, the determination described above can also be applied to the device transport head 13 and the device transport head 20, but by adapting the determination to the device transport head 17 in the test area A3, that is, the electronic component placement portion is preferably the test unit 16 on which the IC device 90 is tested. With this configuration, it is possible to efficiently test the IC device 90 by configuring the test unit 16 to determine whether it is in the residual state or in the removal state.

As described above, according to the electronic component handler 10, based on at least one of the image D1 or image D2 which is the first image obtained by imaging the test unit (electronic component placement portion) 16 in a state where the laser light source 41 as the light irradiation section emits the laser light L1 of the first luminance and the image D1' or image D2' which is the second image obtained by imaging the test unit 16 in a state where the laser light source 41 emits the light L2 of the second luminance which is smaller than the first luminance, it is determined whether or not the IC device 90 that is an electronic component is arranged in the test unit 16.

With this configuration, it is possible to detect whether or not the IC device 90 remains on the electronic component placement portion 16 after the operation of transporting the IC device 90 to the electronic component placement portion 16 is performed. In particular, since it is determined whether or not the IC device 90 remains on the test unit 16 based on at least one of the two images captured by irradiating light having different luminance, the determination can be performed more accurately.

In this embodiment, as an example, although the determination in step S111 has been described in the case of performing the second determination, it may be configured to perform the first determination, or may be configured to sequentially perform the first determination and the second determination. In particular, when the first determination and the second determination are sequentially performed, that is, when the same control as in steps S101 to S108 is performed in step S111, it is possible to determine more accurately whether it is a residual state or a removal state.

The second luminance may be smaller than the first luminance, and includes a state of zero, that is, a state where the illumination 5 is not irradiating the light L2.

Second Embodiment

Figure 21:
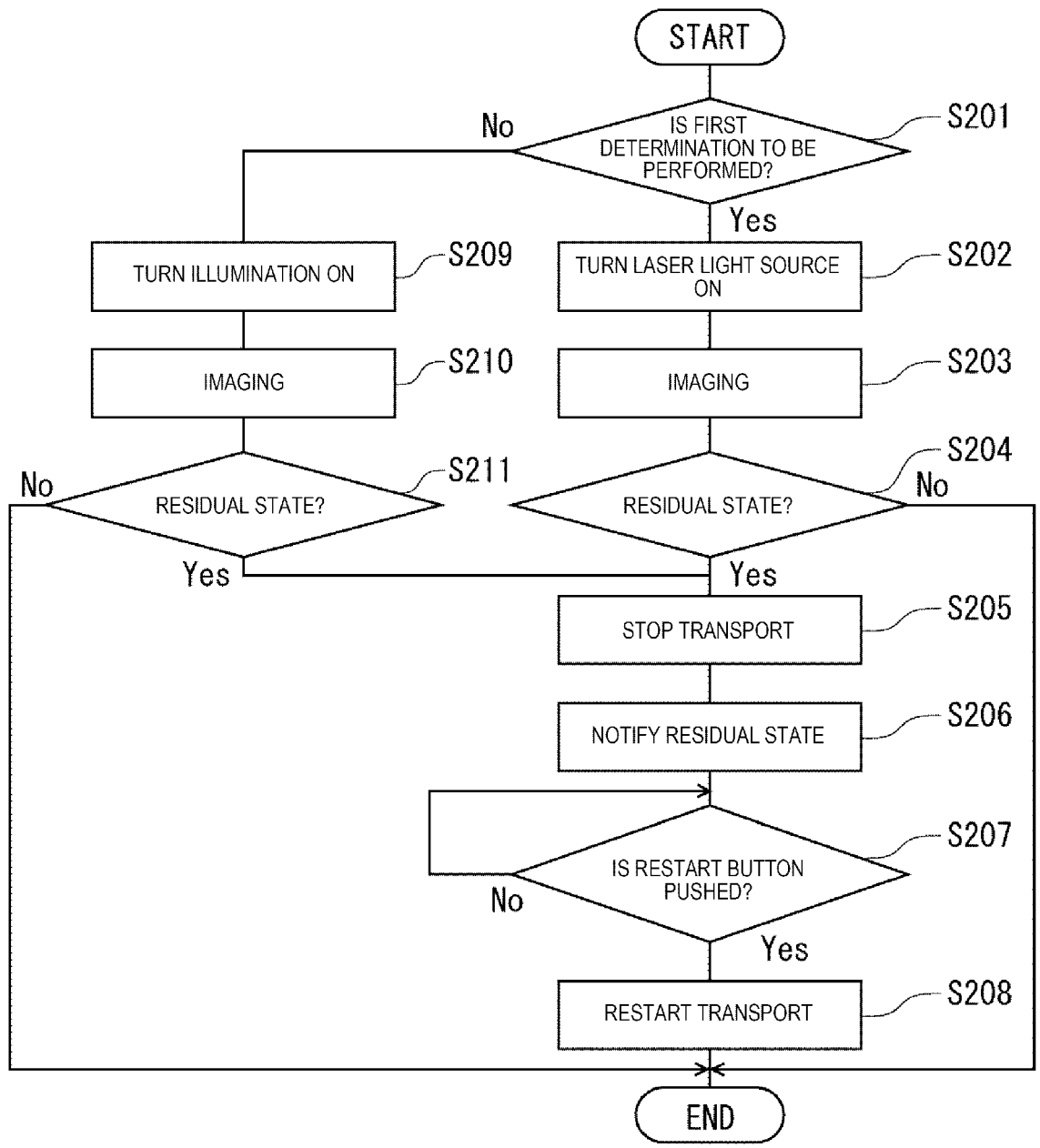
FIG. 21 is a flowchart illustrating a control operation of a control unit included in a second embodiment of the electronic component tester of the present invention.

Hereinafter, a second embodiment of the electronic component handler and the electronic component tester of the present invention will be described with reference to FIG. 21, but the differences from the embodiment described above will be mainly described, and the description of the same matters will be omitted.

This embodiment is substantially the same as the first embodiment except that the control operation of the control unit is different.

The following control operation is a control operation in a state where the IC device 90 is transported to the test unit 16 and is subjected to test and the IC device 90 is removed from the test unit 16.

First, in step S201, it is selected whether to perform the first determination or the second determination. In step S201, based on at least one of the conditions of the irradiation conditions of the laser light source 41 which is the light irradiation section and the illumination 5, the color of the test unit (electronic component placement portion) 16, the color of the IC device (electronic component) 90, and the resolution of the camera 31, an image to be used for determining whether it is a residual state or an eliminated state is selected from the first image (images D1 and D2) and the second image (images D1' and D2'). With this configuration, when a determination as to whether it is a residual state or a removal state is performed, an image with better conditions can be used. Therefore, it is possible to more accurately determine whether or not the IC device 90 remains on the test unit 16.

The irradiation conditions include, for example, the emission angle of the laser light L1, the luminance of the laser light L1, the luminance of the light L2 and the like. A calibration curve between these conditions and, for example, the brightness in the test area A3 is stored in advance in the memory 802, and the determination of the step S201 can be performed based on the calibration curve.

When it is determined in step S201 that the first image is to be used, in step S202, the laser light source is activated to irradiate each recess 161 with laser light L1 (see FIG. 5).

Then, in step S203, the camera 31 is used to image the test unit 16. With this configuration, the image (first image) D1 or the image (first image) D2 as illustrated in FIG. 12 or FIG. 13 can be obtained.

Next, in step S204, similarly to step S103 of the first embodiment, it is determined whether the state is the residual state or the removal state. When it is determined in step S204 that the state is the residual state, the activation of the device transport head 17 is stopped in step S205, and the notification unit 24 notifies the residual state in step S206.

When it is determined in step S207 that the restart button has been pushed, the activation of the device transport head 17 is restarted in step S208.

When it is determined in step S201 that the second image is to be used, the illumination 5 is turned on in step S209, and the test unit 16 is imaged by the camera 31 to obtain the second image in step S210. Then, in step S211, similarly to step S108 in the first embodiment, it is determined whether the state is the residual state or the removal state. In step S211, when it is determined that the state is the residual state, the process proceeds to step S205, and the following steps are performed.

Also in this embodiment, when it is determined in step S207 that the restart button has been pushed, it is preferable to perform the first determination and the second determination, similarly as in the first embodiment, before executing step S208.

Third Embodiment

Hereinafter, a third embodiment of the electronic component handler and the electronic component tester of the present invention will be described with reference to FIGS. 22 to 24, but the differences from the embodiments described above will be mainly described, the description of the same matters will be omitted.

This embodiment is substantially the same as the first embodiment except that the control operation of the control unit is different.

Figure 22:
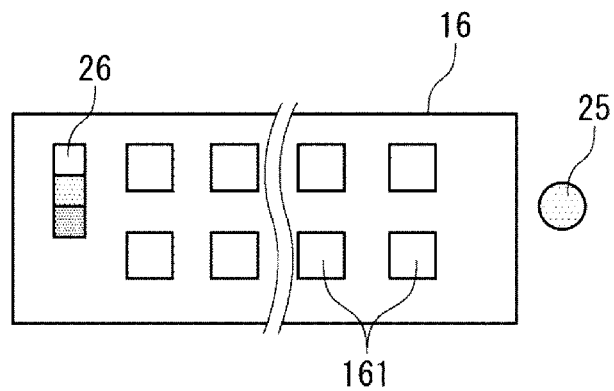
FIG. 22 is a plan view of a test unit included in a third embodiment of the electronic component tester of the present invention.
Figure 22:
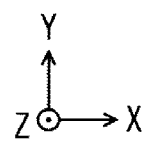

As illustrated in FIG. 22, in this embodiment, an illuminance sensor 25 for detecting illuminance is provided on the +X side of the test unit 16. Although not illustrated, the illuminance sensor 25 is electrically connected to the control unit 800, and information of the illuminance detected by the illuminance sensor 25 is transmitted to the control unit 800.

A marker 26 is provided in the vicinity of the end portion on the −X side of the upper surface of the test unit 16. The marker 26 is composed of a colored portion or the like having areas having different colors from each other.

Next, although the control operation of the control unit 800 in this embodiment will be described using the flowchart illustrated in FIG. 24, the following control operation is a control operation in a state where the IC device 90 is transported to the test unit 16 and is subjected to test, and the IC device 90 is removed from the test unit 16.

First, in step S301, the laser light source 41 and the illumination 5 are turned on. In this case, in order to make the laser light L1 stand out, it is preferable to reduce the luminance of the light L2, but if the luminance of the light L2 is too small, it may be difficult to accurately perform the second determination.

Therefore, in step S302, the luminance of at least one of the laser light L1 and the light L2 is adjusted. This adjustment is performed by adjusting the output of at least one of the laser light source 41 and the illumination 5, according to notification of the illuminance detected by the illuminance sensor 25 (brightness in the test A3) or information obtained from luminance distribution of the image.

Figure 23:
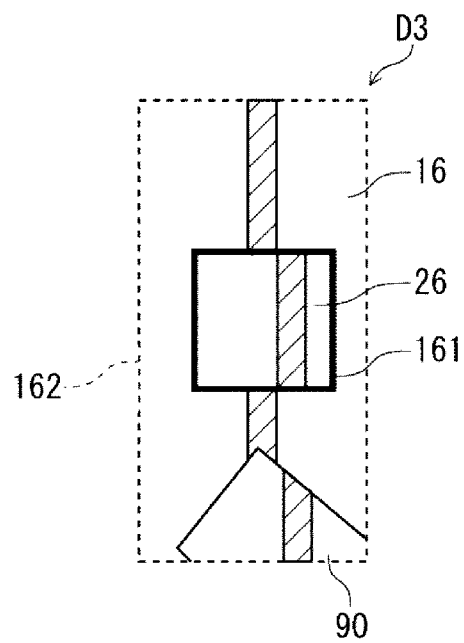
FIG. 23 is a view illustrating an image captured by an imaging section included in the third embodiment of the electronic component tester of the present invention.
Figure 23:
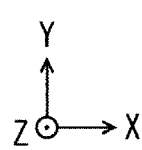
Figure 24:
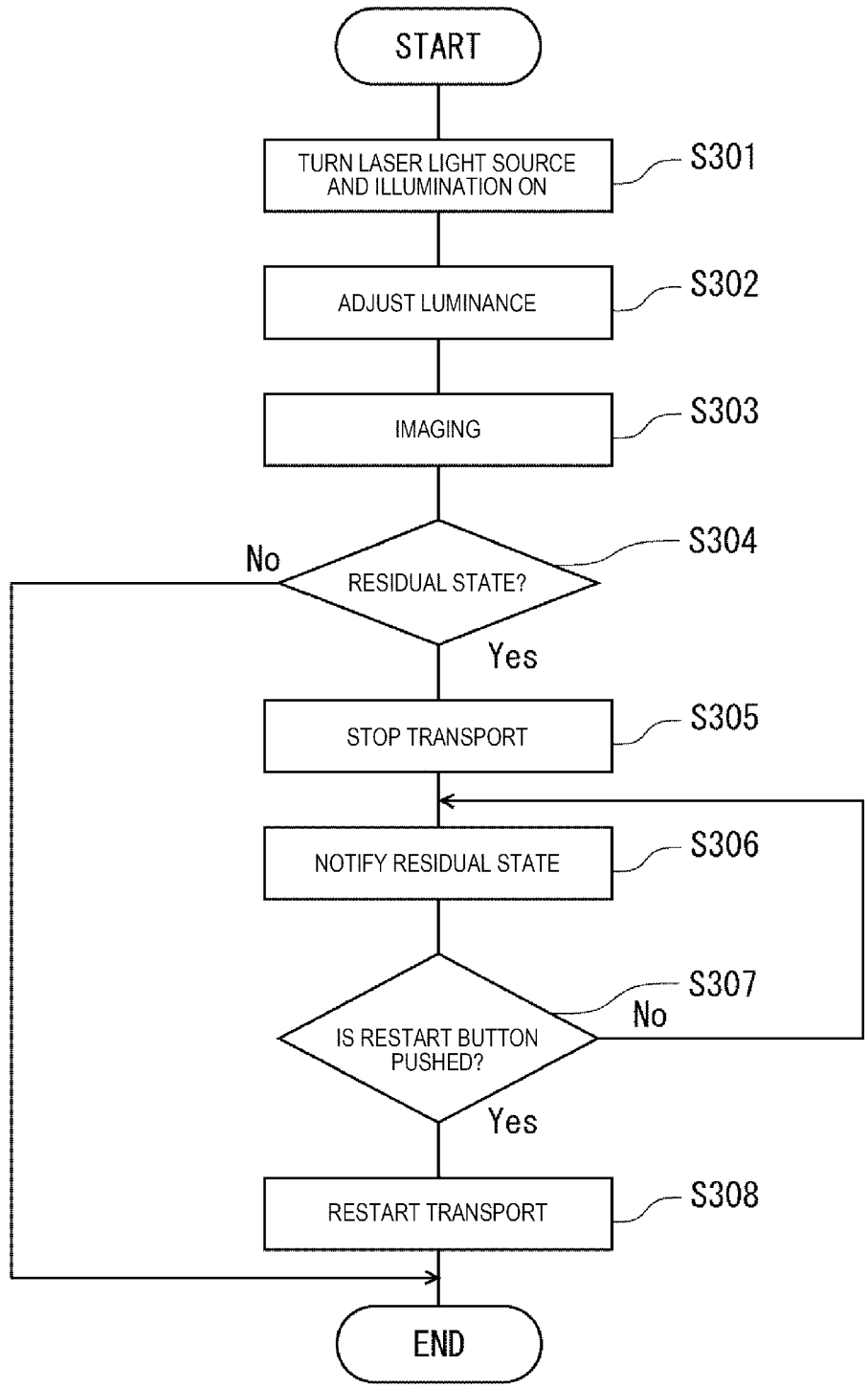
FIG. 24 is a flowchart illustrating a control operation of a control unit included in the third embodiment of the electronic component tester of the present invention.

In this adjusted state, in step S303, the camera 31 is used to image the image D3 illustrated in FIG. 23. This image D3 is larger than the images D1 and D2 illustrated in FIGS. 12 and 13, and is an image in which the peripheral portion of the recess 161 is also imaged.

Then, in step S304, it is determined whether the state is the residual state or the removal state. The determination in step S304 is performed similarly as in step S108 in the first embodiment and step S211 in the second embodiment. In step S304, even when the IC device 90 is unintentionally placed on the upper surface of the test unit as illustrated in FIG. 23, for example, this can be detected. In this embodiment, this case is also included in the residual state. In particular, when the IC device 90 is unintentionally placed on the upper surface of the test unit 16, the position of the line by the laser light L1 is shifted in the X direction on the upper surface of the IC device 90 in this embodiment. For that reason, it is possible to accurately detect that the IC device 90 is unintentionally placed on the upper surface of the test unit 16.

When it is determined in step S304 that the state is the residual state, the activation of the device transport head 17 is stopped in step S305, and the notification unit 24 notifies that it is in the residual state in step S306.

When it is determined in step S307 that the restart button has been pushed, the activation of the device transport head 17 is restarted in step S308.

Also in this embodiment, when it is determined in step S307 that the restart button has been pushed, it is preferable that the first determination and the second determination as in the first embodiment and the second embodiment are performed before step S308 is executed.

Fourth Embodiment

Hereinafter, a fourth embodiment of the electronic component handler and the electronic component tester of the present invention will be described with reference to FIG. 25, but the differences from the embodiments described above will be mainly described, the description of the same matters will be omitted.

This embodiment is the same as the first embodiment except that two cameras are provided.

Figure 25:
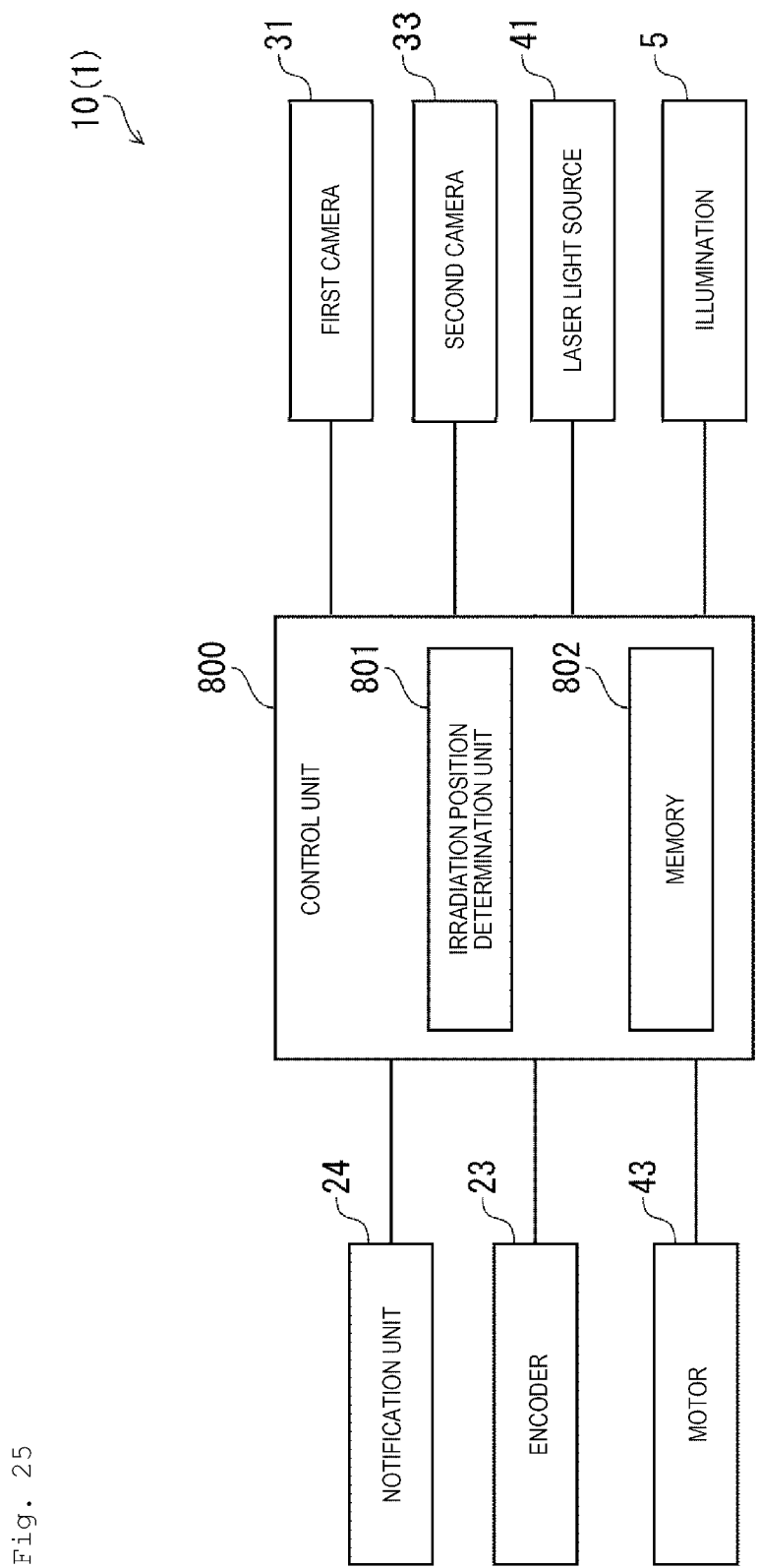
FIG. 25 is a block diagram of a fourth embodiment of the electronic component tester of the present invention.

As illustrated in FIG. 25, in this embodiment, the imaging section includes a camera 31 which is a first imaging section that captures images D1 and D2 which are the first images and a camera 33 which is a second imaging section that captures images D1' and D2' which are the second images. That is, in this embodiment, the imaging section is configured to include a dedicated camera 31 for capturing the images D1 and D2 and a dedicated camera 33 for capturing the images D1' and D2'. For that reason, the camera 31 can have relatively high resolution, and the camera 33 can have lower resolution than the camera 31. As a result, in the second determination, it is possible to shorten the time required for exchanging data between the control unit 800 and the camera 33.

Fifth Embodiment

Figure 26:
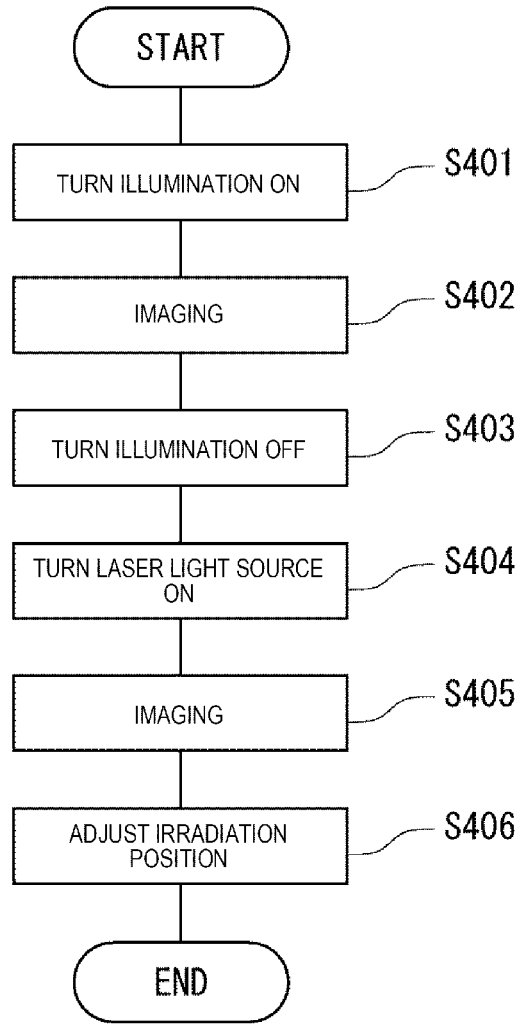
FIG. 26 is a flowchart illustrating a control operation of a control unit included in a fifth embodiment of the electronic component tester of the present invention.

Hereinafter, a fifth embodiment of the electronic component handler and the electronic component tester of the present invention will be described with reference to FIG. 26, but the differences from the embodiments described above will be mainly described, the description of the same matters will be omitted.

This embodiment is the same as the first embodiment except that the control operation of the control unit 800 is different.

Hereinafter, the control operation of the control unit 800 in this embodiment will be described with reference to the flowchart illustrated in FIG. 26, but the following control operation is a control operation performed prior to performing the test by transporting the IC device 90 to the test unit 16.

First, as illustrated in step S401, the illumination 5 is activated to emit the light L2. Then, the camera 31 images the test unit 16 (step S402). Next, in step S403, the illumination 5 is turned off.

Next, in step S404, the laser light source 41 is activated to irradiate the test unit 16 with the laser light L1, and in this state, the camera 31 images the test unit 16 (step S405).

Figure 27:
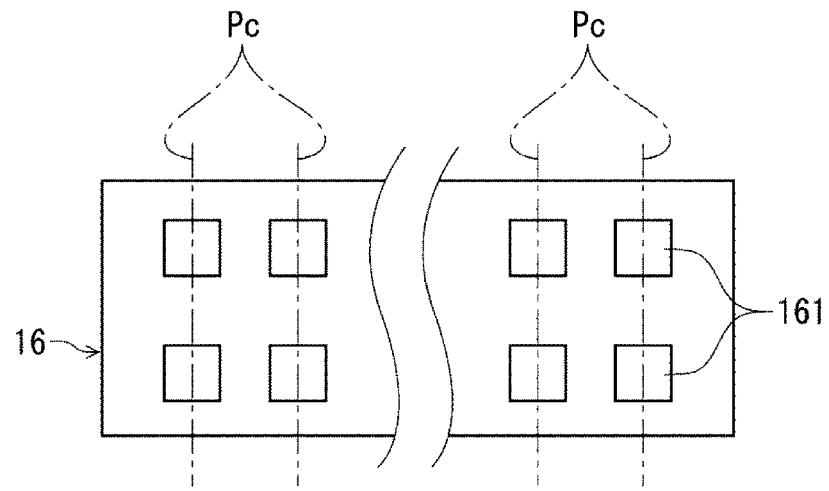
FIG. 27 is a view for explaining an adjustment procedure of an irradiation position of light in the fifth embodiment of the electronic component tester of the present invention.
Figure 28:
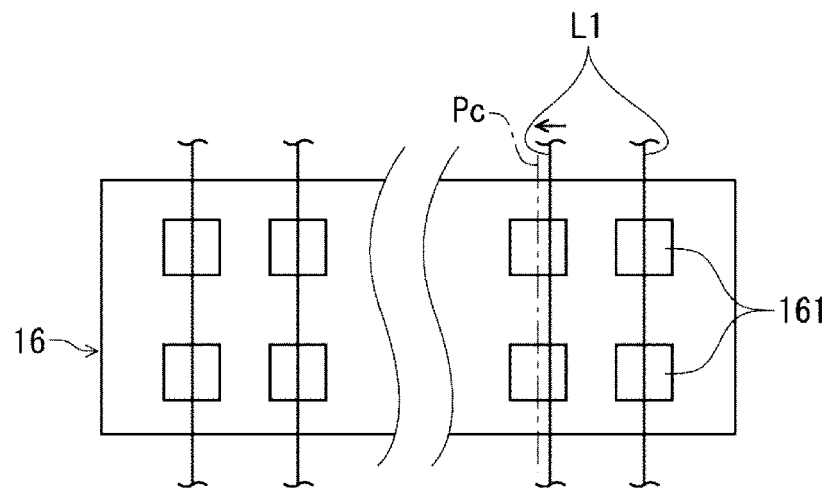
FIG. 28 is a view for explaining an adjustment procedure of the irradiation position of light in the fifth embodiment of the electronic component tester of the present invention.

Then, in step S406, the motor 43 of the mirror 42 is pivoted to adjust the irradiation position of the laser light L1. This adjustment is performed until the laser light L1 is positioned at the center position Pc in the image captured in step S405 (see FIG. 28) by indexing the center position Pc (see FIG. 27) in the image captured in step S402, and storing the coordinates of the center position Pc. With this configuration, the recess 161 can be more reliably irradiated with the laser light L1. In particular, the number and arrangement of the recesses 161 of the test unit 16 may be different for each test, and in this case, an image can be acquired in accordance with the position of the recess 161 of the test unit 16.

In this embodiment, the adjustment of the laser light L1 is performed based on the calibration curve between the pivot angle of the mirror 32 and the irradiation position of the laser light L1.

Sixth Embodiment

Hereinafter, a sixth embodiment of the electronic component handler and the electronic component tester of the present invention will be described with reference to FIG. 29, but the differences from the embodiments described above will be mainly described, the description of the same matters will be omitted.

This embodiment is the same as the fifth embodiment except that markers and a display portion are provided in the test unit.

Figure 29:
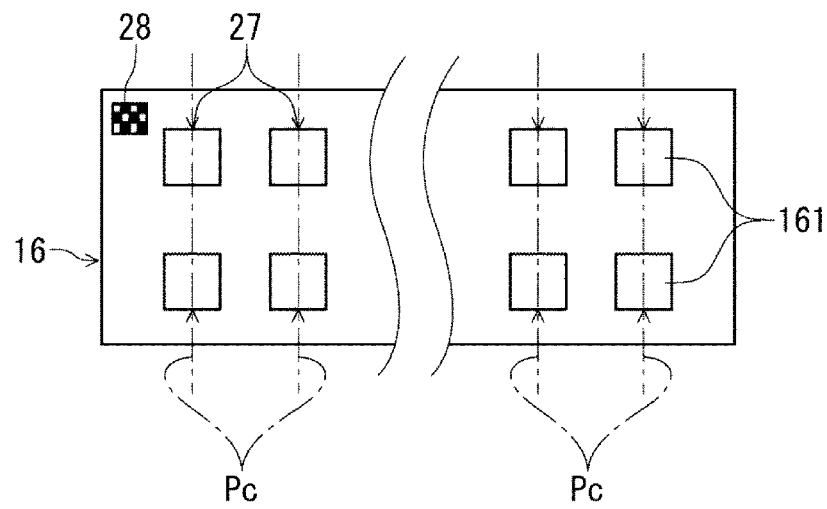
FIG. 29 is a plan view of a test unit included in a sixth embodiment of the electronic component tester of the present invention.

As illustrated in FIG. 29, in this embodiment, markers 27 and a display portion 28 are provided on the upper surface of the test unit 16.

Each marker 27 is provided at an edge portion of each recess 161 and indicates the center position Pc in the recess 161 in the X direction. By aligning the irradiation position of the laser light L1 in accordance with the marker 27, imaging in step S402 can be omitted. Therefore, it is possible to simplify an adjustment step of the irradiation position of the laser light L1.

The display portion 28 is composed of, for example, a two-dimensional barcode. It is possible to read the display portion 28 and to store the irradiation position of the laser light L1 and information of the display portion 28 in the memory 802 after the adjustment step of the irradiation position of the laser light L1 is completed. With this configuration, for example, even if the test unit 16 having different arrangement form of the recess 161 is used for each test, the irradiation position of the laser light L1 can be known by reading the display portion 28. That is, reproducibility of the irradiation position of the laser light L1 can be improved. Therefore, it is possible to easily adjust the irradiation position of the laser light L1.

Seventh Embodiment

Hereinafter, a seventh embodiment of the electronic component handler and the electronic component tester of the present invention will be described with reference to FIG. 30, but the differences from the embodiments described above will be mainly described, the description of the same matters will be omitted.

This embodiment is the same as the first embodiment except that the light emission timing is different.

In this embodiment, the laser light source 41 intermittently irradiates the laser light L1. That is, the laser light source 41 is configured to alternately repeat irradiation and stop of the laser light L1. Laser power in this embodiment is set according to IEC 60825-1:2014 and JISC 6802:2014. This ensures the safety of the operator. With this configuration, the safety of the operator is secured.

Figure 30:
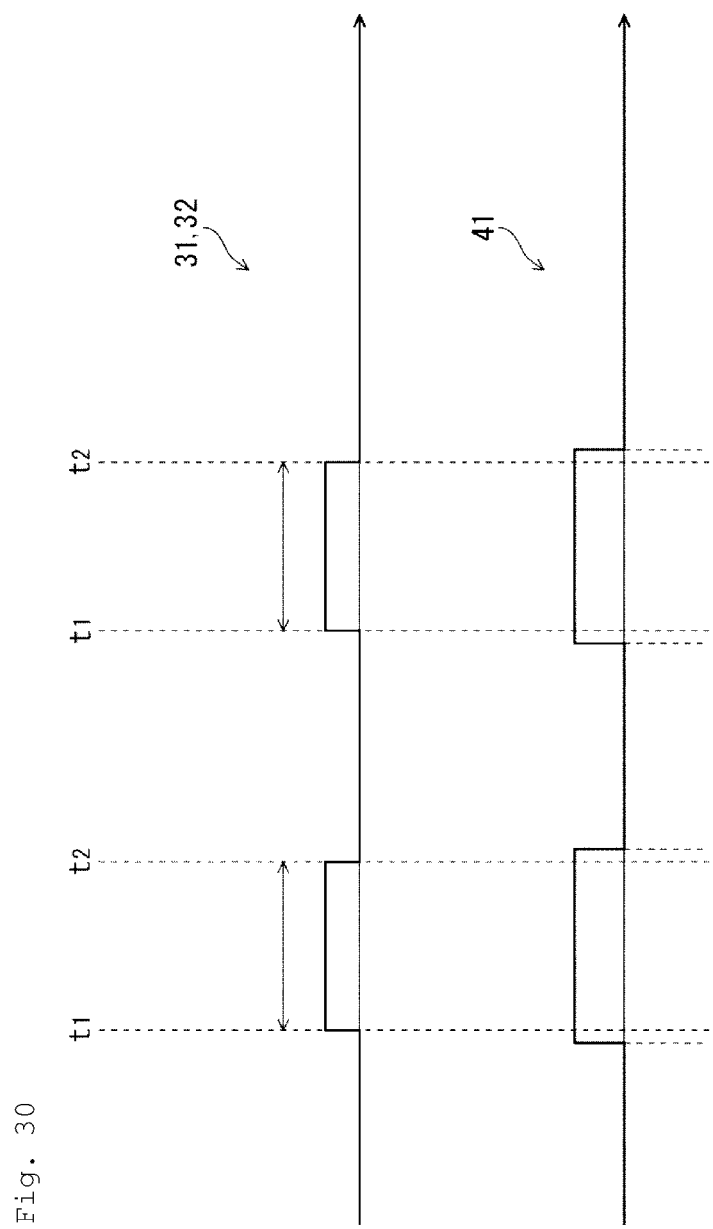
FIG. 30 is a timing chart of a light irradiation section and an imaging section in a seventh embodiment of the electronic component tester of the present invention.
Figure 31:
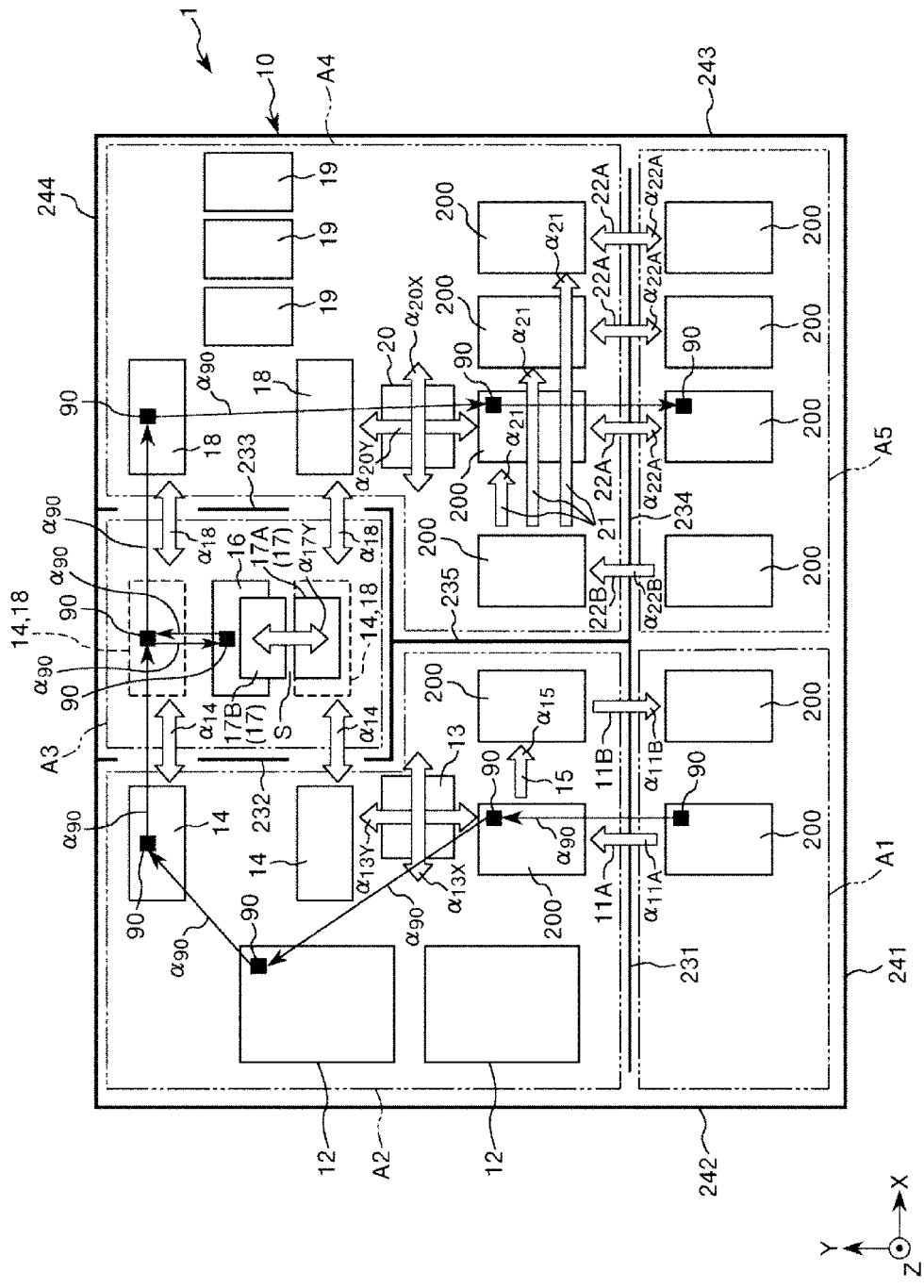
FIG. 31 is a schematic plan view illustrating the operation state of the electronic component tester illustrated in FIG. 1.

In a timing chart illustrated in FIG. 30, the upper chart in the figure illustrates the camera 31 and the lower chart in the figure illustrates the laser light source 41. As illustrated in FIG. 30, in this embodiment, the laser light source 41 which is the light irradiation section irradiates the laser light L1 earlier than the imaging start time t1 and stops the irradiation with the laser light L1 after the imaging end time t2. With this configuration, while the camera 31 is imaging, it is possible to set a state where the test unit 16 is irradiated with the laser light L1.

Furthermore, by adopting a configuration in which the laser light source 41 which is the light irradiation section irradiates the laser light L1 when imaging is possible, it is possible to prevent the test unit 16 from being imaged when the test unit 16 is shielded by the device transport head 17. Therefore, imaging can be performed without waste.

Eighth Embodiment

Hereinafter, an eighth embodiment of the electronic component handler and the electronic component tester of the present invention will be described with reference to FIGS. 1 to 20, but the differences from the embodiments described above will be mainly described, the description of the same matters will be omitted.

In this embodiment, the electronic component handler is capable of arranging the test unit (electronic component placement portion) 16 on which the IC device (electronic component) 90 can be placed and includes the laser light source 41 arranged so as to be capable of irradiating the test unit (electronic component placement portion) 16 with light L2 and capable of irradiating the IC device 90 placed on the test unit 16 with the light L2 and the camera 31 as an imaging section capable of imaging the test unit 16 irradiated with the light L2. It is determined whether or not the IC device 90 is arranged in the test unit 16, based on at least one of the first image obtained by imaging the test unit 16 by emitting light having the first luminance by the laser light source 41 and a second image obtained by imaging the test unit 16 by emitting light having the second luminance smaller than the first luminance by the laser light source 41.

With this configuration, after the operation of transporting the IC device 90 to the electronic component placement portion 16, it is possible to detect whether or not the IC device 90 remains on the electronic component placement portion 16. In particular, since it is determined whether or not the IC device 90 remains on the electronic component placement portion 16 based on at least one of the two images captured by irradiating the light L2 having different luminance, the determination can be performed more accurately.

In this embodiment, the electronic component tester 1 is capable of arranging the test unit (electronic component placement portion) 16 on which the IC device (electronic component) 90 can be placed and includes the laser light source 41 arranged so as to be capable of irradiating the test unit (electronic component placement portion) 16 with light L2 and capable of irradiating the IC device 90 placed on the test unit 16 with the light, the camera 31 as an imaging section capable of imaging the test unit 16 irradiated with the light L2, and the test unit 16 that tests the IC device 90. It is determined whether or not the IC device 90 is arranged in the test unit 16, based on at least one of the first image obtained by imaging the test unit 16 by emitting light having the first luminance by the laser light source 41 and a second image obtained by imaging the test unit 16 by emitting light having the second luminance smaller than the first luminance by the laser light source 41.

With this configuration, the electronic component tester 1 having the advantage of the electronic component handler 10 described above is obtained. The IC device 90 can be transported to the test unit 16, so that the test of the IC device 90 can be performed by the test unit 16. Further, the IC device 90 after the test can be transported from the test unit 16.

Ninth Embodiment

Hereinafter, a ninth embodiment of the electronic component handler and the electronic component tester of the present invention will be described with reference to FIGS. 1, 8 to 10, 12 to 19, 31 to 37, and 53 to 55, but the differences from the embodiments described above will be mainly described, the description of the same matters will be omitted. In the following description, the upper side in FIGS. 32 to 37 and 53 is referred to as "upper" or "above" and the lower side is referred to as "lower" or "below" for convenience of explanation. In particular, since the first direction and the second direction are orthogonal to each other, it is possible to easily perform a control operation of activating each unit of the electronic component handler 10.

The electronic component handler 10 of this embodiment includes the device transport head (first hold portion) 17A that is movable in the Z direction (first direction) and the Y direction (second direction) different from the Z direction and is capable of holding the IC device 90, the device transport head (second hold portion) 17B that is arranged in in the Y direction (the second direction) with respect to the device transport head (first hold portion) 17A, is movable in the Z direction (first direction) and the Y direction (second direction), and is capable of holding the IC device 90, the first camera (first imaging section) 31 that is capable of imaging the test unit (electronic component placement portion) 16 on which the IC device 90 can be placed, and the second camera (second imaging section) 33 that is arranged in the Y direction (second direction) with respect to the first camera (first imaging section) 31 and is capable of imaging the test unit 16. Further, the first camera (first imaging section) 31 is capable of capturing the image of the test unit 16 from between the device transport head 17A and the device transport head 17B, and the second camera (second imaging section) 33 is capable of capturing the image of the test unit 16 from between the device transport head 17A and the device transport head 17B.

With this configuration, the test unit 16 can be imaged from between the device transport head 17A and the device transport head 17B. Therefore, for example, it is possible to detect, based on these images, whether or not the IC device 90 remains on the test unit 16 after the operation of transporting the IC device 90 to the test unit 16 is performed.

The electronic component tester 1 of this embodiment includes the device transport head (first hold portion) 17A that is movable in the Z direction (first direction) and the Y direction (second direction) different from the Z direction and is capable of holding the IC device 90, the device transport head (second hold portion) 17B that is arranged in in the Y direction (second direction) with respect to the device transport head (first hold portion) 17A, is movable in the Z direction (first direction) and the Y direction (second direction), and is capable of holding the IC device 90, the first camera (first imaging section) 31 that is capable of imaging the test unit (electronic component placement portion) 16 on which the IC device 90 can be placed, the second camera (second imaging section) 33 that is arranged in the Y direction (second direction) with respect to the first camera (first imaging section) 31 and is capable of imaging the test unit 16, and the test unit 16 that tests the IC device 90. Further, the first camera (first imaging section) 31 is capable of capturing the image of the test unit 16 from between the device transport head 17A and the device transport head 17B, and the second camera (second imaging section) 33 is capable of capturing the image of the test unit 16 from between the device transport head 17A and the device transport head 17B.

With this configuration, the electronic component tester 1 having the advantage of the electronic component handler 10 described above is obtained. The IC device 90 can be transported to the test unit 16, so that the test of the IC device 90 can be performed by the test unit 16. Further, the IC device 90 after the test can be transported from the test unit 16.

Hereinafter, the configuration of each unit will be described.

As illustrated in FIGS. 18 and 19, by configuring the device transport head 17A and the device transport head 17B to move independently in the Z direction, it is possible to prevent both the device transport head 17A and the device transport head 17B from descending and an image-capturable area of a first camera 31 and a second camera 33 described later from becoming small.

As illustrated in FIG. 1, the electronic component handler 10 includes the encoder 23 as a position detection unit that detects positions of the device transport head 17A as the first hold portion or the device transport head 17B as the second hold portion. In this embodiment, the encoder 23 detects the positions of each of the device transport head 17A and the device transport head 17B in the Y direction and the Z direction. With this configuration, as will be described later, for example, the positions of the device transport head 17A and the device transport head 17B can be detected when the first camera 31 and the second camera 33 are capable of imaging the test unit 16. As illustrated in FIG. 25, the encoder 23 is electrically connected to the control unit 800, and position information of the device transport head 17A and the device transport head 17B is transmitted to the control unit 800.

Figure 36:
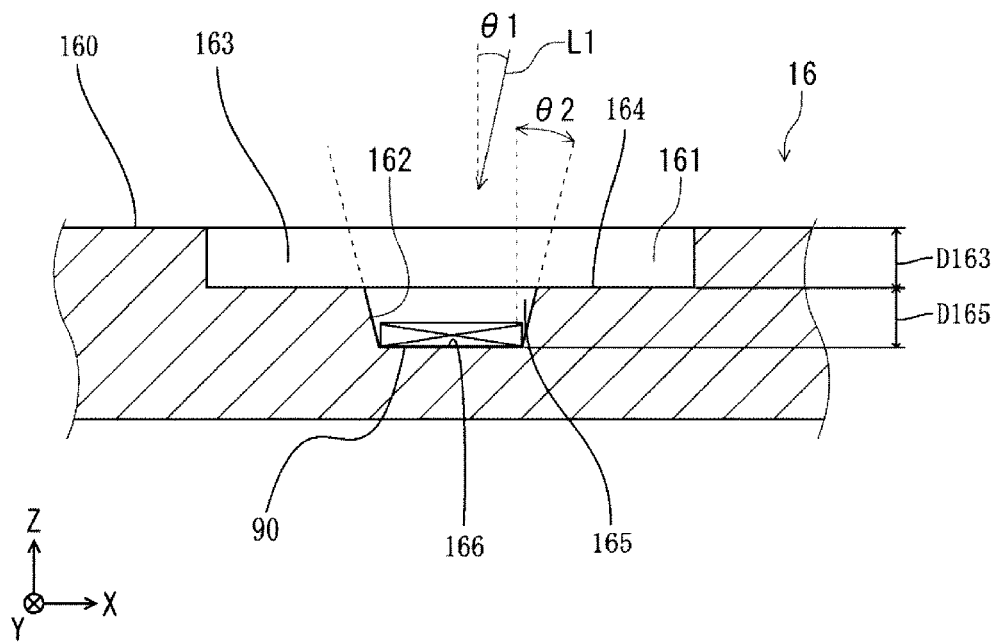
FIG. 36 is an enlarged cross-sectional view of the test unit included in the electronic component tester.

As illustrated in FIG. 36, the recess 161 has a stepped structure and includes a first recess 163 and a second recess 165 provided in the bottom portion 164 of the first recess 163. The second recess 165 has a tapered shape for guiding the IC device 90 when the IC device 90 is placed. That is, the inner circumferential surface 162 of the second recess 165 is inclined with respect to the X direction which is the third direction.

A depth D163 (distance from the upper surface 160 of the test unit 16 to the bottom portion 164) of the first recess 163 is preferably 3 mm or more and 7 mm or less, and more preferably 4 mm or more and 6 mm or less. With this configuration, even when an inclination angle of the laser light L1 with respect to the X direction is relatively small, the laser light L1 can reach the bottom portion 166 of the second recess 165. As a result, it is possible to detect whether or not the IC device 90 remains within the recess 161 as described later.

A depth D165 (distance from the bottom portion 164 to the bottom portion 166) of the second recess 165 is preferably 3 mm or more and 7 mm or less, and more preferably 4 mm or more and 6 mm or less. With this configuration, even when the inclination angle of the laser light L1 with respect to the X direction is relatively small, the laser light L1 can reach the bottom portion 166 of the second recess 165. As a result, it is possible to detect whether or not the IC device 90 remains within the recess 161 as described later.

The angle θ2 between the inner circumferential surface 162 of the recess 161 and the Z direction is preferably 20 degrees or more and 30 degrees or less, and more preferably degrees or more and 27 degrees or less, particularly preferably 25 degrees. With this configuration, even when the inclination angle of the laser light L1 with respect to the X direction is relatively small, the laser light L1 can reach the bottom portion 166 of the second recess 165. As a result, it is possible to detect whether or not the IC device 90 remains within the recess 161 as described later.

A plurality of probe pins (not illustrated) electrically connected to terminals (not illustrated) of the IC device 90 are provided in the bottom portion 166 of the second recess 165. Then, the IC device 90 can be tested by electrically connecting the end of the IC device 90 to the probe pin, that is, by being brought into contact with each other. The test of the IC device 90 is performed based on a program stored in the test control unit included in the tester connected to the test unit 16. Similar to the temperature adjustment unit 12, even in the test unit 16, it is possible to adjust the IC device 90 to a temperature suitable for test by heating or cooling the IC device 90.

Here, the IC device 90 has a flat plate shape in this embodiment and forms a rectangle in a plan view. As the size of the IC device 90 in a plan view is larger, it becomes easier to detect the presence or absence of the IC device 90. However, in the present invention, even if the size of the IC device 90 in a plan view is relatively small, the presence or absence of the IC device 90 can be accurately detected, and the effect of the present invention becomes more remarkable as compared with the related art. As a specific minimum value of the IC device 90, when the shape of the IC device 90 in a plan view is a square, although it depends on a width of an irradiation shape (line) of the laser light L1, if the length of each side is 1 mm or more and 3 mm or less, the effect of the present invention can be remarkably obtained. If it is 1.5 mm or more and 2.5 mm or less, the effect of the present invention can be more remarkably obtained, and if it is 2.0 mm, the effect of the present invention can be particularly remarkably obtained. When the shape of the IC device 90 in a plan view is a rectangle, although it depends on the width of the irradiation shape (line) of the laser light L1, if the length of a short side is 1 mm or more and 3 mm or less, the effect of the present invention can be remarkably obtained. When it is 1.5 mm or more and 2.5 mm or less, the effect of the present invention can be more remarkably obtained, and if it is 2.0 mm, the effect of the present invention can be particularly remarkably obtained. As such, by using a comparatively small IC device 90, the effect of the present invention can be more remarkably obtained. As described above, it goes without saying that it becomes easier to detect the presence or absence of the IC device 90 as the size of the IC device 90 in a plan view is larger.

The constituent material of the terminal of the IC device 90 is preferably a metallic material such as aluminum, copper or the like. The upper surface (surface opposite to the surface on which the terminals are formed) of the IC device 90 is, for example, made of resin, and surface roughness Ra is preferably 7 μm or more, and more preferably 10 μm or more. With this configuration, the irradiation shape of the laser light L1 becomes clearer so that it can be more accurately detected whether or not the IC device 90 remains in the recess 161.

The control unit 800 may be a central processing unit (CPU), a micro processing unit (MPU), or a field programmable gate array (FPGA) external to a personal computer (PC). Further, the control unit 800 may be a central processing unit (CPU), a micro processing unit (MPU), or a field programmable gate array (FPGA) built in the imaging section.

Figure 32:
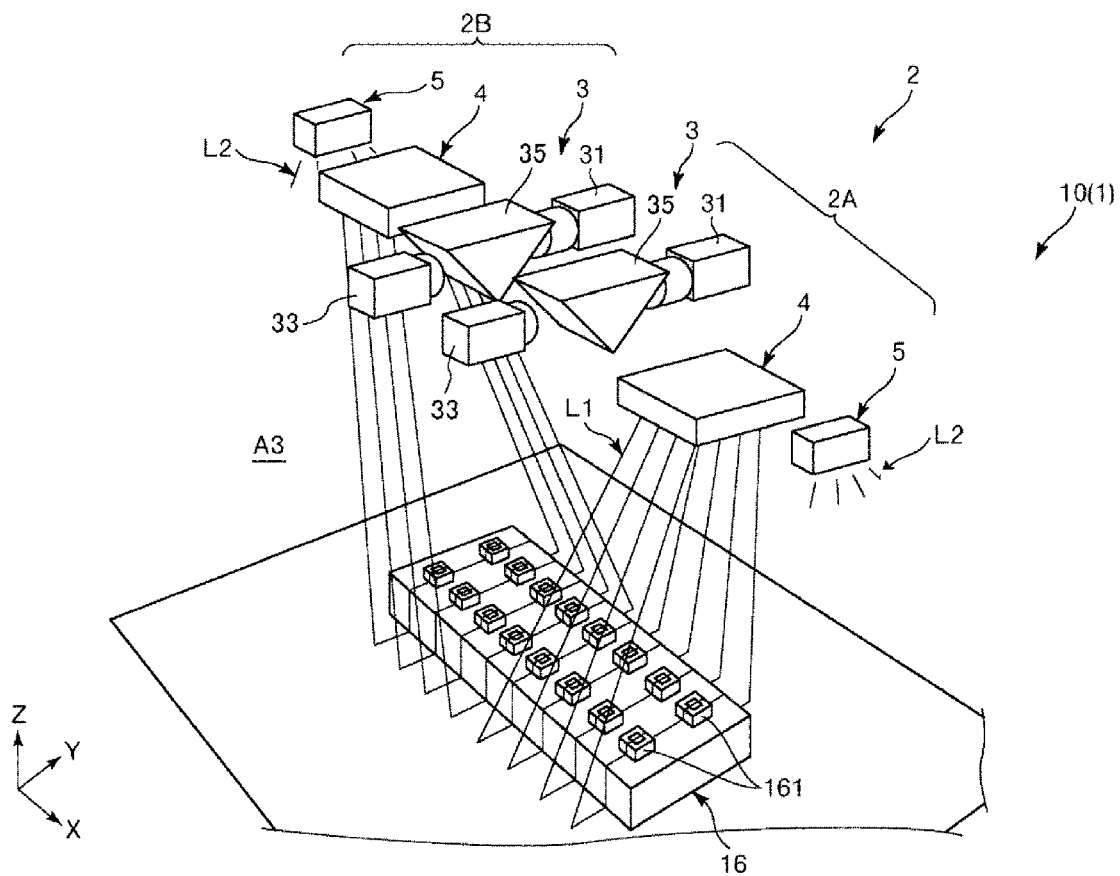
FIG. 32 is a perspective view illustrating the test area of the electronic component tester illustrated in FIG. 1.
Figure 33:
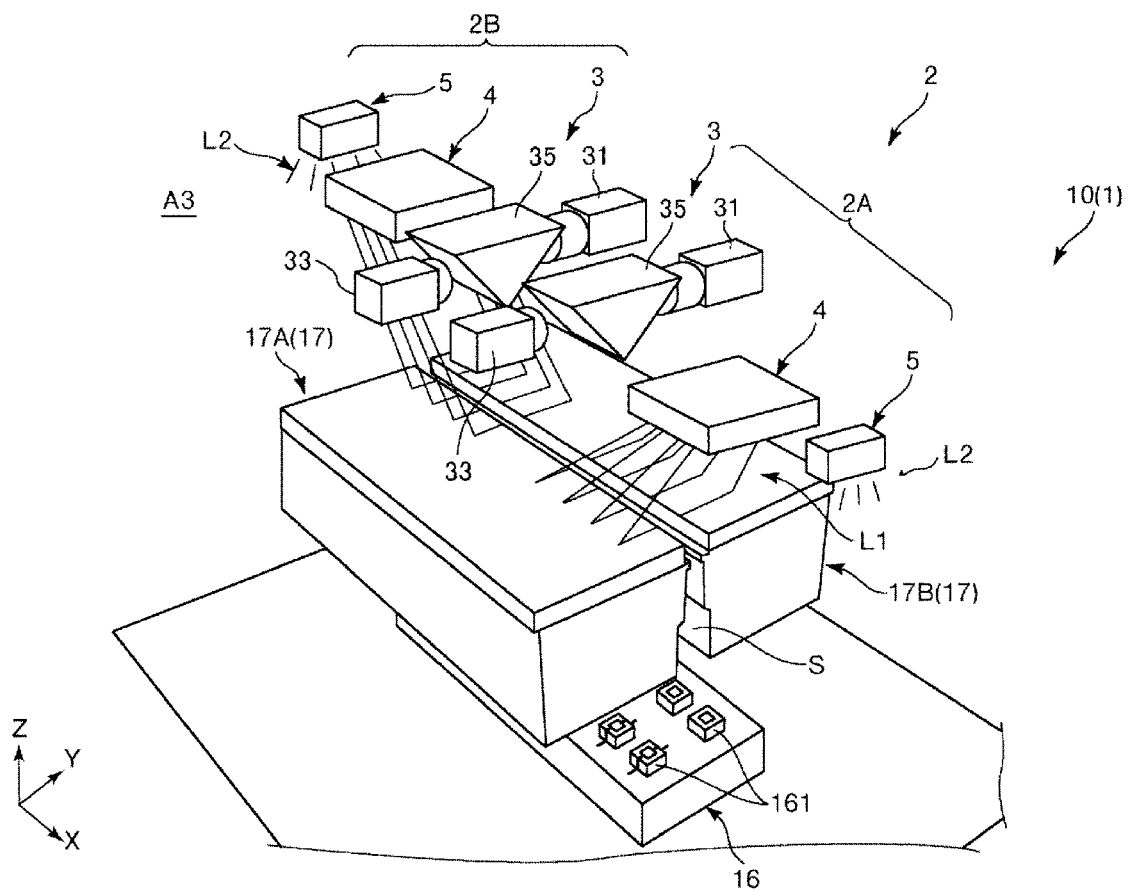
FIG. 33 is a perspective view illustrating the test area of the electronic component tester illustrated in FIG. 1, in which illustration of the device transport head is omitted.

Next, the detection unit 2 will be described. As illustrated in FIGS. 32 and 33, the detection unit 2 includes the detection unit 2A and the detection unit 2B. The detection unit 2A and the detection unit 2B are provided on the +Z side of the device transport head 17 (see FIG. 33) and are arranged in this order from the +X direction.

Each of the first detection unit 2A and the second detection unit 2B includes the imaging unit 3, the light irradiation unit 4, and the illumination 5. Since the first detection unit 2A and the second detection unit 2B have the same configuration except that the arrangement position of the imaging unit 3, the light irradiation unit 4, and the illumination 5 is line-symmetric with respect to the Y axis, the first detection unit 2A will be representatively described below.

Figure 34:
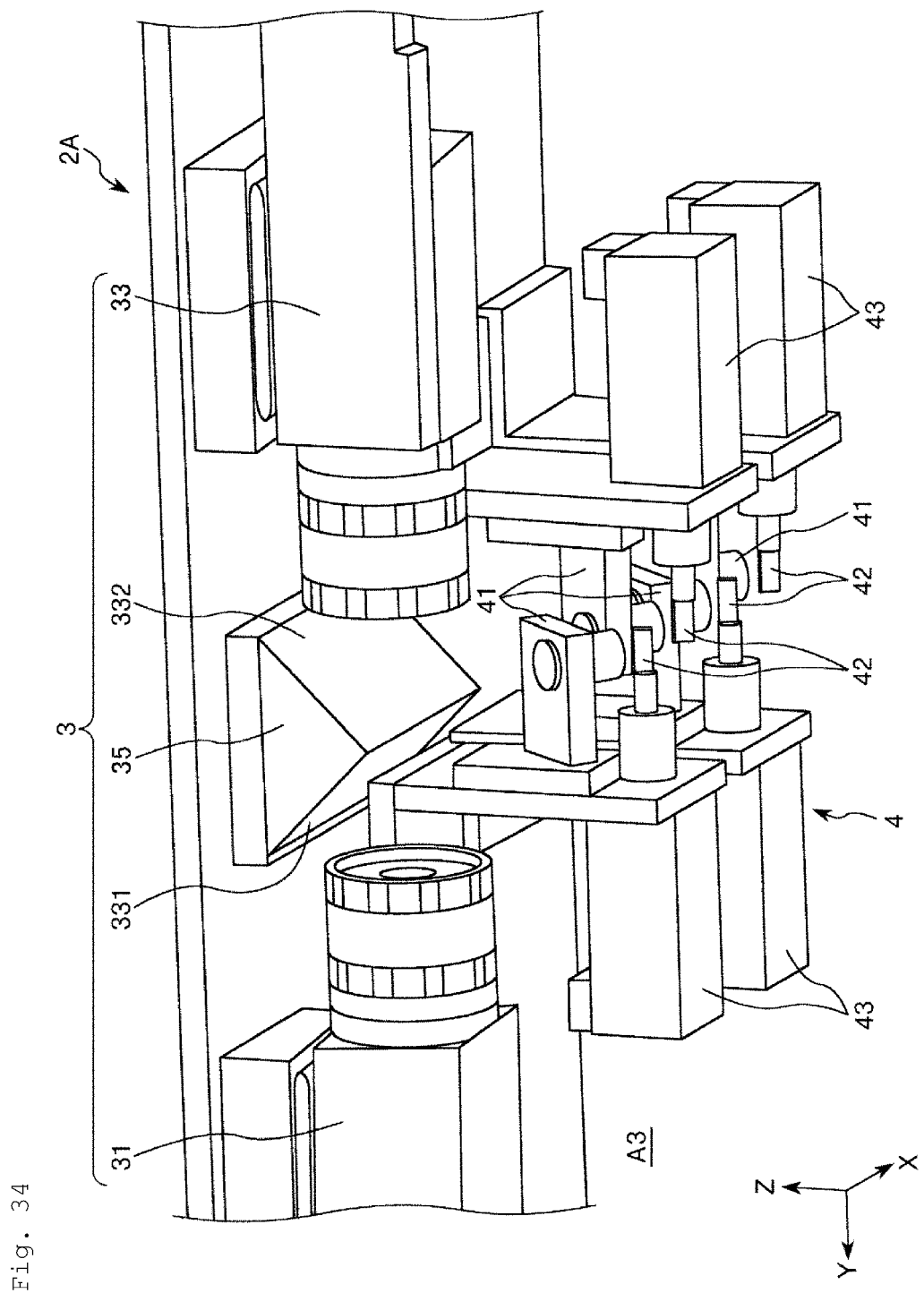
FIG. 34 is a perspective view of the detection unit included in the electronic component tester illustrated in FIG. 1.
Figure 35:
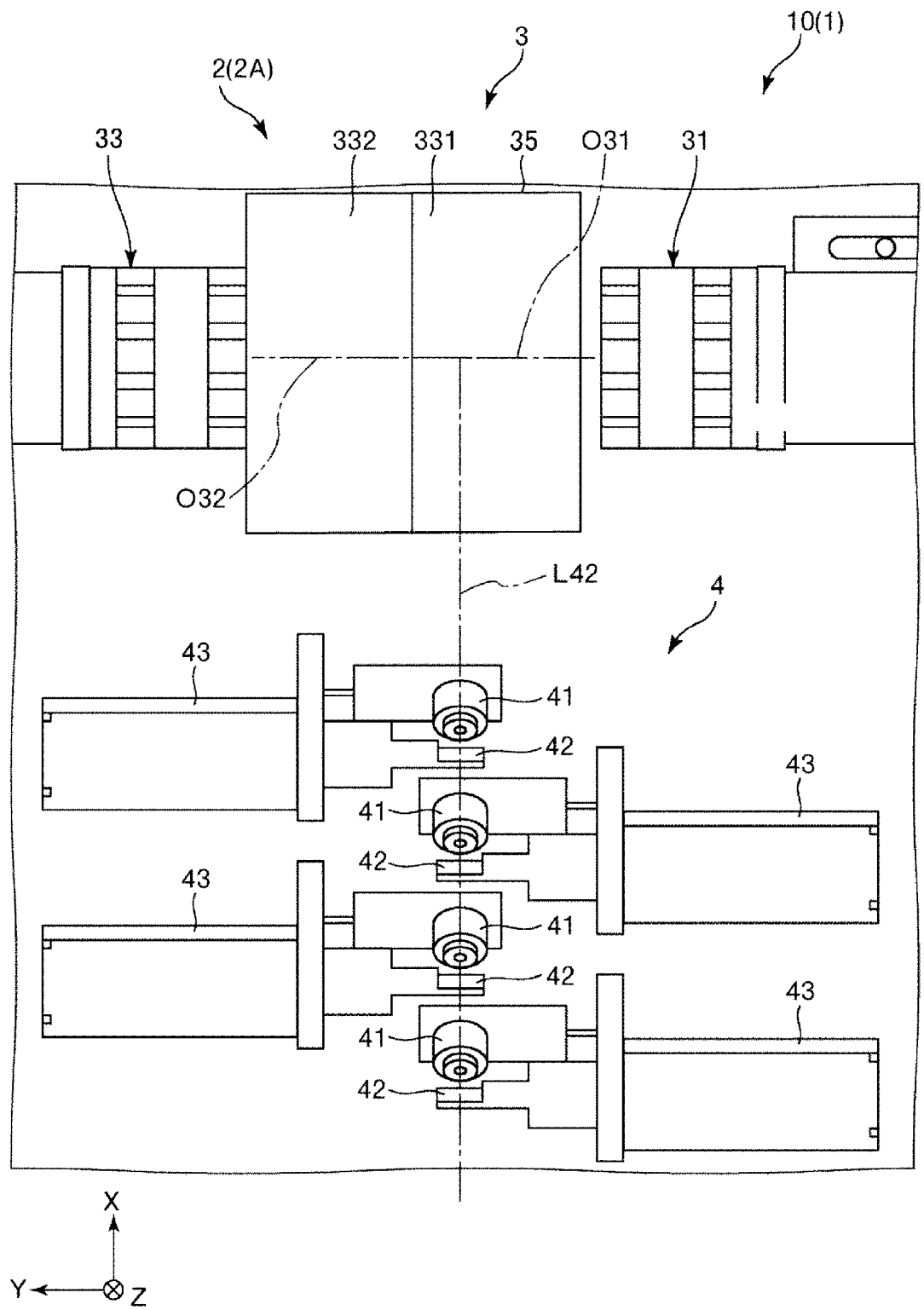
FIG. 35 is a view of the detection unit included in the electronic component tester illustrated in FIG. 1 when viewed from the bottom.

As illustrated in FIGS. 34 and 35, the imaging unit 3 includes the first camera (first imaging section) 31, the second camera (second imaging section) 33, and a light reflection portion 35.

For the first camera 31, for example, a charge coupled device (CCD) camera can be used. The first camera 31 is arranged facing the −Y direction and images the −Y side. As illustrated in FIG. 25, the first camera 31 is electrically connected to the control unit 800, and its activation is controlled.

The second camera 33 can have the same configuration as the first camera 31. The second camera 33 is arranged facing the +Y direction, and images the +Y side. As illustrated in FIG. 25, the second camera 33 is electrically connected to the control unit 800, and its activation is controlled.

The light reflection portion 35 is provided between the first camera 31 and the second camera 33. The light reflection portion 35 reflects the image of the test unit 16 toward the first camera 31 and the second camera 33.

The light reflection portion 35 has a first light reflection surface (first light reflection portion) 331 for reflecting light and a second light reflection surface (second light reflection portion) 332 for reflecting light. The light reflection portion 35 is a member of a triangular prism of an isosceles triangle (in this embodiment, a right-angled isosceles triangle) when viewed from the X direction and arranged such that the vertex angle is positioned on the −Z side.

In the light reflection portion 35, the surface on the +Y side functions as the first light reflection surface 331 and the surface on the −Y side functions as the second light reflection surface 332.

The first light reflection surface 331 is provided between the first camera (first imaging section) 31 and the second camera (second imaging section) 33, and reflects the image of the test unit (electronic component placement portion) 16 toward the first camera 31. The first light reflection surface 331 allows the first camera 31 to capture the image of the test unit 16 from between the device transport head (first hold portion) 17A and the device transport head (second hold portion) 17B. The second light reflection surface 332 is provided between the second camera (second imaging section) 33 and the first light reflection surface 331, and reflects the image of the test unit (electronic component placement portion) 16 toward the second camera 33. The second light reflection surface 332 allows the second camera 33 to capture the image of the test unit 16 from between the device transport head (first hold portion) 17A and the device transport head (second hold portion) 17B. With this configuration, even if the gap S between the device transport head 17A and the device transport head 17B is relatively narrow, the first camera and the second camera 33 can image the test unit 16, respectively. The imaging direction of the first camera 31 and the second camera 33 in this specification is the Z direction.

Figure 37:
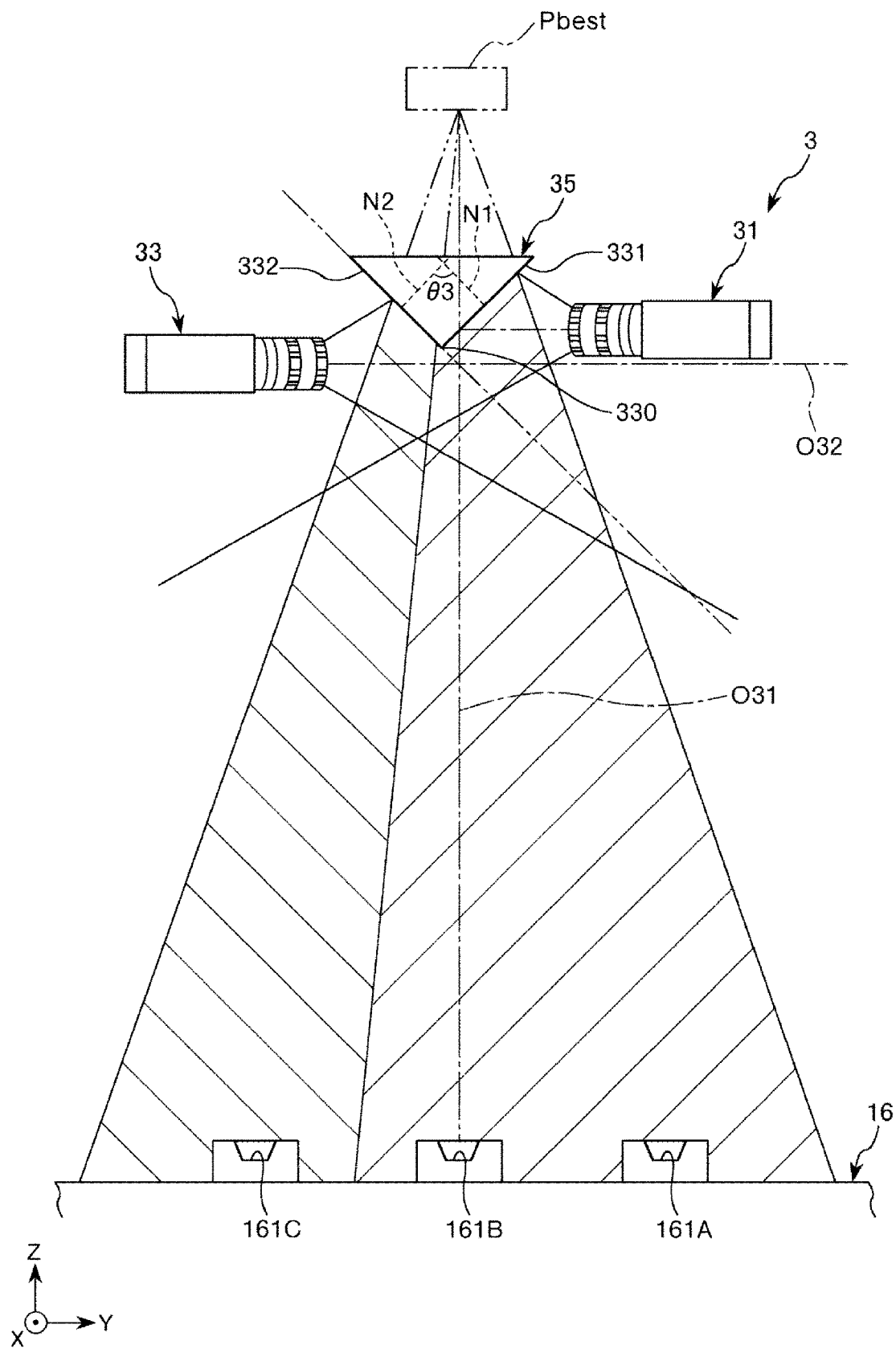
FIG. 37 is a side view of the imaging unit.

As illustrated in FIG. 37, the optical axis between the optical axis up to the first light reflection surface (first light reflection portion) 331 of the first camera (first imaging section) 31 and the optical axis of the second camera (second imaging section) 33 are along the Y direction (the second direction). That is, the optical axis up to the first light reflection surface (first light reflection portion) 331 of the first camera (first imaging section) 31 and the optical axis of the second camera (second imaging section) 33 are parallel. With this configuration, the first camera 31, the second camera 33, and the light reflection portion 35 can be easily installed.

The first camera (first imaging section) 31 and the second camera (second imaging section) 33 are opposite to each other in the direction in which light is incident. That is, the first camera 31 and the second camera 33 are arranged to face each other and image the opposite direction. With this configuration, even if the gap S between the device transport head 17A and the device transport head 17B is relatively narrow, by providing the light reflection portion 35 between the first camera 31 and the second camera 33, the first camera 31 and the second camera 33 can image the test unit 16, respectively.

With such a configuration, the first camera (first imaging section) 31 and the second camera (second imaging section) 33 can image the areas having different positions from each other in the test unit (electronic component placement portion) 16. Therefore, it is possible to image more areas of the test unit 16.

As illustrated in FIG. 35, the first camera 31, which is the first imaging section, is arranged such that its optical axis O31 intersects an extension line L42 in the direction (X direction) in which the mirrors 42 which are light reflection portions described later are arranged. With this configuration, the first camera 31 can image the portion of the test unit 16 irradiated with the laser light L1 reflected by each mirror 42.

The light irradiation unit 4 includes four laser light sources (light irradiation sections) 41, four mirrors 42 provided corresponding to the respective laser light sources 41 and reflecting the laser light L1 emitted from the laser light source 41, and four motors 43 for pivoting the respective mirrors 42. That is, in the light irradiation unit 4, a plurality (four) of laser light sources 41, which are light irradiation sections, and mirrors 42, which are light reflection portions, are provided.

As the laser light source 41, a known laser light source can be used, and the color of the laser light L1 to be emitted is not particularly limited. The laser light source 41 as the light irradiation section irradiates linear laser light (light) L1 whose irradiation shape at the irradiation destination (the test unit 16 or the IC device 90 on the test unit 16) extends in the Y direction (second direction)). With this configuration, as will be described later, it is possible to make the change in the position of the irradiated laser light L1 easier to understand in accordance with the presence or absence of the IC device 90 in the images captured by the first camera 31 and the second camera 33. Therefore, it is possible to detect more accurately whether or not the IC device 90 remains on the test unit 16.

As illustrated in FIGS. 32 and 33, the laser light L1 irradiated by the laser light source 41 is configured so as to cover two recesses 161 aligned in the Y direction at the test unit 16 for the irradiation destination. That is, one laser light source 41 collectively irradiates two recesses 161 aligned in the Y direction with the laser light L1. Four (multiple) laser light sources (light irradiation sections) 41 are provided and arranged along the X direction, which is the third direction, so that it is possible to irradiate the eight recesses 161 with the laser light L1 by the four laser light sources 41. The total of eight laser light sources 41 are provided in the detection unit 2A and the detection unit 2B, thereby capable of irradiating each of the sixteen recesses 161 with the laser light L1.

As illustrated in FIGS. 34 and 35, the light irradiation unit 4 includes the mirrors 42 as a light reflection portion for reflecting the laser light L1 emitted from the laser light source 41 which is the light irradiation section. With this configuration, the laser light source 41 can be arranged regardless of the direction of the laser light source 41. Therefore, the degree of freedom of arrangement of the laser light source 41 can be increased.

As such, in the electronic component handler 10, since the direction of the laser light L1 to be emitted by the laser light source 41 as the light irradiation section can be adjusted, it is possible to adjust the irradiation position of the laser beam L1 at the test unit 16 or to cope with the test unit in which the arrangement position of the recess 161 is different from the configuration illustrated in FIGS. 32 and 33.

According to such a detection unit 2, it is possible to detect the presence or absence of the IC device 90 in the recess 161 of the test unit 16. Hereinafter, this principle will be described with reference to FIGS. 10, 12, 13, and 36, but since similar detection is performed in each recess 161, detection in one recess 161 will be representatively described. In the following description, one of the images of the recess 161 captured by the first camera 31 will be representatively described, but the same control can be performed on the image of the recess 161 captured by the second camera 33.

FIG. 10 is a view schematically illustrating the detection unit 2, and is a view of the detection unit 2 when viewed from the Y direction. In FIG. 10, the laser light L1 is emitted from the laser light source 41 toward the test unit 16. When the IC device 90 is placed on the test unit (hereinafter, this state is referred to as "residual state"), the position P1 on the IC device 90 is irradiated with the laser light L1, and a line of the laser light L1 having a linear irradiation shape is formed at this position P1. On the other hand, when the IC device 90 is not on the test unit 16 (hereinafter, this state is referred to as "removal state"), the position P2 of the bottom portion 166 of the second recess 165 of the test unit 16 is irradiated with the laser light L1, and the line of the laser light L1 having the linear irradiation shape is formed at this position P2. In the present specification, the "linear" refers to a single straight line, an aggregate of points spaced apart from each other and aligned in one direction, and an elongated shape such as an elliptical shape or a rectangular shape.

The first camera 31 captures an image (first image) in the residual state and the removal state, respectively. FIG. 12 illustrates a part of an image D1 captured by the first camera 31 in the residual state, and FIG. 13 illustrates a part of an image D2 captured by the first camera 31 in the removal state. In these images D1 and D2, necessary portions (portions in which the recess 161 appears) of the captured images are trimmed and used.

As illustrated in FIG. 12, in the image D1, the position P1 of the line of the laser light L1 on the IC device 90 is shifted to the −X side (left direction in the figure) of the position P of the line of the laser light L1 at the bottom portion 164 of the first recess 163. This is because the upper surface of the IC device 90 is lower than the bottom portion 164 of the first recess 163, that is, the upper surface of the IC device 90 is positioned on the −Z side. A shift amount in the X direction (left-and-right direction in the figure) between the position P and the position P1 is set as a shift amount ΔD1.

On the other hand, as illustrated in FIG. 13, in the image D2, the position P2 of the line of the laser light L1 on the bottom portion 166 of the second recess 165 is shifted to the −X side from the position P of the line of the laser light L1 at the bottom portion 164 of the first recess 163. This is because the bottom portion 166 of the second recess 165 is lower than the bottom portion 164 of the first recess 163, that is, the bottom portion of the recess is positioned on the −Z side. A shift amount in the X direction (left-and-right direction in the figure) between the position P and the position P2 is set as a shift amount ΔD2.

The shift amount ΔD1 is smaller than the shift amount ΔD2. This is because the upper surface of the IC device 90 is positioned on the +Z side of the bottom portion 166 of the second recess 165. In the electronic component handler 10, it is possible to detect (determine) whether it is the residual state or the removal state, depending on whether the shift amount in the images D1 and D2 is the shift amount ΔD1 or the shift amount ΔD2, for example.

Here, as the thickness Δd of the IC device 90 becomes thinner, the thinner the thickness Δd of the IC device 90 is, the smaller the difference between the shift amount ΔD1 and the shift amount ΔD2 becomes, and it is difficult to discriminate whether it is the shift amount ΔD1 or the shift amount ΔD2. Accordingly, in the relatively thin IC device 90, it is necessary to use a first camera 31 having relatively high resolution in order to determine whether it is a residual state or a removal state. Specifically, in FIG. 10, if the first camera 31 capable of recognizing an angle Δα between a line segment connecting the position P1 and the center (optical axis) of the first camera 31 and a line segment connecting the position P2 and the center (optical axis) of the first camera 31 is used, it can be determined whether it is a residual state or a removal state. For example, in order to know what degree of the angle Δα can be used to recognize the camera if the thickness Δd of the IC device 90 is known, and in order to know what degree of the determination can be performed in the IC device 90 having the thickness Δd if the resolution of the first camera 31 is known, the present inventors derived the two equations (1) and (2) described above.

When it is assumed that an angle formed by the line connecting the position P2 and the center (optical axis) of the first camera 31 and the X axis α, an angle formed by the optical axis of the laser light L1 and the X axis β, and the distance between the optical axis of the first camera 31 and the bottom portion 166 of the second recess 165 is $d_{cam}$, the thickness Δd of the IC device 90 can be pushed by the equation (1) and the angle Δα can be pushed by the equation (2).

Figure 53:
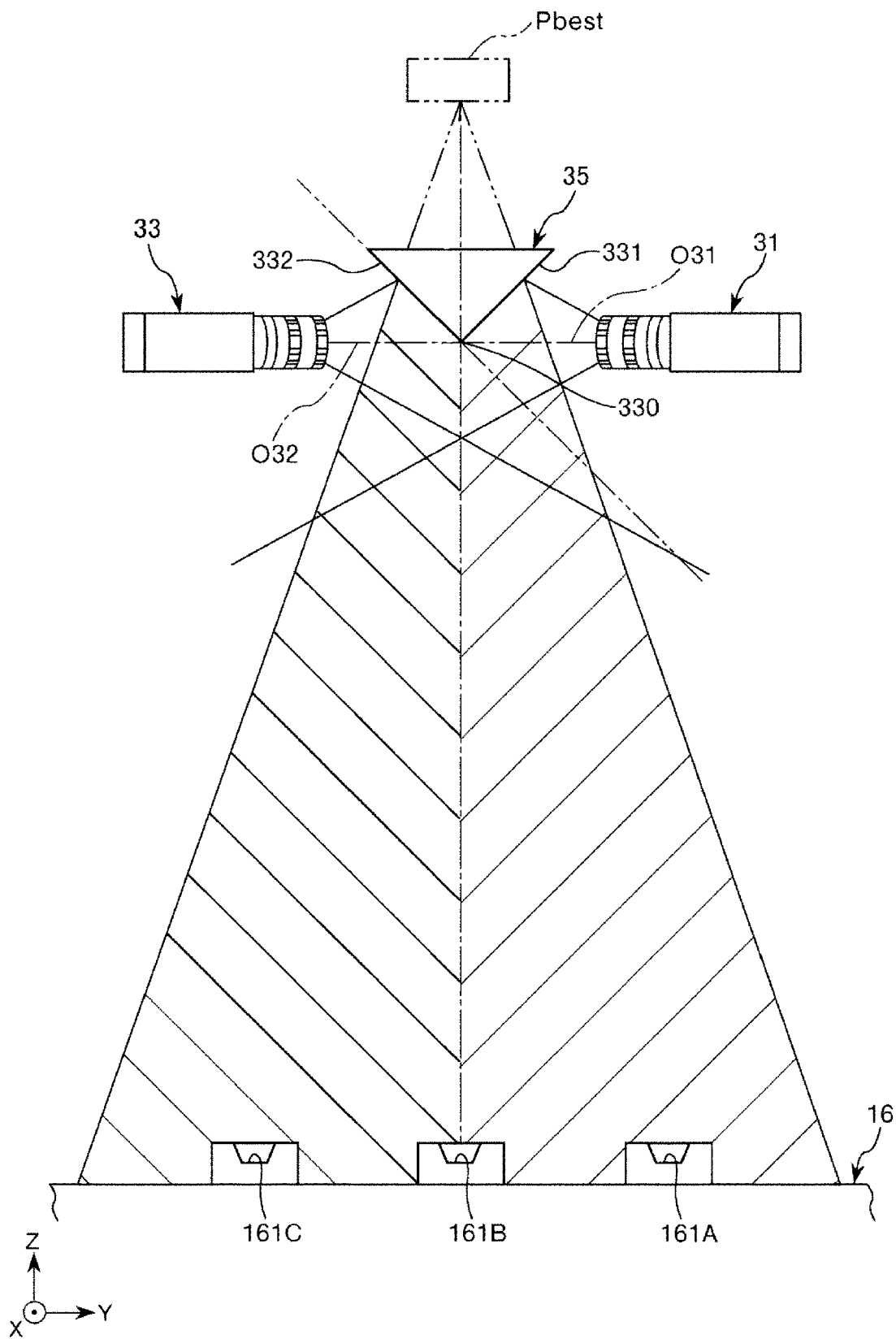
FIG. 53 is a side view of the imaging unit.

Here, the test unit 16 may be configured to be detachable and may be replaced with an optimum one according to the type of the IC device 90, in the electronic component handler 10. For that reason, in the test unit 16, there are cases where the arrangement position of the recess 161 and the number of arranged parts are different for each test unit 16. Hereinafter, as illustrated in FIGS. 37 and 53, the case where the recess 161 of the test unit 16 is provided in odd number rows (three rows in the illustrated configuration) in the Y direction will be described. FIGS. 37 and 53 are views of the test unit 16 when viewed from the −X direction. In these figures, respective recesses 161 are referred to as a recess 161A, a recess 161B, and a recess 161C in order from the +Y side. The following description can be applied to both the first determination and the second determination, and the first determination and the second determination are collectively referred to as a "determination".

In FIG. 53, a case where the first camera 31 and the second camera 33 are assumed to be arranged in a state where the optical axis O31 of the first camera 31 and the optical axis O32 of the second camera 33 coincident with each other and the light reflection portion 35 is assumed to be arranged in the middle between the first camera 31 and the second camera 33 is illustrated.

Figure 54:
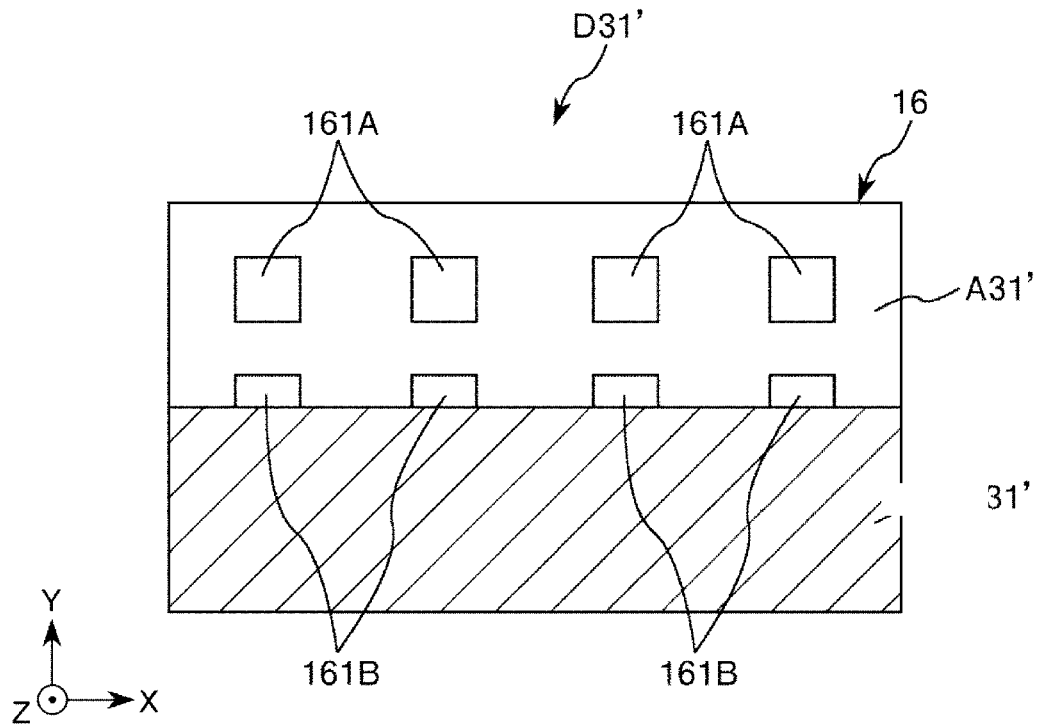
FIG. 54 is a view illustrating an image captured by a first imaging section of the imaging unit illustrated in FIG. 53.

In this case, as illustrated in FIG. 54, in the upper half in the figure of the image D31' captured by the first camera 31, the entire area of each recess 161A and a part (half) of each recess 161B appear. Further, in the lower half in the figure of the image D31' in the figure, an image on the −Y side than the light reflection portion 35 appears. In this image D31', the upper half area in the figure is a use area A31' used for determination and the lower half area in the figure is an unnecessary area a31' which becomes unnecessary in determination.

Figure 55:
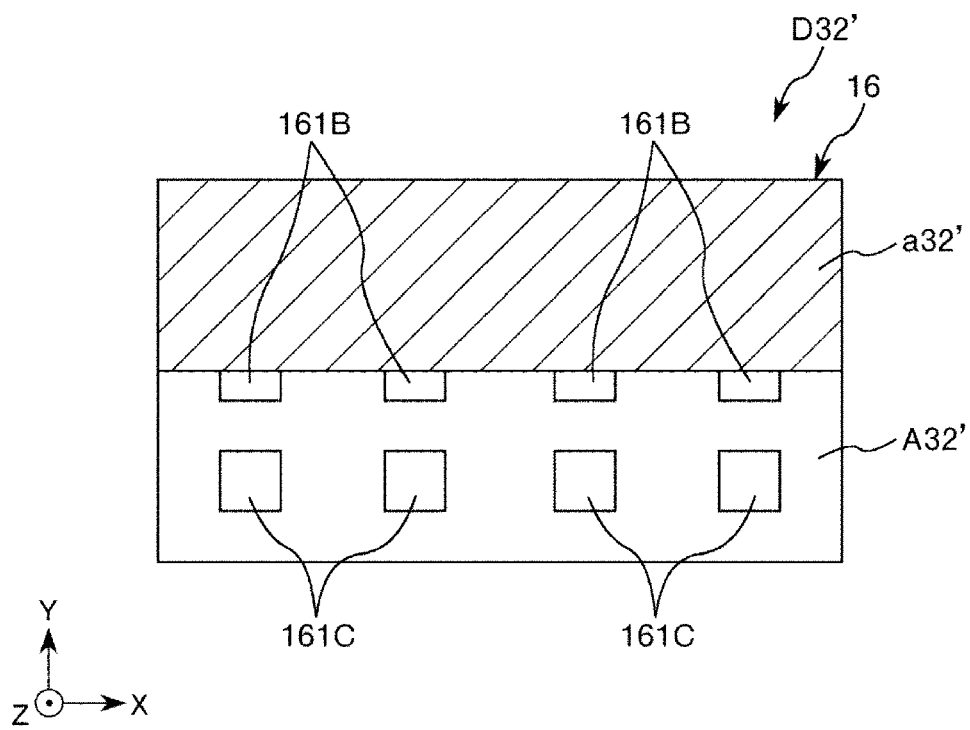
FIG. 55 is a view illustrating an image captured by a second imaging section of the imaging unit illustrated in FIG. 53.

On the other hand, as illustrated in FIG. 55, in the upper half of the image D32' captured by the second camera 33, an image on the +Y side than the light reflection portion 35 appears. In the lower half of the image D32' in the figure, a part (half) of the recess 161B and the entire area of the recess 161C appear. In this image D32', the upper half area in the figure is an unnecessary area a32' which becomes unnecessary in determination and the lower half area in the figure a use area A32' used for determination.

When a determination is performed based on such images D31' and D32', the determination in the recess 161A can be performed based on the image D31'. The determination in the recess 161C can be performed based on the image D32'.

Then, for example, it is possible to make a determination in the recess 161B based on an image obtained by connecting the image D31' and the image D32' together and connecting with the recess 161B. However, depending on the types of the first camera 31 and the second camera 33, the focus becomes blurred at the boundary between the use area A31' and the unnecessary area a32' and becomes unclear. That is, the portion of the captured image in which the recess 161B appears becomes unclear. When the recess 161B is determined based on this unclear image, reliability of the determination becomes poor. Therefore, in the electronic component handler 10, this problem can be solved by adopting the following configuration.

As illustrated in FIG. 37, in the electronic component handler 10, a vertex 330 of the light reflection portion 35 is arranged by being shifted to the −Y side from the center of the test unit 16 in the Y direction. Furthermore, the first camera 31 (first imaging section) and the second camera 33 (second imaging section) have different positions in the Z direction (first direction). That is, the installation height (position in the vertical direction) of the first camera 31 and the second camera 33 is different. In this embodiment, the first camera 31 is arranged at a position higher than the second camera 33, that is, on the +Z side. With such a configuration, the height of the first camera 31 with respect to the first light reflection surface 331 and the height of the second camera 33 with respect to the second light reflection surface 332 can be made different from each other. Therefore, it is possible to make the imaging position in the test unit 16 different in the area where the first camera 31 can image the test unit 16 through the first light reflection surface 331 and the area where the second camera 33 can image the test unit 16 through the second light reflection surface 332.

Figure 38:
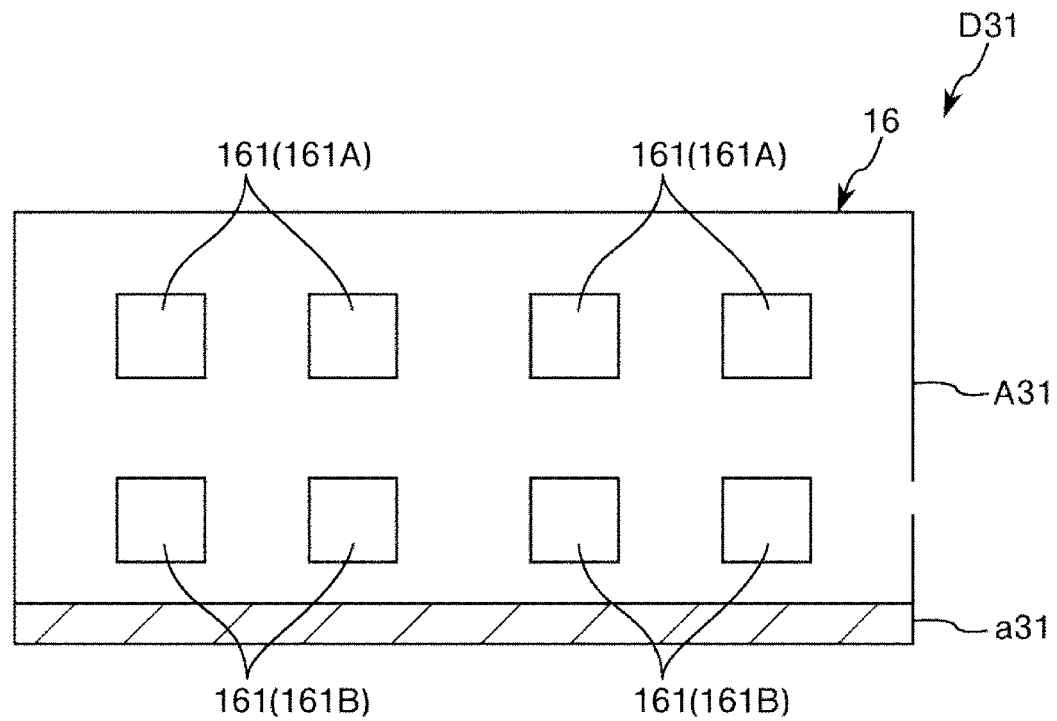
FIG. 38 is a view illustrating an image of the test unit captured by a first imaging section.
Figure 39:
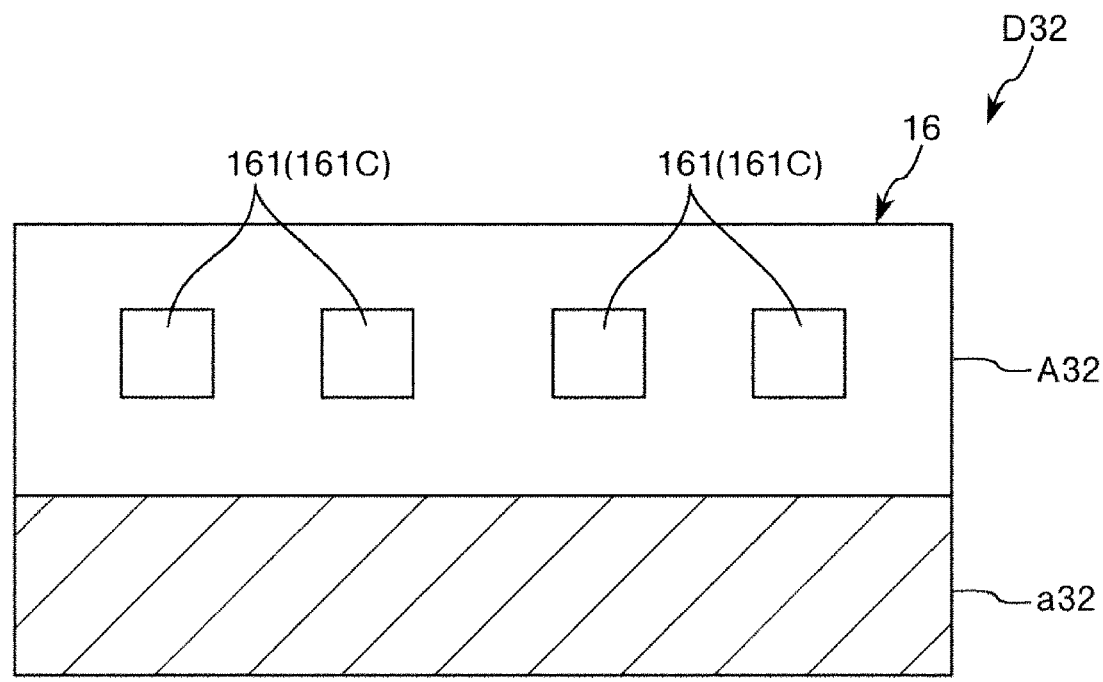
FIG. 39 is a view illustrating an image of the test unit captured by a second imaging section.

As illustrated in FIG. 38, the recess 161A and the recess 161B appear in the image D31 captured by the first camera 31. In the image D31, the recess 161A and the recess 161B appear in the use area A31, and the recess 161A and the recess 161B does not appear in the unnecessary area a31 on the lower side of the image D31. On the other hand, as illustrated in FIG. 39, the recess 161C appear in the image D32 captured by the second camera 33. In the image D32, the recess 161C appears in the use area A32, and the recess 161C does not appear in the unnecessary area a32 on the lower side of the image D32.

As such, in the electronic component handler 10, the first camera 31 is responsible for imaging the recess 161A and the recess 161B and the second camera 33 is responsible for imaging the recess 161C. With this configuration, it is possible to prevent degradation of image quality in the recess 161B as described above. Therefore, it is possible to accurately determine the presence or absence of the IC device 90 not only in the recess 161A and the recess 161C but also in the recess 161B.

As such, the area (first imaging area) imaged by the first camera (first imaging section) 31 in the test unit (electronic component placement portion) 16 and the area (second imaging area) imaged by the second camera (second imaging section) 33 in the test unit (electronic component placement portion) 16 are different in size. That is, the sizes of the use area A31 and the use area A32 are different. With this configuration, the position of the boundary between the first imaging area and the second imaging area can be shifted from the center portion of the test unit 16 in the Y direction. Therefore, it is also possible to accurately determine the presence or absence of the IC device 90 also in the recess 161B positioned at the center portion of the test unit 16 in the Y direction.

The optical axis O31 from the first light reflection surface (first light reflection portion) 331 to the test unit (electronic component placement portion) 16 of the first camera (first imaging section) 31 intersects the intersection point of the virtual plane including the second light reflection surface (light reflection portion) 332 and the optical axis O32 of the second camera (second imaging section) 33. With this configuration, as illustrated in FIG. 37, the angles for imaging by the first camera 31 and the second camera 33 can be the same. Furthermore, the angle for imaging by the first camera 31 and the second camera 33 can be made the same as the angle obtained when the imaging section is placed at an ideal position Pbest and imaging is performed.

As described above, since the space on the +Z side of the device transport head 17 is limited, it is difficult to arrange the imaging section at the ideal position Pbest. However, by arranging the first camera 31 and the second camera 33 along the Y direction and providing the light reflection portion 35, imaging for the test unit 16 can be performed while miniaturizing the apparatus.

As illustrated in FIG. 37, an angle θ3 between the normal line N1 of the first light reflection surface 331 and the normal line N2 of the second light reflection surface 332 is preferably 85 degrees or more and 95 degrees or less, and more preferably 88 degrees or more and 92 degrees or less. With this configuration, the vertex angle of the light reflection portion 35 when viewed from the X direction can be made substantially perpendicular, and when the first camera 31 and the second camera 33 are installed, it is sufficient to install the optical axis of the first camera 31 and the optical axis of the second camera 33 in parallel, and these cameras can be installed easily.

Figure 40:
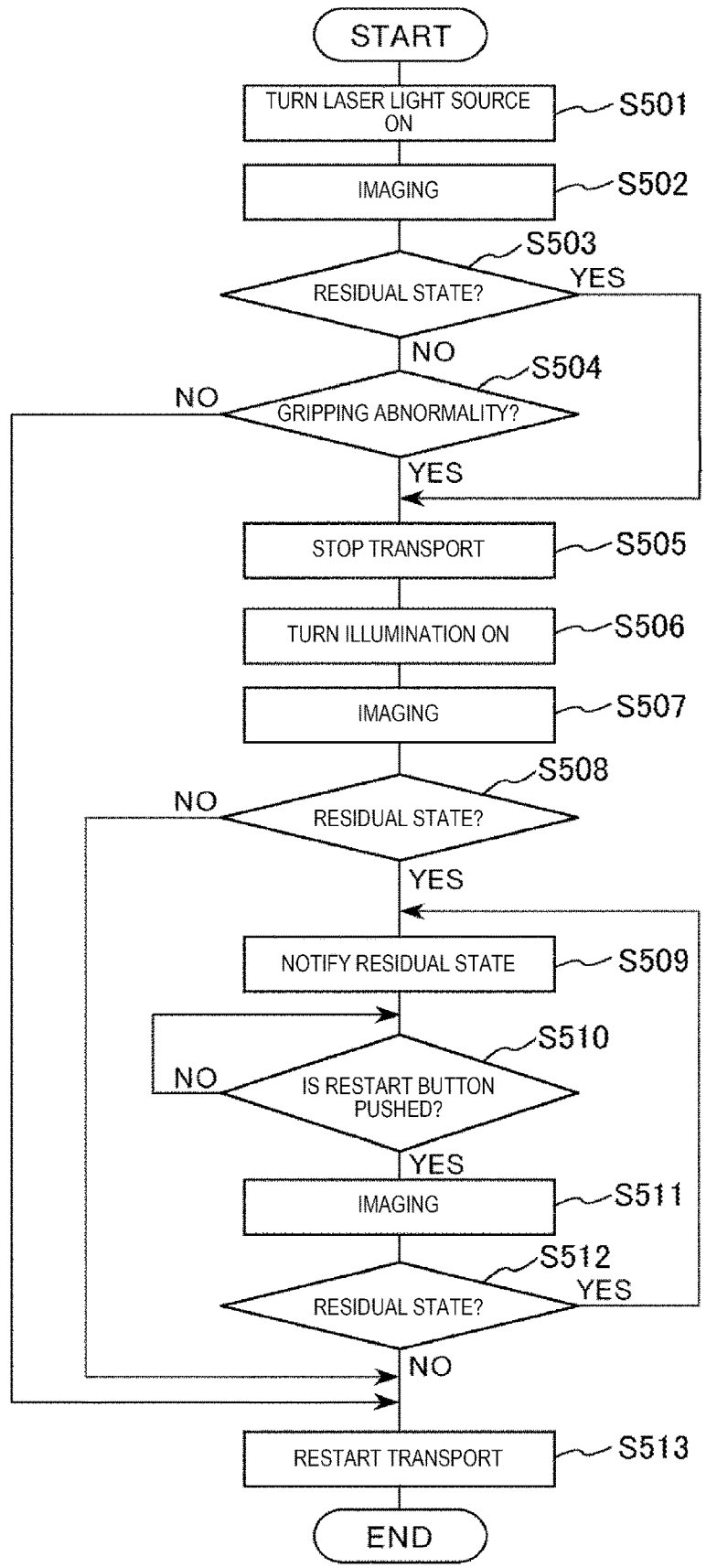
FIG. 40 is a flowchart illustrating the control operation of the control unit included in the electronic component tester illustrated in FIG. 1.

Next, a control operation of the control unit 800 will be described based on a flowchart illustrated in FIG. 40. The following control operation is a control operation in a state where the IC device 90 is transported to the test unit 16 and is subjected to test, and the IC device 90 is removed from the test unit 16.

First, in step S501, the laser light source 41 is activated to irradiate each recess 161 with the laser light L1 (see FIG. 33). In this case, in this embodiment, the illumination 5 is kept turned off. With this configuration, it is possible to make lines of the laser light L1 stand out in the image D1 or the image D2 obtained in the next step S502.

Next, in step S502, the test unit 16 is imaged using the first camera 31. With this configuration, the image (first image) D1 or the image (first image) D2 as illustrated in FIG. 12 or FIG. 13 can be obtained. Imaging in step S502 is performed in the image-capturable state illustrated in FIGS. 16 and 17. When imaging is ended, irradiation with the laser light L1 is stopped.

Next, in step S503, it is determined whether the state is a residual state or a removal state. In this embodiment, the image D2 having the shift amount ΔD2 is acquired and stored in the memory 802 in advance, and it is determined whether the state is the residual state or the removal state, based on the shift amount of the laser light L1 in the image D2. When it is determined in step S503 that the state is the residual state, the process proceeds to step S505 to be described later.

In step S504, when it is determined that the state is the removal state, it is determined whether or not a holding abnormality has occurred in the device transport head 17. The holding abnormality means, for example, a state where the IC device 90 is not held by the device transport head 17. This holding abnormality is carried out, for example, by detecting a suction pressure of the device transport head 17.

When it is determined in step S504 that the holding abnormality has occurred, that is, when it is determined that the IC device (electronic component) 90 is arranged in the test unit 16 which is the electronic component placement portion, the activation of the device transport head 17 is stopped. In step S505, the movement is stopped while holding the IC device 90 is being held. With this configuration, it is possible to prevent continuation of the transport operation in the residual state.

Then, in step S506, the illumination 5 is turned on to irradiate the entire test unit 16 with the light L2.

Next, in step S507, the first camera 31 images the test unit 16. With this configuration, it is possible to obtain an image (second image) D1' or an image (second image) D2' as illustrated in FIG. 14 or 15. Imaging in step S507 is performed in the image-capturable state illustrated in FIGS. 16 and 17.

Next, in step S508, it is determined whether the state is a residual state or a removal state. In step S508, as described above, based on the captured images D1' and D2', a difference in color of the IC device 90 or a difference in brightness is detected to determine whether the state is a residual state or a removal state. In this embodiment, the image D2' in the removal state is acquired and stored in the memory 802 in advance, and is compared with the obtained image D1' or image D2'.

When it is determined in step S508 that the state is the residual state, it is notified in step S509 that the state is the residual state. This notification is performed by activating the notification unit 24. By this notification, the operator can remove the IC device 90 of the test unit 16 and can eliminate the residual state. Then, for example, the operator can push a transport restart button through the operation panel 700.

When it is determined in step S510 that the restart button has been pushed, the test unit 16 is imaged again in step S511 and it is determined in step S512 whether the state is a residual state or a removal state. In step S512, the first determination may be performed, the second determination may be performed, and both the first determination and the second determination may be performed. In accordance with the determination in step S512, it is determined whether to light the laser light source 41, to light the illumination 5, or to light both when imaging is performed in step S511. Upon completion of imaging in step S511, the laser light source 41 or the illumination 5 which is turned on is turned off.

When it is determined in step S512 that the state is the removal state, the transport is restarted in step S513. In step S512, when it is determined that the state is the residual state, the process returns to step S509 to notify that it is the residual state.

Tenth Embodiment

Figure 41:
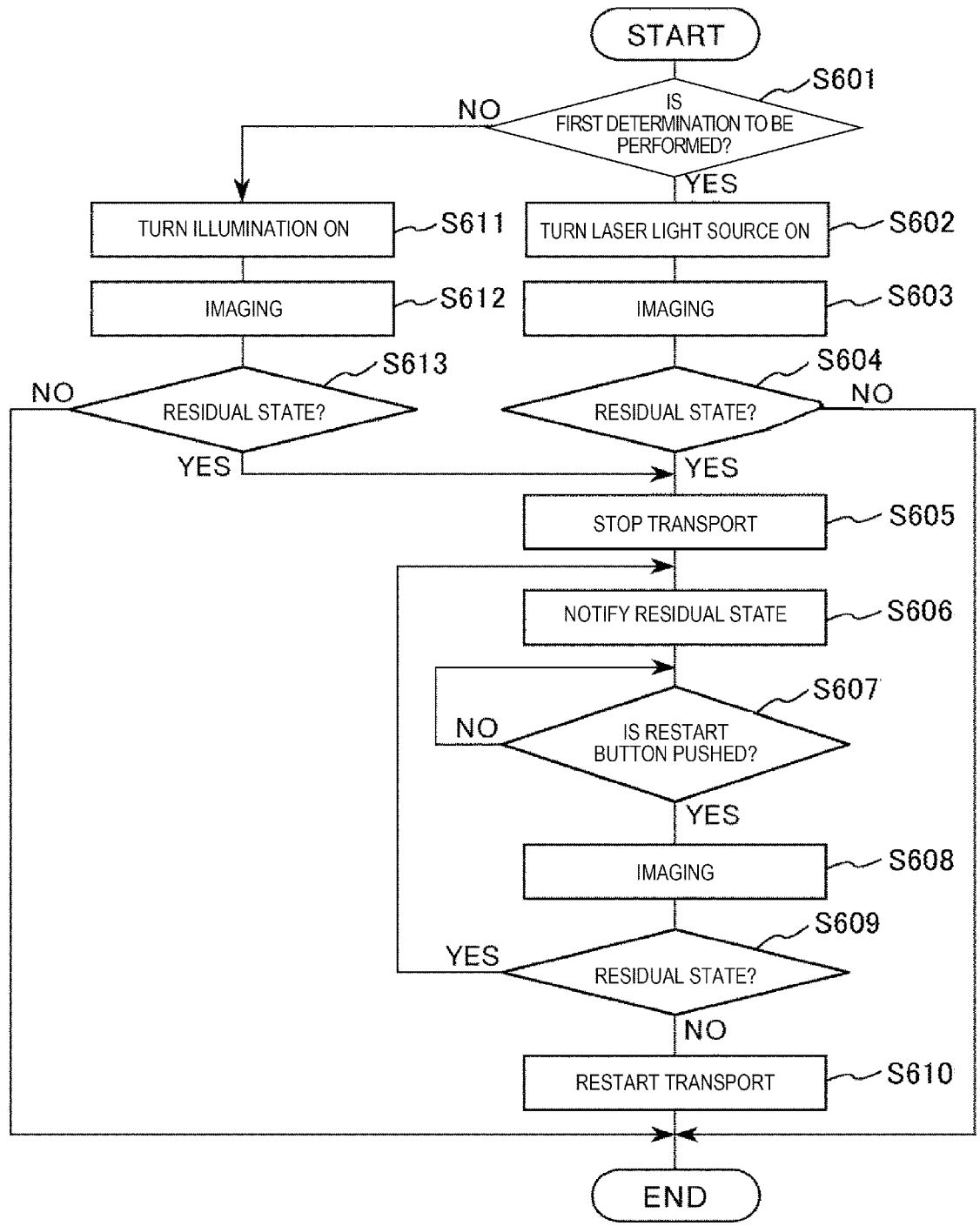
FIG. 41 is a flowchart illustrating a control operation of a control unit included in a tenth embodiment of the electronic component tester of the present invention.

Hereinafter, a tenth embodiment of the electronic component handler and the electronic component tester of the present invention will be described with reference to FIG. 41, but the differences from the embodiments described above will be mainly described, and the description of the same matters will be omitted.

This embodiment is substantially the same as the ninth embodiment except that the control operation of the control unit is different.

The following control operation is a control operation in a state where the IC device 90 is transported to the test unit 16 and is subjected to test and the IC device 90 is removed from the test unit 16.

First, in step S601, it is selected whether to perform the first determination or the second determination. In step S601, based on at least one of the conditions of the irradiation conditions of the laser light source 41 which is the light irradiation section and the illumination 5, the color of the test unit (electronic component placement portion) 16, the color of the IC device (electronic component) 90, and the resolution of the first camera 31, an image to be used for determining whether it is a residual state or an eliminated state is selected from the first image (images D1 and D2) and the second image (images D1' and D2'). With this configuration, when a determination as to whether it is a residual state or a removal state is performed, an image with better conditions can be used. Therefore, it is possible to more accurately determine whether or not the IC device 90 remains on the test unit 16.

The irradiation conditions include, for example, the emission angle of the laser light L1, the luminance of the laser light L1, the luminance of the light L2 and the like. A calibration curve between these conditions and, for example, the brightness in the test area A3 is stored in advance in the memory 802, and the determination of the step S601 can be performed based on the calibration curve.

When it is determined in step S601 that the first image is to be used, in step S602, the laser light source is activated to irradiate each recess 161 with laser light L1 (see FIG. 33).

Then, in step S603, the first camera 31 is used to image the test unit 16. With this configuration, the image (first image) D1 or the image (first image) D2 as illustrated in FIG. 12 or FIG. 13 can be obtained.

Next, in step S604, similarly to step S503 of the ninth embodiment, it is determined whether the state is the residual state or the removal state. When it is determined in step S604 that the state is the residual state, the activation of the device transport head 17 is stopped in step S605, and the notification unit 24 notifies the residual state in step S606.

Then, when it is determined in step S607 that the restart button has been pushed, the test unit 16 is imaged again in step S608, and it is determined in step S609 whether it is a residual state or a removed. In step S609, the first determination may be performed, the second determination may be performed, and both the first determination and the second determination may be performed. In accordance with the determination in step S609, it is determined whether to turn the laser light source 41 on, to turn the illumination 5 on, or to turn both on when imaging is performed in step S608. Upon completion of imaging in step S608, the laser light source 41 or the illumination 5 which is turned on is turned off.

When it is determined in step S609 that the state is the removal state, the transport is restarted in step S610. When it is determined in step S609 that the state is the residual state, the process returns to step S606 to notify that it is the residual state.

When it is determined in step S601 that the second image is to be used, that is, when it is determined to perform the second determination, the illumination 5 is turned on in step S611, and the test unit 16 is imaged by the first camera 31 to obtain the second image in step S612. Then, in step S613, similarly to step S508 in the ninth embodiment, it is determined whether the state is the residual state or the removal state. In step S613, when it is determined that the state is the residual state, the process proceeds to step S605, and the following steps are performed.

Eleventh Embodiment

Figure 42:
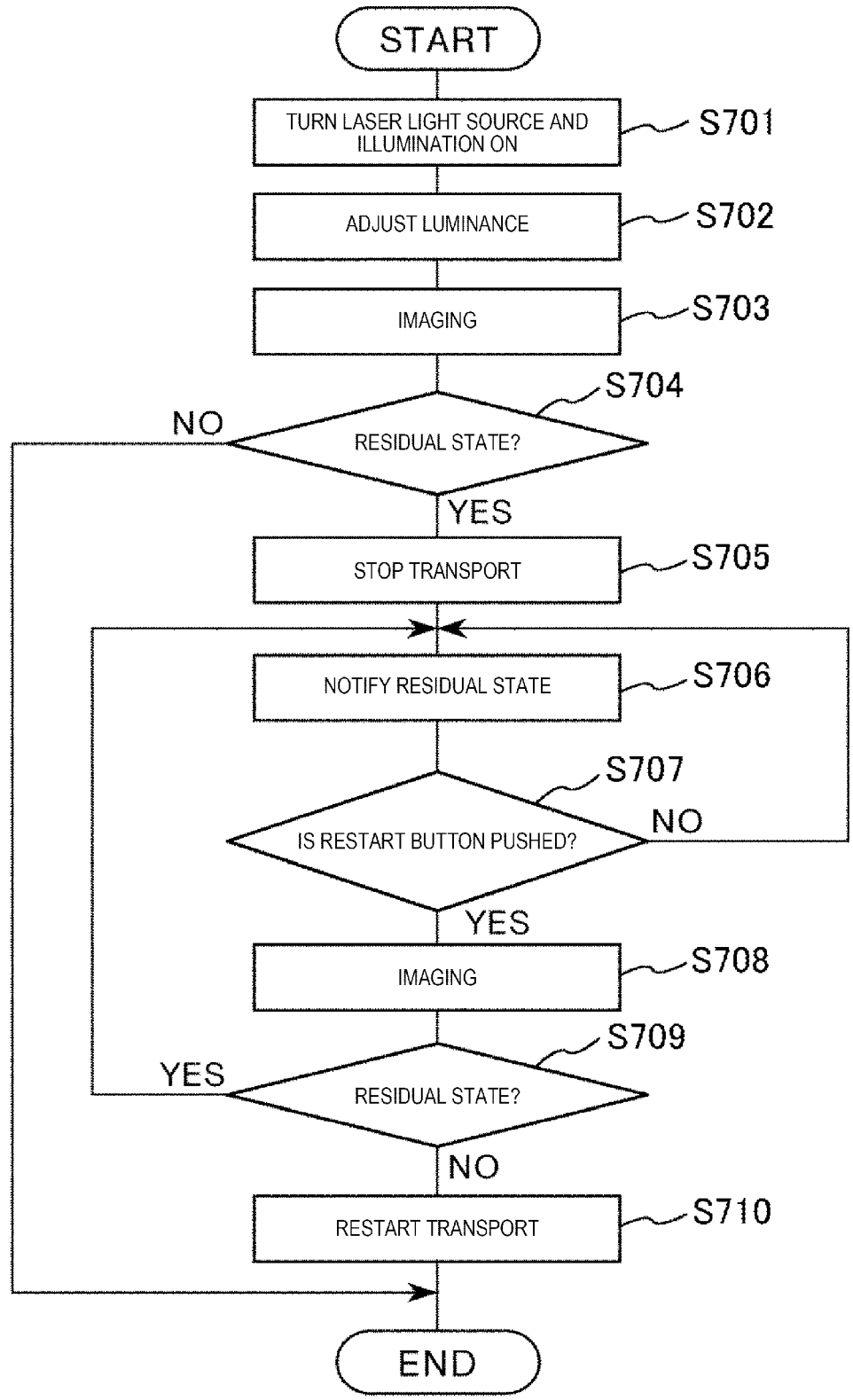
FIG. 42 is a flowchart illustrating a control operation of a control unit included in an eleventh embodiment of the electronic component tester of the present invention.

Hereinafter, an eleventh embodiment of the electronic component handler and the electronic component tester of the present invention will be described with reference to FIGS. 22, 23, and 42, but the differences from the embodiments described above will be mainly described, the description of the same matters will be omitted.

This embodiment is substantially the same as the ninth embodiment except that the control operation of the control unit is different.

As illustrated in FIG. 22, in this embodiment, an illuminance sensor 25 for detecting illuminance is provided on the +X side of the test unit 16. Although not illustrated, the illuminance sensor 25 is electrically connected to the control unit 800, and information of the illuminance detected by the illuminance sensor 25 is transmitted to the control unit 800.

The marker 26 is provided in the vicinity of the end portion on the −X side of the upper surface of the test unit 16. The marker 26 is composed of a colored portion or the like having areas having different colors from each other.

Next, although the control operation of the control unit 800 in this embodiment will be described using the flowchart illustrated in FIG. 42, the following control operation is a control operation in a state where the IC device 90 is transported to the test unit 16 and is subjected to test, and the IC device 90 is removed from the test unit 16.

First, in step S701, the laser light source 41 and the illumination 5 are turned on. In this case, in order to make the laser light L1 stand out, it is preferable to reduce the luminance of the light L2, but if the luminance of the light L2 is too small, it may be difficult to accurately perform the second determination.

Therefore, in step S702, the luminance of at least one of the laser light L1 and the light L2 is adjusted. This adjustment is performed by adjusting the output of at least one of the laser light source 41 and the illumination 5, according to notification of the illuminance detected by the illuminance sensor 25 (brightness in the test A3) or information obtained from luminance distribution of the image.

In this adjusted state, in step S703, the first camera 31 is used to image the image D3 illustrated in FIG. 23. This image D3 is larger than the images D1 and D2 illustrated in FIGS. 12 and 13, and is an image in which the peripheral portion of the recess 161 is also imaged.

Then, in step S704, it is determined whether the state is the residual state or the removal state. The determination in step S704 is performed similarly as in step S508 in the ninth embodiment and step S604 in the tenth embodiment. In step S704, even when the IC device 90 is unintentionally placed on the upper surface of the test unit as illustrated in FIG. 23, for example, this can be detected. In this embodiment, this case is also included in the residual state. In particular, when the IC device 90 is unintentionally placed on the upper surface of the test unit 16, the position of the line by the laser light L1 is shifted in the X direction on the upper surface of the IC device 90 in this embodiment. For that reason, it is possible to accurately detect that the IC device 90 is unintentionally placed on the upper surface of the test unit 16.

When it is determined in step S704 that the state is the residual state, the activation of the device transport head 17 is stopped in step S705, and the notification unit 24 notifies that it is in the residual state in step S706.

When it is determined in step S707 that the restart button has been pushed, the test unit 16 is imaged again in step S708 and it is determined in step S709 whether the state is a residual state or a removal state. In step S709, the first determination may be performed, the second determination may be performed, and both the first determination and the second determination may be performed. In accordance with the determination in step S709, it is determined whether to light the laser light source 41, to light the illumination 5, or to light both when imaging is performed in step S708. Upon completion of imaging in step S708, the laser light source 41 or the illumination 5 which is turned on is turned off.

When it is determined in step S709 that the state is the removal state, the transport is restarted in step S710. In step S709, when it is determined that the state is the residual state, the process returns to step S706 to notify that it is the residual state.

Twelfth Embodiment

Hereinafter, a twelfth embodiment of the electronic component handler and the electronic component tester of the present invention will be described with reference to FIG. 43, but the differences from the embodiments described above will be mainly described, the description of the same matters will be omitted.

This embodiment is the same as the ninth embodiment except that three cameras are provided.

Figure 43:
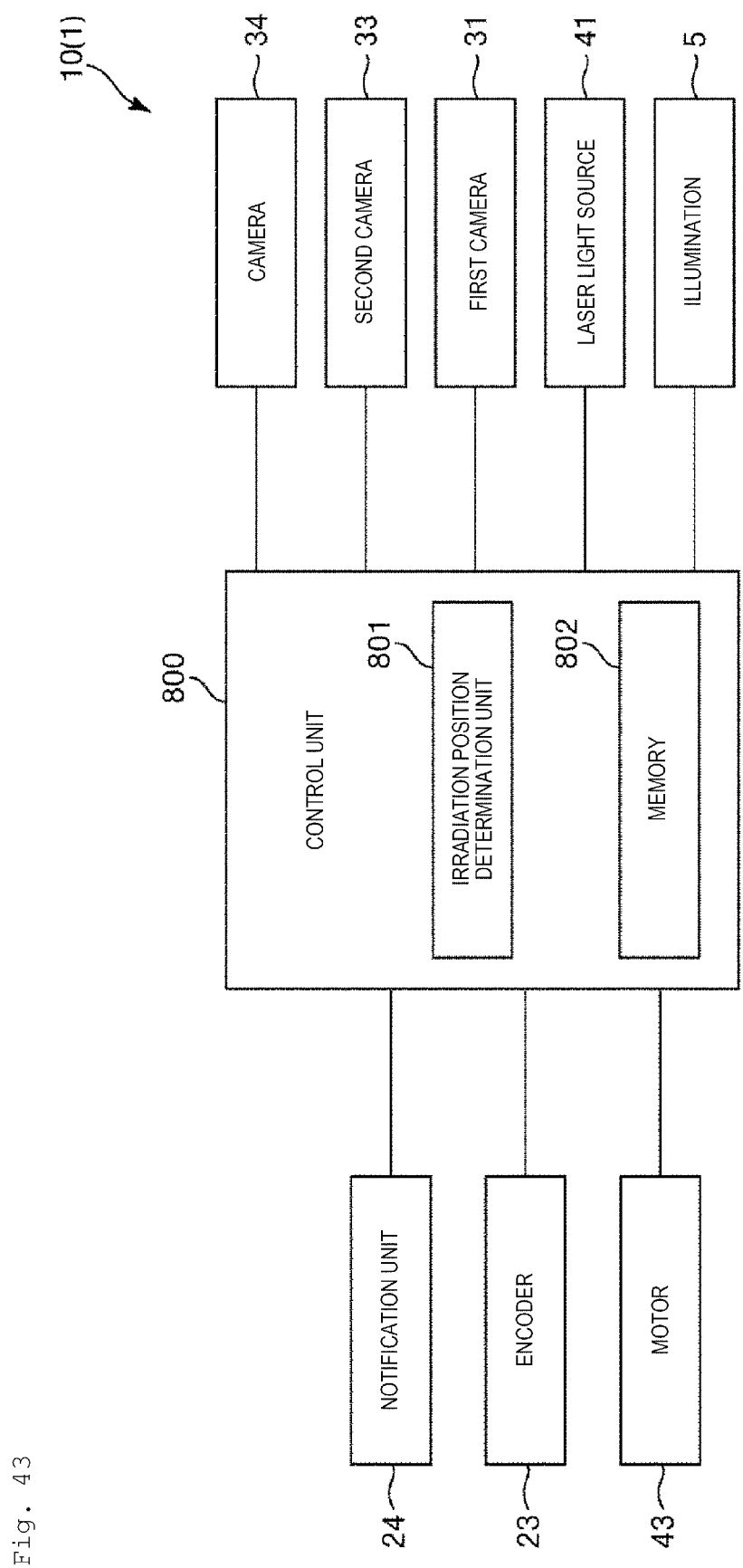
FIG. 43 is a block diagram of a twelfth embodiment of the electronic component tester of the present invention.

As illustrated in FIG. 43, in this embodiment, the imaging section includes a camera 34 which is a third imaging section that captures images D1' and D2' which are the second images, in addition to the first camera 31 which is the first imaging section and the second camera 33 which is the second imaging section that capture images D1 and D2 which are the first images. That is, in this embodiment, the imaging unit is configured to include a dedicated first camera 31 and a dedicated second camera 33 for capturing the images D1 and D2 and a dedicated camera 34 for capturing the images D1' and D2'. For that reason, the first camera and the second camera 33 can have relatively high resolution, and the camera 34 can have lower resolution than the first camera 31 and the second camera 33. As a result, in the second determination, it is possible to shorten the time required for exchanging data between the control unit 800 and the camera 34.

Thirteenth Embodiment

Hereinafter, a thirteenth embodiment of the electronic component handler and the electronic component tester of the present invention will be described with reference to FIGS. 44 and 45, but the differences from the embodiments described above will be mainly described, the description of the same matters will be omitted.

This embodiment is the same as the ninth embodiment except that the control operation of the control unit and the arrangement form of the recesses of the test unit are different.

Figure 44:
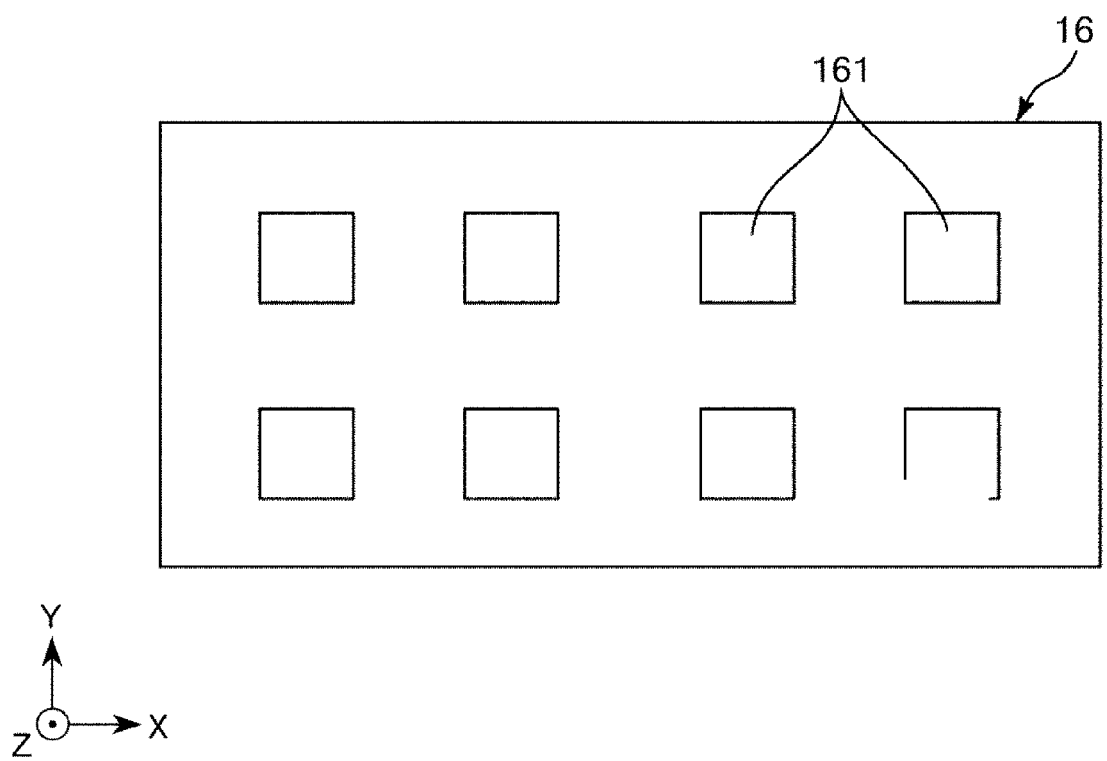
FIG. 44 is a plan view of a test unit in a thirteenth embodiment of the electronic component tester of the present invention.
Figure 45:
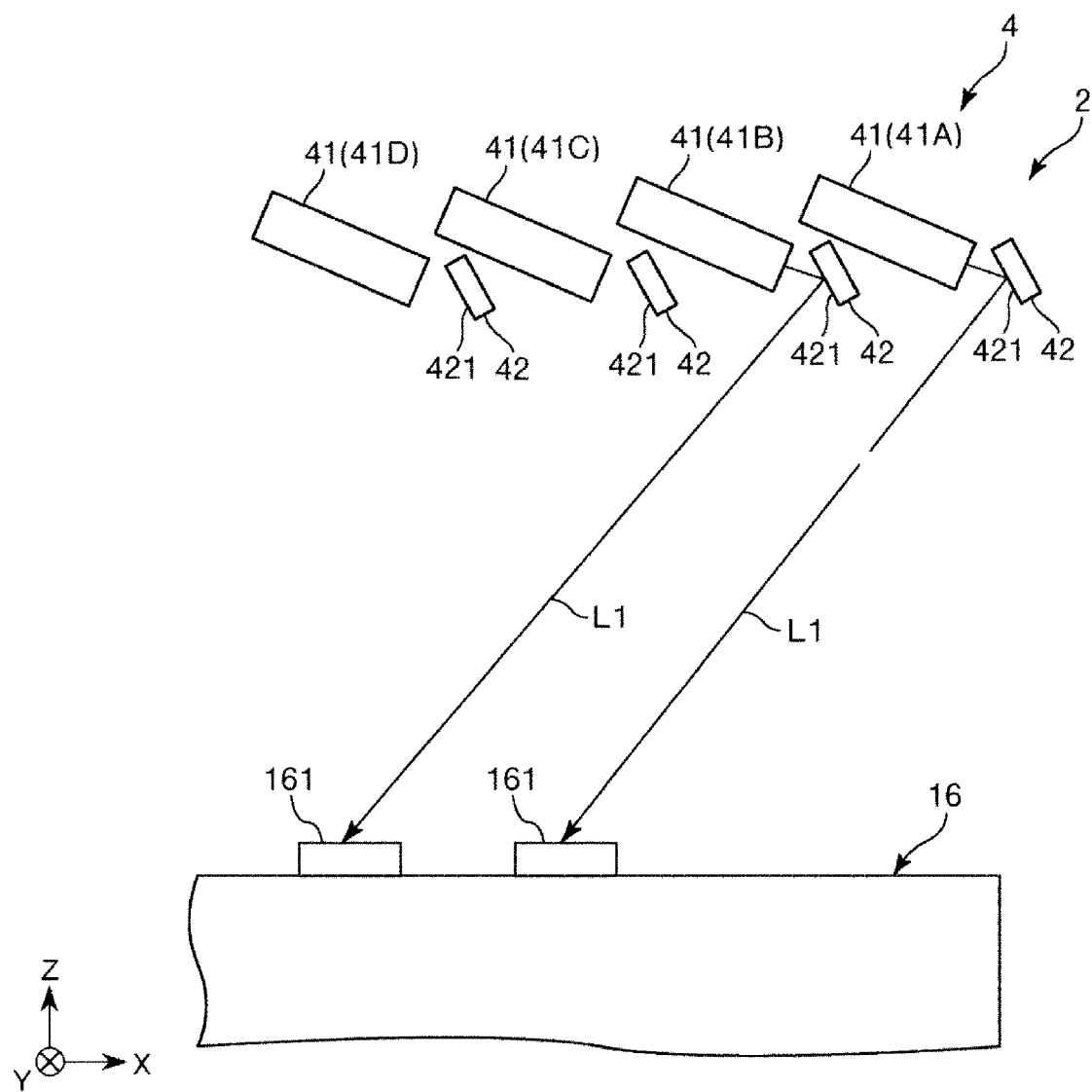
FIG. 45 is a side view of a light irradiation unit in the thirteenth embodiment of the electronic component tester of the present invention.

As illustrated in FIG. 44, in this embodiment, the test unit 16 is provided with eight recesses 161. In the test unit 16, four recesses 161 are arranged in a row in the X direction, and four recesses 161 are further arranged in a row on the +Y side of the row.

In such a test unit 16, the detection unit 2A is responsible for irradiating and imaging of the laser light L1 in the four recesses 161 on the +X side from the center of the test unit 16 in the X direction and the detection unit 2B is responsible for irradiating and imaging of the laser light L1 in the four recesses 161 on the −X side from the center of the test unit 16 in the X direction. Hereinafter, the detection unit 2A and the four recesses 161 on the +X side from the center of the test unit 16 in the X direction will be representatively described.

As described in the ninth embodiment, the detection unit 2A is provided with four laser light sources 41, and two recesses 161 aligned in the Y direction is irradiated with the laser light L1 by one laser light source 41. For that reason, in the arrangement form of the recesses 161 as illustrated in FIG. 44, since it is sufficient to activate the two laser light sources 41, two laser light sources 41 among the four laser light sources 41 are selected and activated in the detection unit 2A. The four laser light sources 41 are a laser light source 41A, a laser light source 41B, a laser light source 41C, and a laser light source 41D in order from the +X side.

In this selection, as described above, as the incident angle θ1 of the laser light L1 is increased, the first determination can be accurately performed. Accordingly, among the detection unit 2A, the laser light source 41A and the laser light source 41B on the X-side are selected (see FIG. 45).

For example, when the incident angle θ1 of the laser light L1 of the laser light source 41A is larger than the angle θ2 between the inner circumferential surface 162 of the recess 161 and the Z direction, selection of the laser light source 41A is omitted and the laser light source 41B and the laser light source 41C are selected (not illustrated).

As such, in this embodiment, the laser light source 41 is selected so that the incident angle θ1<the angle θ2 is satisfied and the incident angle θ1 is as large as possible. With this configuration, it is possible to accurately perform the first determination regardless of the arrangement form of the recesses 161 in the test unit 16.

Fourteenth Embodiment

Hereinafter, a fourteenth embodiment of the electronic component handler and the electronic component tester of the present invention will be described with reference to FIG. 46, but the differences from the embodiments described above will be mainly described, the description of the same matters will be omitted.

This embodiment is the same as the ninth embodiment except that the arrangement form of the recesses in the test unit and the imaging range of the first imaging section and the second imaging section are different.

Figure 46:
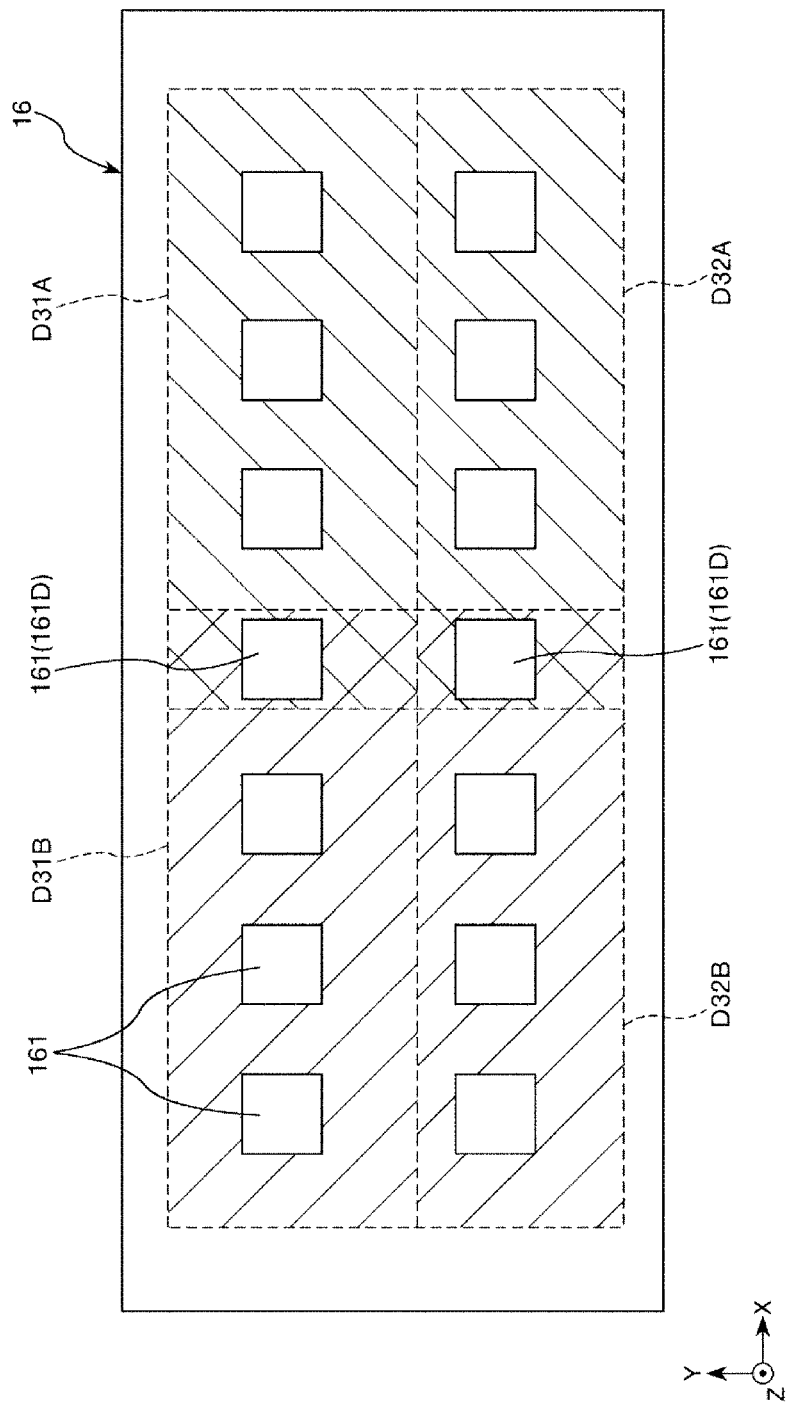
FIG. 46 is a plan view of a test unit in a fourteenth embodiment of the electronic component tester of the present invention, and is a view illustrating an area imaged by a first imaging section and the second imaging section.

As illustrated in FIG. 46, in this embodiment, the test unit 16 is provided with fourteen recesses 161. In the test unit 16, seven recesses 161 are arranged in one row line in the X direction, and seven recesses 161 are further arranged in one row on the +Y side of that row. Since an odd number of recesses 161 as the recess 161 are provided in one row along the X direction, the recess 161 is arranged in the center portion of the test unit 16 in the X direction.

In this embodiment, the imaging ranges of the first camera 31 of the detection unit 2A and the first camera 31 of the detection unit 2B have overlapping portions where the imaging ranges overlap each other. Specifically, the first camera 31 of the detection unit 2A images the four recesses 161 from the +X side, and the first camera 31 of the detection unit 2B images the four recesses 161 from the −X side. For that reason, the recess 161 (recess 161D) in the middle is imaged by both the first camera 31 of the detection unit 2A and the first camera 31 of the detection unit 2B. That is, it also appears in an image D31A captured by the first camera 31 of the detection unit 2A, and also appears in an image D31B captured by the first camera 31 of the detection unit 2B. This also applies to an image D32A captured by the second camera 33 of the detection unit 2A and an image D32B captured by the second camera 33 of the detection unit 2B.

According to such a configuration, even in the test unit 16 in which the recess 161 is positioned in the center portion in the X direction, it is possible to reliably image the recess 161D positioned in the center part. That is, it is possible to prevent the recess 161D from being positioned at the boundary between the image D31A and the image D31B (the same applies to the images D32A and D32B). Therefore, it is possible to accurately determine the presence or absence of the IC device 90 in the recess 161.

The determination in the recess 161D can be performed based on at least one of the image D31A and the image D31B (the same applies to the images D32A and D32B).

In the case where a CCD camera is adopted as the first camera 31 and the second camera 33, exposure is sequentially performed in a left-and-right direction in FIG. 46, and reading is sequentially performed in an up-and-down direction in FIG. 46. In this embodiment, since the image captured by the first camera 31 and the second camera 33 has a shape whose longitudinal direction is the left-and-right direction in the figure, it is possible to suppress the increase in the number of times of reading in the up-and-down direction in the figure. As a result, it is possible to shorten the time required for reading the captured image, and it is possible to smoothly make determination based on the image.

Fifteenth Embodiment

Figure 47:
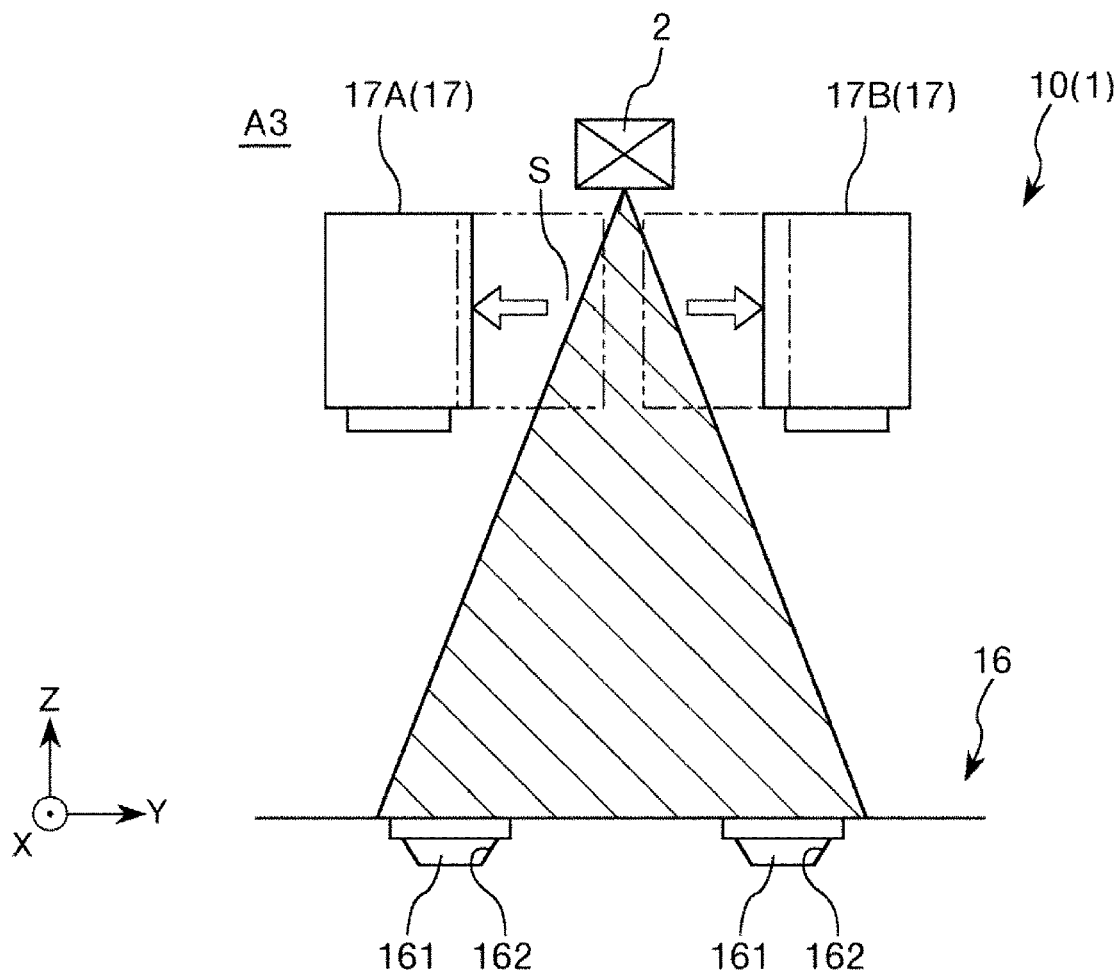
FIG. 47 is a side view of the device transport head and the test unit in a fifteenth embodiment of the electronic component tester of the present invention.

Hereinafter, a fifteenth embodiment of the electronic component handler and the electronic component tester of the present invention will be described with reference to FIG. 47, but the differences from the embodiments described above will be mainly described, the description of the same matters will be omitted.

This embodiment is the same as the ninth embodiment except that the control operation of the control unit is different. In this embodiment, when the transport is stopped in step S505 of the ninth embodiment (see FIG. 40), the device transport head 17A and the device transport head 17B move in opposite directions as illustrated in FIG. 47. With this configuration, the gap S between the device transport head 17A and the device transport head 17B widens.

Then, in a state where the gap S is widened, the second image is imaged through steps S506 and S507. With this configuration, it is possible to obtain the second image in which more areas of the test unit 16 are imaged in one imaging operation imaged as much as the gap S widens. As a result, the imaging in step S507 can be simplified.

Sixteenth Embodiment

Hereinafter, a sixteenth embodiment of the electronic component handler and the electronic component tester of the present invention will be described with reference to FIGS. 48 and 49, but the differences from the embodiments described above will be mainly described, the description of the same matters will be omitted.

This embodiment is the same as the ninth embodiment except that the operation of the device transport head is different.

Figure 48:
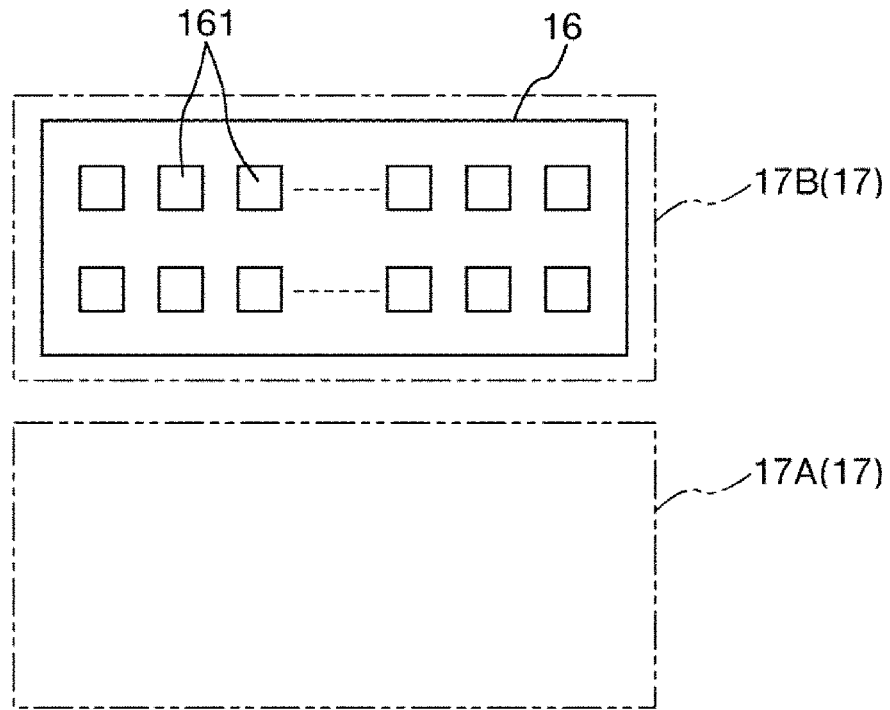
FIG. 48 is a plan view of a test unit in a sixteenth embodiment of the electronic component tester of the present invention.
Figure 49:
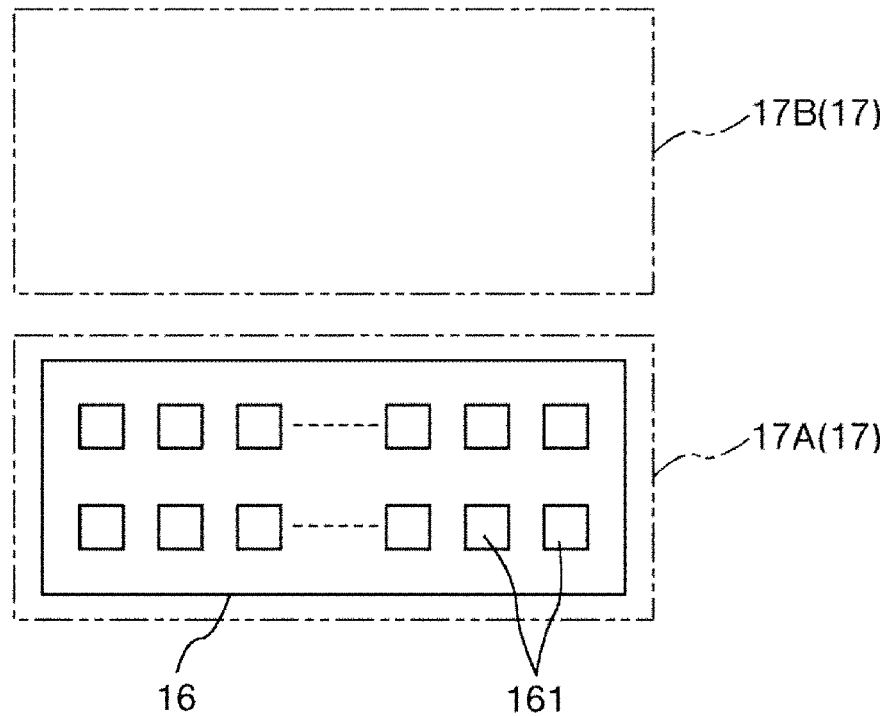
FIG. 49 is a plan view of a test unit in the sixteenth embodiment of the electronic component tester of the present invention.

As illustrated in FIGS. 48 and 49, in this embodiment, each of the device transport head 17A and the device transport head 17B includes a suction portion (not illustrated) corresponding to the recess 161 of the test unit 16, and alternately transports the IC device 90 (not illustrated) to the test unit 16.

That is, as illustrated in FIG. 48, when the device transport head 17B is transporting the IC device 90 to the test unit 16, the device transport head 17A is positioned at a position shifted to the −Y side of the test unit 16. On the other hand, as illustrated in FIG. 49, when the device transport head 17A is transporting the IC device 90 to the test unit 16, the device transport head 17B is positioned at a position shifted to the +Y side of the test unit 16.

As described above, in this embodiment, a configuration in which one device transport head 17 transports the IC device 90 to the test unit 16 and alternately repeats this adopted. According to the sixteenth embodiment like this, the same effect as that of the ninth embodiment can be obtained.

Seventeenth Embodiment

Hereinafter, a seventeenth embodiment of the electronic component handler and the electronic component tester of the present invention will be described with reference to FIGS. 50 to 52, but the differences from the embodiments described above will be mainly described, the description of the same matters will be omitted.

This embodiment is the same as the ninth embodiment except that the operation of the device transport head is different.

In the test unit 16 of this embodiment, four rows in which the recesses 161 are aligned in the X direction are provided in the Y direction.

The device transport head 17A and the device transport head 17B are in charge of two rows out of the four rows of recesses 161.

Figure 50:
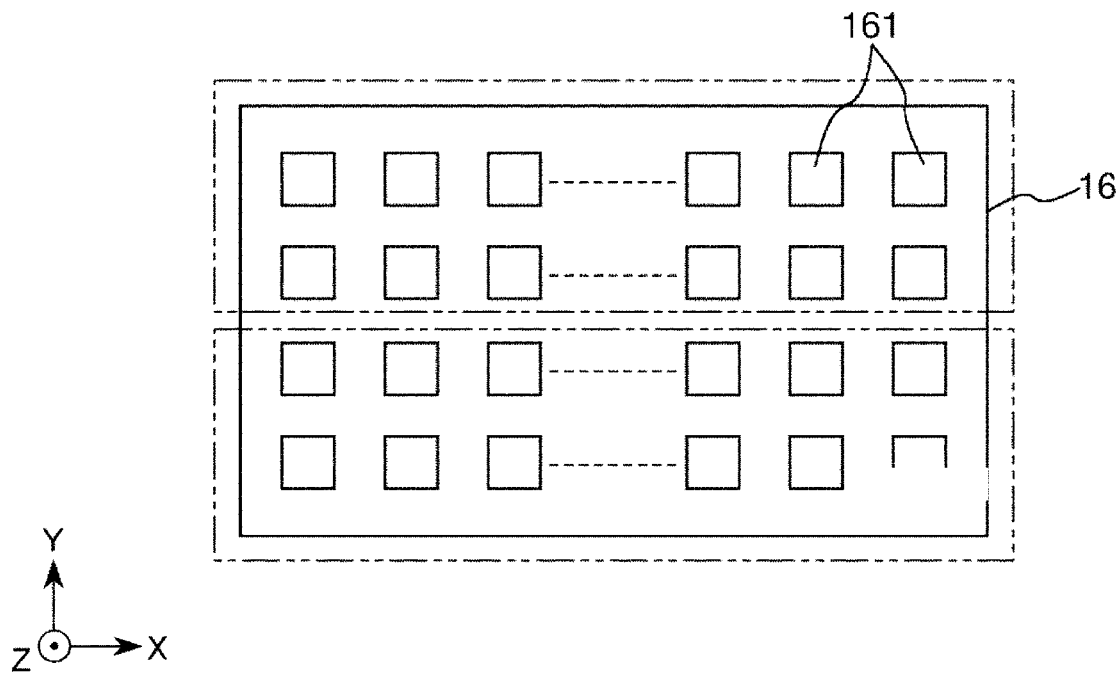
FIG. 50 is a plan view of a test unit in a seventeenth embodiment of the electronic component tester of the present invention.

Specifically, as illustrated in FIG. 50, the device transport head 17B is responsible for transporting the IC device 90 (not illustrated) to the two rows of recesses 161 on the +Y side, and the device transport head 17A is responsible for transporting the IC device 90 (not illustrated) to the two rows of recesses 161 on the −Y side.

Figure 51:
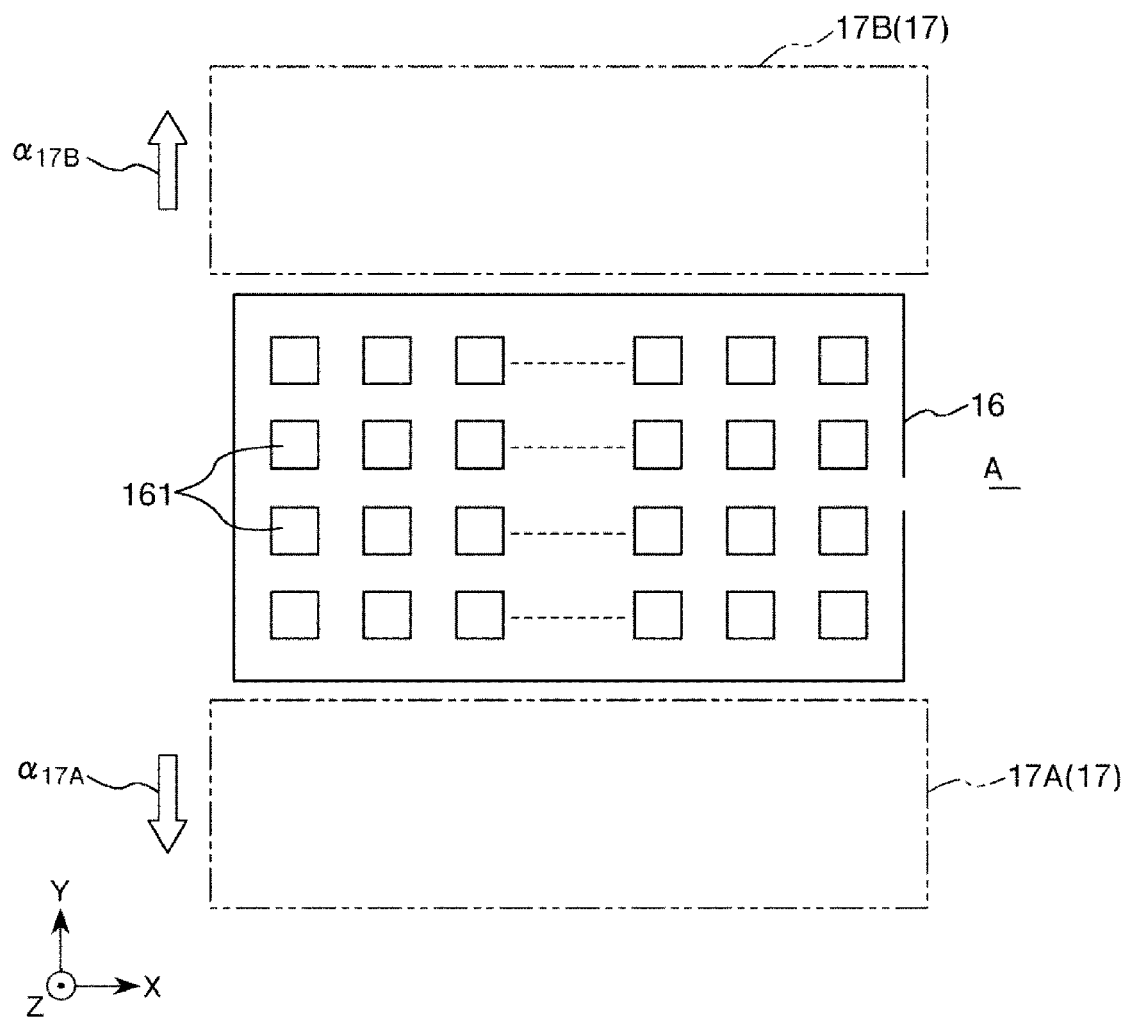
FIG. 51 is a plan view of a test unit in the seventeenth embodiment of the electronic component tester of the present invention.

As illustrated in FIG. 51, when the IC device 90 is carried out from the test unit 16 or the like, the device transport head 17B moves to the +Y side and the device transport head 17A moves to the −Y side (see arrows $\alpha_{17A}$ and $\alpha_{17B}$ in FIG. 51). That is, the device transport head 17A and the device transport head 17B move so as to repeat approaching and separating from each other when viewed from the Z direction.

Figure 52:
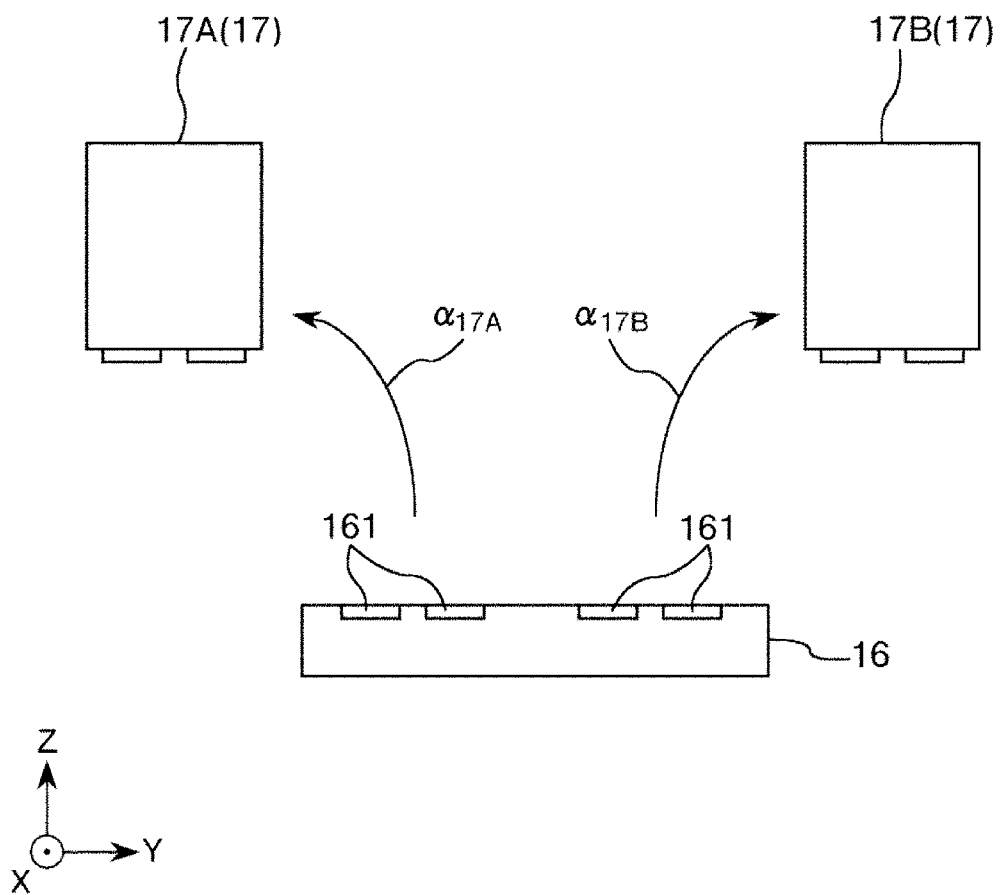
FIG. 52 is a view when viewed in a direction of an arrow A in FIG. 51.

As illustrated in FIG. 52, since the device transport head 17A and the device transport head 17B can move in the Y direction and the Z direction when the heads 17A and 17B are separated from each other, the heads 17A and 17B can move so as to draw a circular arc (see arrows $\alpha_{17A}$ and $\alpha_{17B}$ in FIG. 52). Also, according to the seventeenth embodiment as described above, the same effects as those of the ninth embodiment can be obtained.

Eighteenth Embodiment

Hereinafter, an eighteenth embodiment of the electronic component handler and the electronic component tester of the present invention will be described with reference to FIGS. 1, 8 to 19, 25, 31 to 35, 37 to 39, 53 to 71, and 73, but the differences from the embodiments described above will be mainly described, the description of the same matters will be omitted. In the following description, for convenience of explanation, the upper side in FIG. 56 may be referred to as "upper" or "above", and the lower side may be referred to as "lower" or "below". In particular, since the first direction and the second direction are orthogonal to each other, it is possible to easily perform a control operation of activating each unit of the electronic component handler 10.

In this embodiment, the electronic component handler is capable of arranging the test unit (electronic component placement portion) 16 including the recess (placement portion) 161 on which the IC device (electronic component) 90 can be placed, and includes the device transport head 17A as a first hold portion that is movable in the Z direction (first direction) and the Y direction (second direction) different from the Z direction and is capable of holding the IC device 90, the device transport head 17B as a second hold portion that is movable in the Z direction and the Y direction and is capable of holding the IC device 90, the first camera 31 and the second camera 33 as the imaging sections that are capable of imaging the test unit (electronic component placement portion) 16 from between the device transport head 17A and the device transport head 17B, and the encoder 23 as a position detection unit that is capable of detecting position information of at least one device transport head (hold portion) of the device transport head 17A and the device transport head 17B, and the device transport head 17A and the device transport head 17B can move in the second direction with respect to the first camera 31 and the second camera 33 as the imaging sections, and the first camera 31 and the second camera 33 as the imaging sections capture the first image of the test unit 16 based on first position information (encoder value) detected by the encoder 23.

With this configuration, imaging can be performed based on the position information of the device transport head 17A or the device transport head 17B. Therefore, it is possible to image the electronic component placement portion 16 from between the device transport head 17A and the device transport head 17B. As a result, for example, when it is determined whether or not the IC device 90 is arranged on the placement portion 161 based on the imaging result, the determination can be performed more accurately.

In this embodiment, the electronic component tester 1 is capable of arranging the test unit (electronic component placement portion) 16 including the recess (placement portion) 161 on which the IC device (electronic component) 90 can be placed, and includes the device transport head (first hold portion) 17A as a first hold portion that is movable in the Z direction (first direction) and the Y direction (second direction) different from the Z direction and is capable of holding the IC device 90, the device transport head (second hold portion) 17B as a second hold portion that is movable in the Z direction and the Y direction and is capable of holding the IC device 90, the first camera 31 and the second camera 33 as the imaging sections that are capable of imaging the test unit (electronic component placement portion) 16 from between the device transport head 17A and the device transport head 17B, and the encoder 23 as a position detection unit that is capable of detecting position information of at least one device transport head (hold portion) of the device transport head 17A and the device transport head 17B, the test unit 16 that tests the IC device 90, and the device transport head 17A and the device transport head 17B can move in the second direction with respect to the first camera 31 and the second camera 33 as the imaging sections, and the first camera 31 and the second camera 33 as the imaging sections capture the first image of the test unit 16 based on first position information (encoder value) detected by the encoder 23.

With this configuration, the electronic component tester 1 having the advantage of the electronic component handler 10 described above is obtained. The IC device 90 can be transported to the test unit 16, so that the test of the IC device 90 can be performed by the test unit 16. The IC device 90 after the test can be transported from the test unit 16.

Hereinafter, the configuration of each part will be described. As will be described later, the control unit 800 can adjust the timing at which the imaging instruction signal is transmitted to the first camera 31 and the second camera 33 as the imaging sections. With this configuration, it is possible to adjust so that the placement portion appears in the image captured by the imaging section. In particular, since the control unit 800 can adjust the timing at which the first camera 31 and the second camera 33 as the imaging sections start imaging, as will be described later, the control unit 800 can accurately adjust the timing at which the imaging instruction signal is transmitted.

Next, the detection unit 2 will be described. The first camera 31 and the second camera 33 as the imaging sections include imaging elements, and it is possible to adjust the exposure time of the imaging elements, for example, by adjusting the shutter speed or the like. With this configuration, it is possible to adjust brightness of the captured image. The adjustment of the exposure time is performed when all of the recess 161 can be imaged from between the device transport head 17A and the device transport head 17B.

As illustrated in FIG. 37, the optical axis between the optical axis up to the first light reflection surface (first light reflection portion) 331 of the first camera (first imaging section) 31 and the optical axis of the second camera (second imaging section) 33 are along the Y direction (the second direction). That is, the optical axis up to the first light reflection surface (first light reflection portion) 331 of the first camera (first imaging section) 31 and the optical axis of the second camera (second imaging section) 33 are parallel. With this configuration, the first camera 31, the second camera 33, and the light reflection portion 35 can be easily installed.

The laser light source (light irradiation section) 41 is arranged so as to be capable of irradiating the test unit 16 which is an electronic component placement portion with the laser light (light) L1 through a gap between the device transport head (first hold portion) 17A and the device transport head (second hold portion) 17B. With this configuration, it is possible to make a determination to be described later based on the laser light L1 with which the test unit 16 is irradiated.

Next, an adjustment method of the timing at which the first camera 31 and the second camera 33 perform imaging (control operation of the control unit 800) performed prior to test of the IC device 90 will be described, but since the same control is performed in the first camera 31 and the second camera 33, the first camera 31 will be representatively described below.

Figure 56:
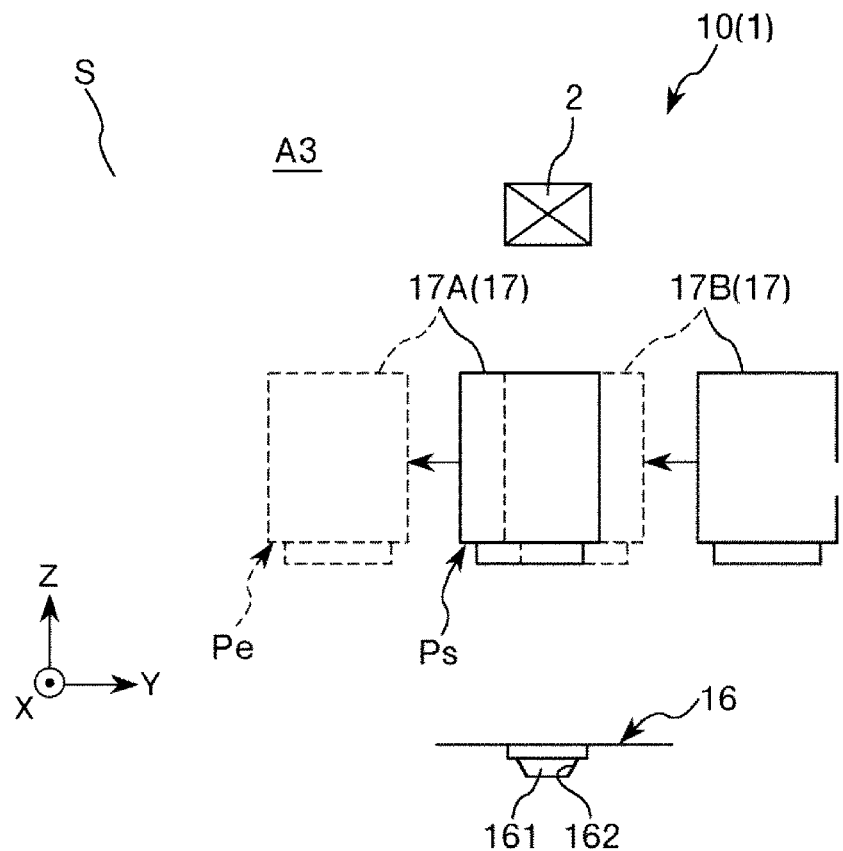
FIG. 56 is a side view of the device transport head of the electronic component tester illustrated in FIG. 1 and is a view illustrating a state where adjustment of imaging timing is performed before test is performed.
Figure 60:
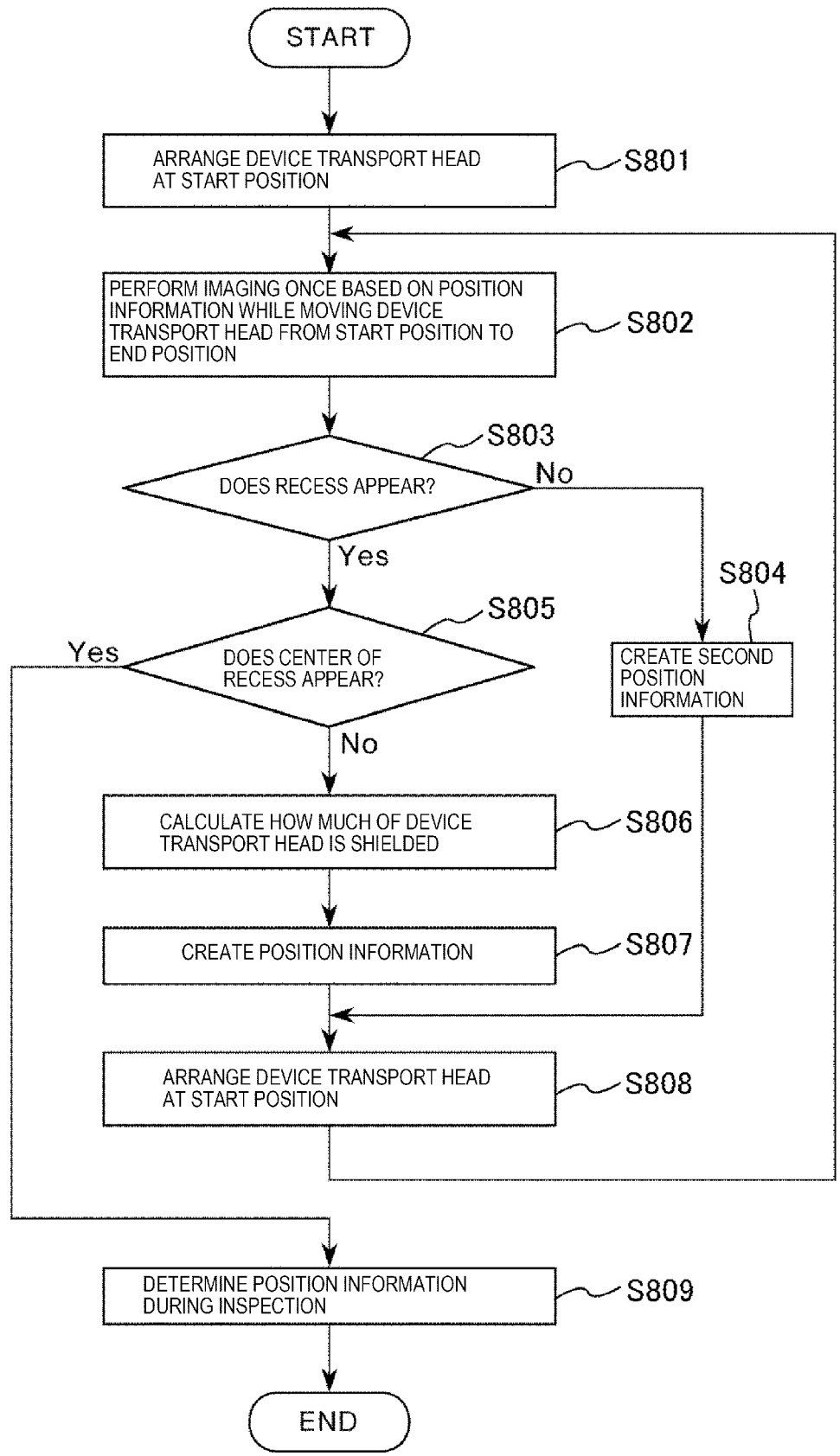
FIG. 60 is a flowchart illustrating the control operation of the control unit included in the electronic component tester illustrated in FIG. 1.

First, in step S801 illustrated in FIG. 60, the device transport head 17A and the device transport head 17B are arranged at a start position Ps (see FIG. 56). The start position Ps is, for example, a position at which the recess 161 starts to appear.

In step S802, while moving the device transport head 17A and the device transport head 17B from the start position Ps toward the end position Pe (see arrows $\alpha_{17A}$ and $\alpha_{17B}$ in FIG. 51), when the encoder values of the device transport head 17A and the device transport head 17B reach a predetermined value, the imaging instruction signal is transmitted to the first camera 31, and imaging of the recess 161 is performed once. That is, an image (first image) of the test unit 16 is imaged once based on the encoder value which is first position information detected by the encoder 23 to obtain one image D17-1 illustrated in FIG. 57.

The predetermined value is a value obtained by theoretically estimating the encoder value in consideration of the arrangement position of the recess 161 and accuracy of the position detection unit 23 at the position where the gap S between the device transport head 17A and the device transport head 17B overlaps with the recess 161.

Figure 57:
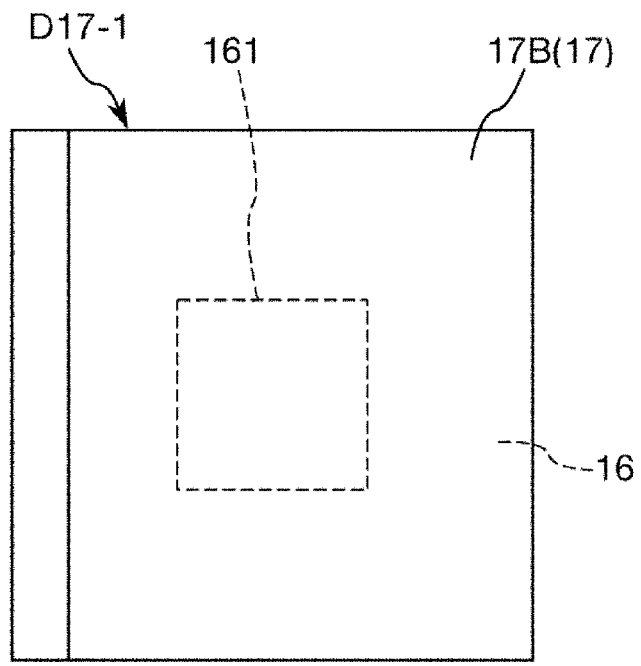
FIG. 57 is a view illustrating an image obtained by imaging a first image by the imaging section of the electronic component tester illustrated in FIG. 1.
Figure 58:
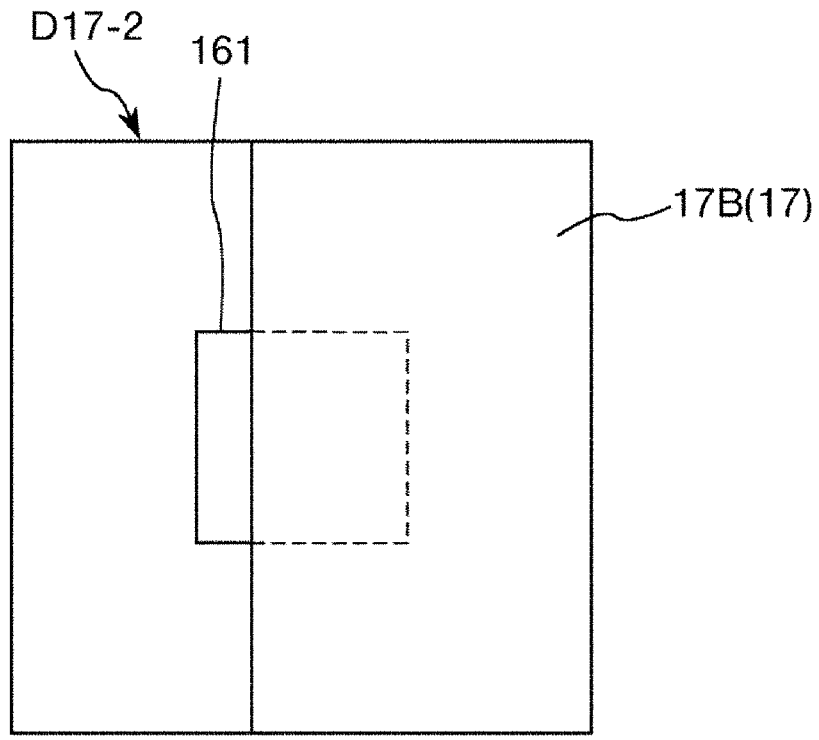
FIG. 58 is a view illustrating an image obtained by imaging a second image by the imaging section of the electronic component tester illustrated in FIG. 1.

Then, in step S803, it is determined whether or not a recess appears in the image D17-1. In this step, when a part of the recess 161 also appears, the process proceeds to step S805. As illustrated in FIG. 57, when the device transport head 17B appears in the image D17-1 and the whole of the recess 161 is shielded, it is determined that the recess 161 does not appear, and the process proceeds to step S804.

Then, in step S804, the first position information which is the encoder value when the imaging instruction signal is transmitted when the image D17-1 is imaged is corrected.

That is, based on the image D17-1 which is the first image captured by the first camera (imaging section) 31, the next corrected position information, that is, second position information different from the first position information is created. With this configuration, more accurate second position information can be created based on the first position information. Therefore, when imaging is performed based on the second position information, it is possible to obtain an image more suitable for performing the determination.

Specifically, in the image D17-1, it is calculated whether the recess 161 appears at which position the device transport head 17B is located and creates an encoder value (second position information) at the time of transmitting the imaging instruction signal, based on the calculation result. That is, the second position information is determined based on the image of at least one hold portion (device transport head 17B) 161 included in the image D17-1 which is the first image and the image of the recess (placement portion) 161 included in the image D17-1. With this configuration, when imaging is performed based on the second position information, it is possible to prevent or suppress the device transport head 17B from shielding the whole of the recess 161. As a result, it is possible to obtain an image more suitable for performing the determination.

Then, the device transport head 17A and the device transport head 17B are returned to a start position Ps (step S808), and the process returns to step S802, where the first camera 31 which is the imaging section captures one image D17-2 which is a second image of the test unit (electronic component placement portion) 16 (see FIG. 58), based on the second position information (the encoder value corrected in step S804). With this configuration, it is possible to obtain an image more suitable for performing the determination.

When it is determined in step S803 that the recess 161 appears in the image D17-2, it is determined in step S805 whether or not the center of the recess 161 appears. The center of the recess 161 is, for example, a portion where each diagonal line intersects when the recess 161 is viewed from the Z direction, and is a portion irradiated with the laser light L1.

In step S805, when it is determined that the center of the recess 161 does not appear, that is, a part of the recess 161 is shielded by the device transport head 17A or the device transport head 17B, it is calculated whether the center of the recess 161 appears at which position the device transport head 17B is positioned (step S806), the second position information which is the encoder value when the imaging instruction signal is transmitted when the image D17-2 is captured is corrected, and third position information which is the next corrected position information and is different from the first position information and the second position information is created (step S807). That is, based on the image D17-2 which is the second image captured by the first camera (imaging section) 31, the third position information is created. As such, the third position information is determined based on the image of at least one hold portion (device transport head 17B) included in the image D17-2 which is the second image and the image of the recess (placement portion) 161 included in the image D17-2. With this configuration, when imaging is performed based on the third position information, it is possible to prevent or suppress the device transport head 17B from shielding the whole of the recess 161. As a result, it is possible to obtain an image more suitable for performing the determination.

Figure 59:
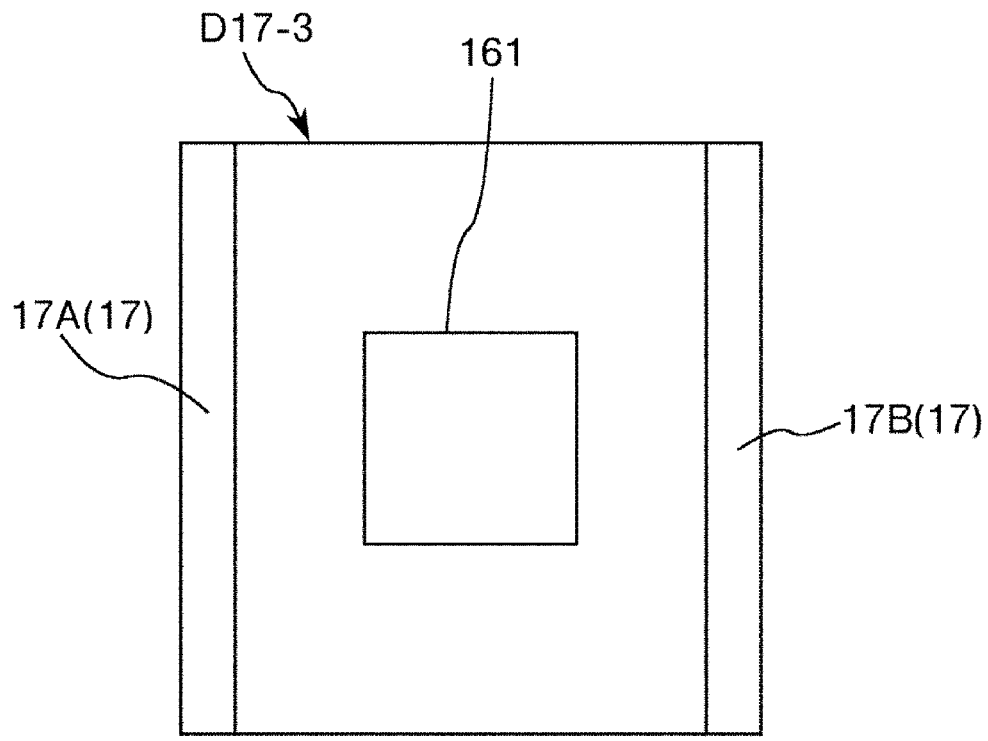
FIG. 59 is a view illustrating an image obtained by imaging a third image by the imaging section of the electronic component tester illustrated in FIG. 1.

Then, in step S808, the device transport head 17A and the device transport head 17B are returned to the start position Ps, and in step S802, imaging is performed once based on the third position information to obtain one image D17-3 as a third image (see FIG. 59).

When it is determined in step S803 that the recess 161 appears and it is determined in step S805 that the center of the recess 161 appears, in step S809, as the encoder value to be the trigger point at the time of transmitting the imaging instruction signal, during the actual test, the third position information is determined.

As such, in the electronic component handler 10, the control unit 800 can adjust the timing of the imaging start of the first camera 31 based on the position of at least one hold portion (the device transport head 17B in this embodiment) and the position of the recess (placement portion) 161 in the image captured by the first camera (imaging section) 31. With this configuration, it is possible to adjust so that the center of the recess 161 appears in the image captured by the first camera 31. Therefore, an accurate determination can be performed based on the captured image.

In the test unit (electronic component placement portion) 16, the IC device (electronic component) 90 is tested. The control unit 800 adjusts the timing of transmitting the imaging instruction signal prior to the test, and thus it is possible to adjust so that the center of the recess 161 appears in the image captured during the test. Therefore, an accurate determination can be performed based on the captured image.

In the above description, the case where the imaging timing is adjusted while the device transport head 17A and the device transport head 17B move to the −Y side has been described, but similarly, the imaging timing can be adjusted while the device transport head 17A and the device transport head 17B move to the +Y side. Furthermore, also in the case of moving in the Z direction in addition to the Y direction, the imaging timing can be adjusted similarly. That is, it is possible to adjust timing of the imaging start of the first camera (imaging section) 31 according to the movement direction of the device transport head 17A and the device transport head 17B (first hold portion and second hold portion). With this configuration, the imaging timing can be adjusted regardless of the movement direction of the device transport head 17A and the device transport head 17B.

In the electronic component handler 10, the control unit 800 can adjust the exposure time according to brightness of the image captured by the first camera (imaging section) 31, for example, by adjusting the shutter speed. With this configuration, it is possible to obtain an image (for example, an image in which the laser light L1 clearly appears when performing the first determination) suitable for performing a more accurate determination.

In the above description, the case where the imaging timing is adjusted in a state where the activation of the laser light source 41 and the illumination 5 is stopped has been described, but the imaging timing may be adjusted in a state where the laser light source 41 and the illumination 5 are activated. With this configuration, it is possible to more accurately adjust the imaging timing and adjust the exposure time.

It is possible to set the conditions (the moving speed of the device transport head 17A and the device transport head 17B, the arrangement form of the recess 161, and the like) in the adjustment of the imaging timing as described above by the monitor 300. FIG. 73 is a view illustrating an example of a setting screen of the monitor 300.

In the configuration illustrated in FIG. 73, the moving speed of the device transport head 17A and the device transport head 17B can be adjusted in five stages. The number of rows of the recesses 161 aligned in the test unit 16 in the Y direction can also be set.

In the image D17-3, it is preferable to trim only the central portion of the recess 161 in the determination. In this case, it is preferable that the center of the recess 161 coincides with the center of the image D17-3. With this configuration, it is possible to make the trimmed image as small as possible. As a result, it is possible to promptly perform data exchange with the control unit 800.

Nineteenth Embodiment

Hereinafter, a nineteenth embodiment of the electronic component handler and the electronic component tester of the present invention will be described with reference to FIGS. 61 to 71, but differences from the embodiments described above will be mainly described, and the description of the same matters will be omitted.

This embodiment is substantially the same as the eighteenth embodiment except that the control operation of the control unit is different.

The following control operation is an adjustment method of the timing at which the first camera 31 (the same applies to the second camera 33) performs imaging prior to the test of the IC device 90.

Figure 71:
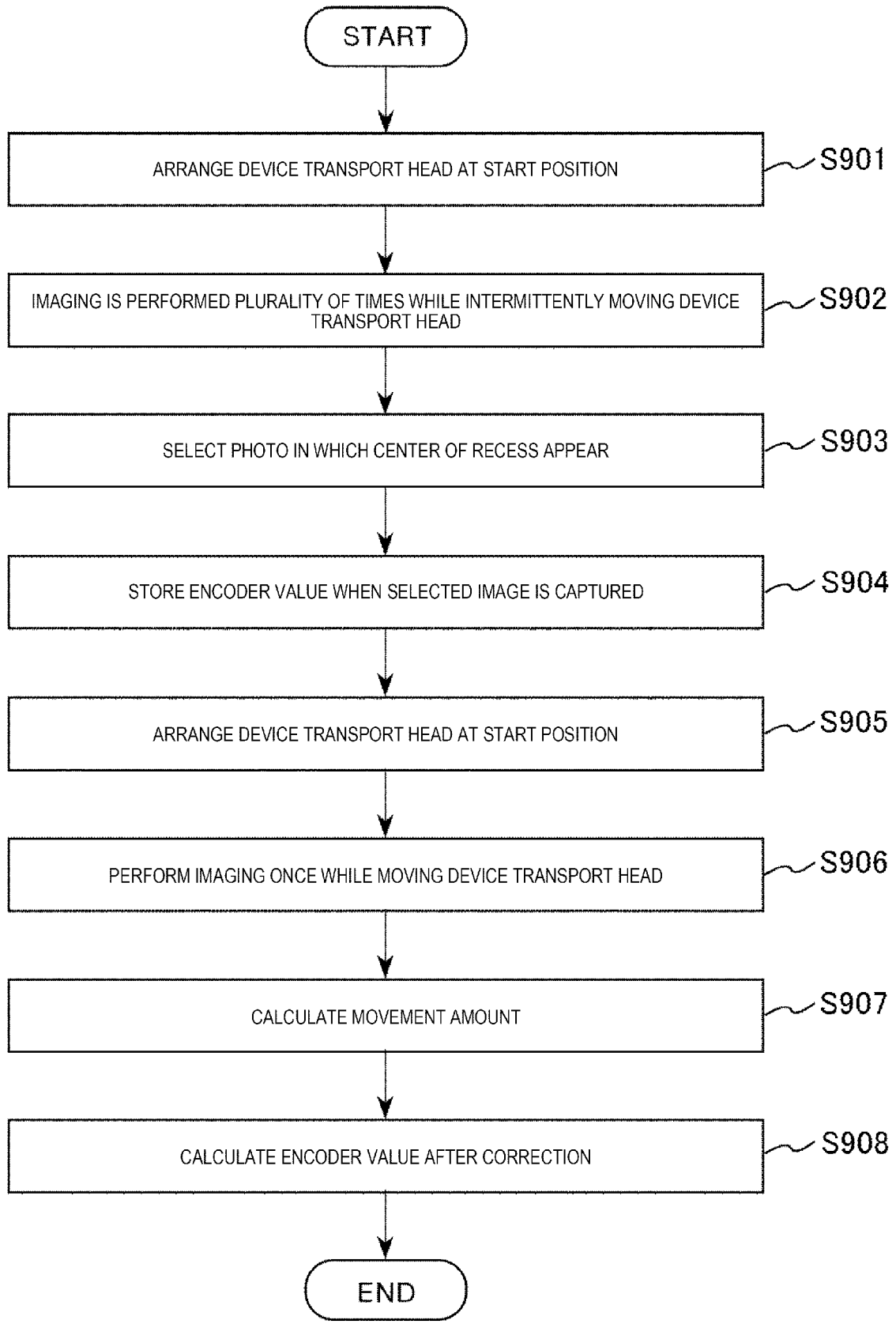
FIG. 71 is a flowchart for explaining the control operation of the control unit included in the nineteenth embodiment of the electronic component tester of the present invention.

In step S901 of FIG. 71, first, the device transport head 17A and the device transport head 17B are arranged at the start position Ps. For example, as illustrated in FIG. 61, the start position Ps is a position at which the recess 161 starts to appear.

Next, in step S902, the device transport head 17A and the device transport head 17B are intermittently moved to the end position Pe in the −Y direction. Then, when the device transport head 17A and the device transport head 17B are stopped, the recess 161 is imaged a plurality of times (five times in this embodiment) through the gap S (see FIGS. 61 to 70).

The position at which the image is captured from the start position Ps to the end position Pe is stored in advance in the memory 802, based on the encoder value of the device transport head 17A or the device transport head 17B. This encoder value is set, for example, according to the position of the first camera 31. In this step, as an example, five images are captured.

Figure 61:
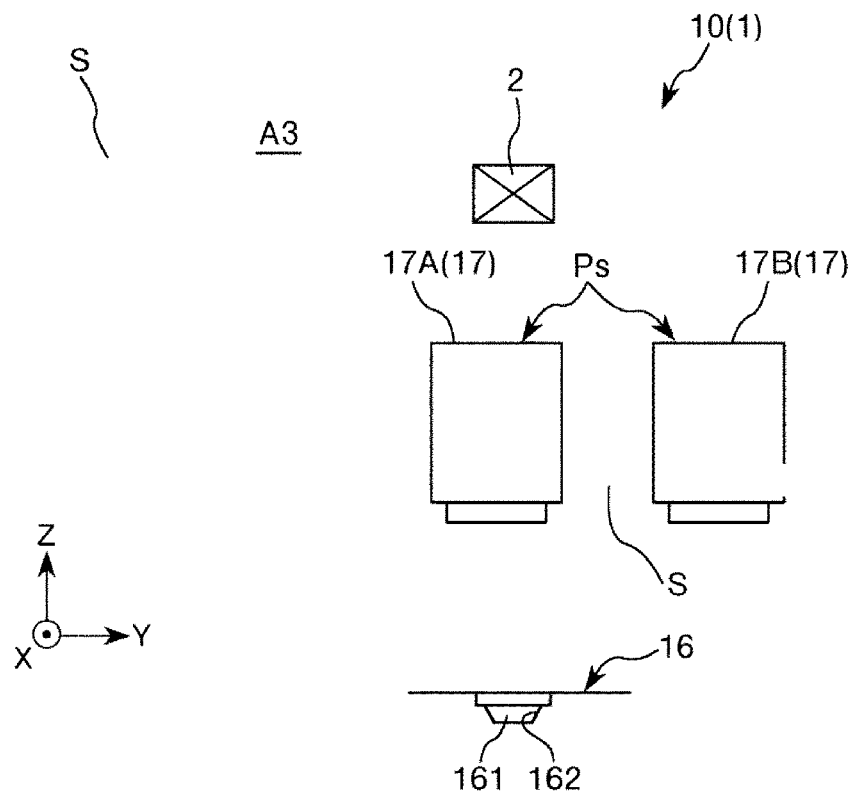
FIG. 61 is a side view of a device transport head of a nineteenth embodiment of the electronic component tester of the present invention, and is a view illustrating the state where adjustment of imaging timing is performed before test is performed.
Figure 62:
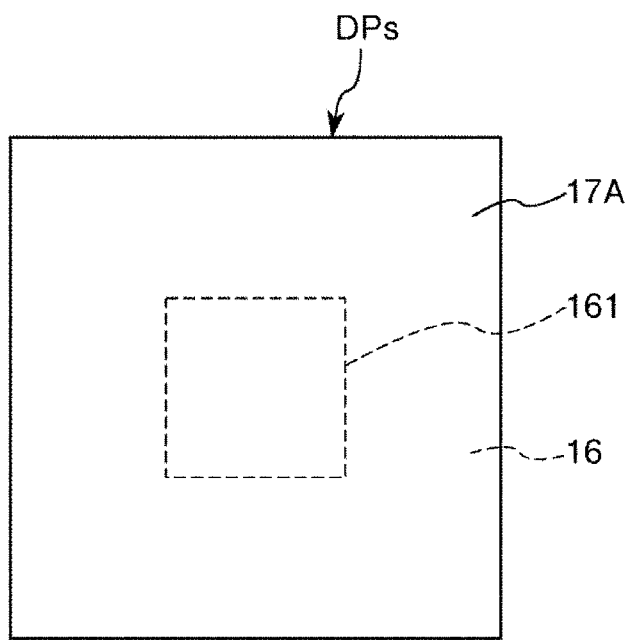
FIG. 62 is a view illustrating an image captured by the imaging section in the state illustrated in FIG. 61.

As illustrated in FIGS. 61 and 62, in the image DPs captured at the start position Ps, the device transport head 17A is reflected on the entire surface, and the recess 161 is not reflected.

Figure 63:
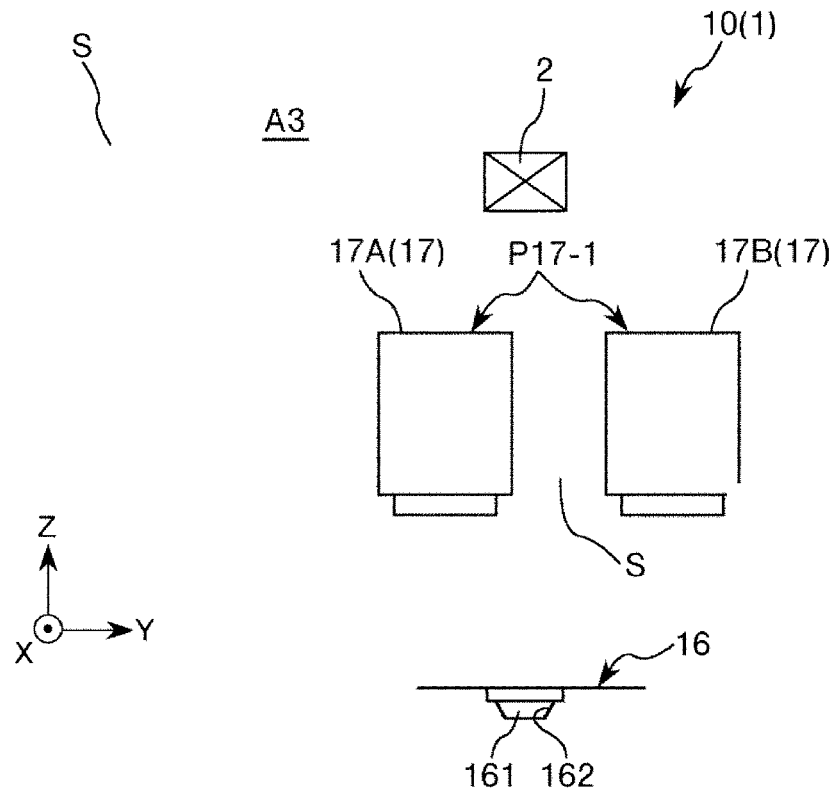
FIG. 63 is a side view of a device transport head provided in the nineteenth embodiment of the electronic component tester of the present invention, and is a view illustrating the state where adjustment of imaging timing is performed before test is performed.
Figure 64:
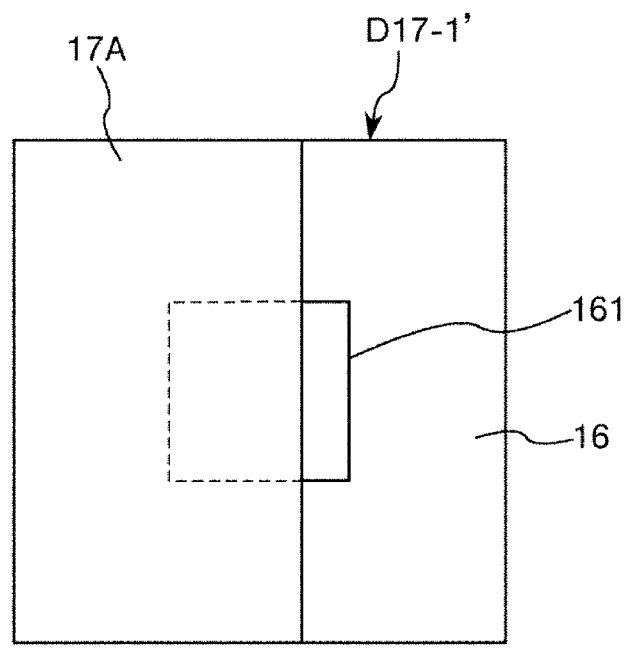
FIG. 64 is a view illustrating an image captured by the imaging section in the state illustrated in FIG. 63.

As illustrated in FIGS. 63 and 64, in the image D17-1' captured at the position P17-1 moved in the −Y direction from the start position Ps, the part of the device transport head 17A appears, a part of the recess 161 is shielded by the device transport head 17A, and the rest of the recess 161 is reflected.

Figure 65:
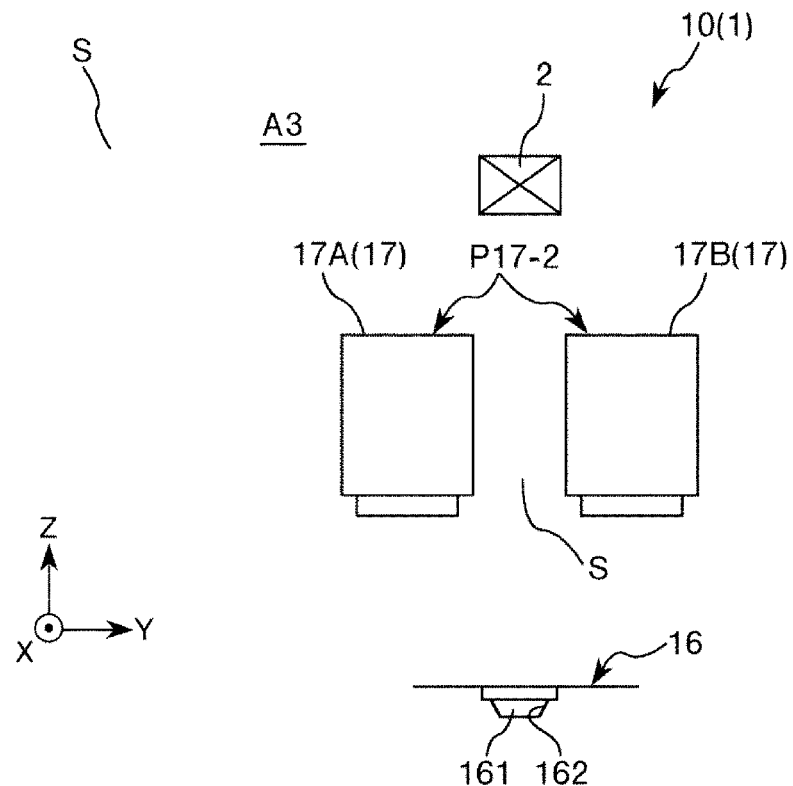
FIG. 65 is a side view of the device transport head provided in the nineteenth embodiment of the electronic component tester of the present invention, and is a view illustrating the state where adjustment of imaging timing is performed before test is performed.
Figure 66:
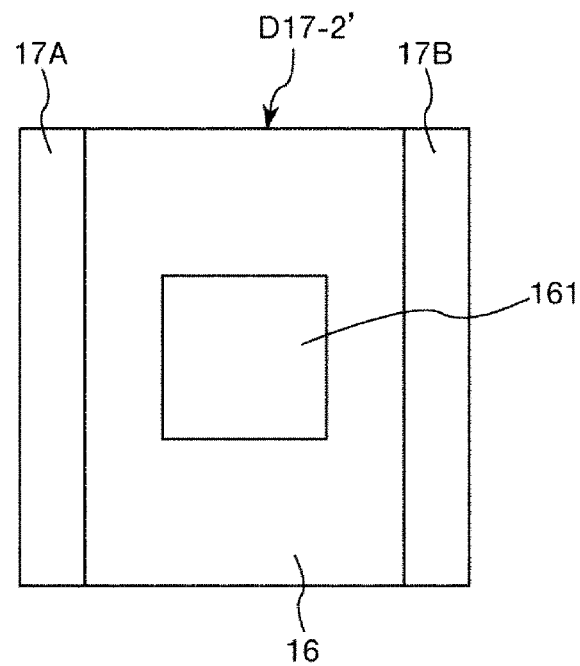
FIG. 66 is a view illustrating an image captured by the imaging section in the state illustrated in FIG. 65.

As illustrated in FIGS. 65 and 66, in the image D17-2' captured at a position P17-2 moved in the −Y direction from the position P17-1, although a part of the device transport head 17A and the device transport head 17B appear, the center of the recess 161 appears.

Figure 67:
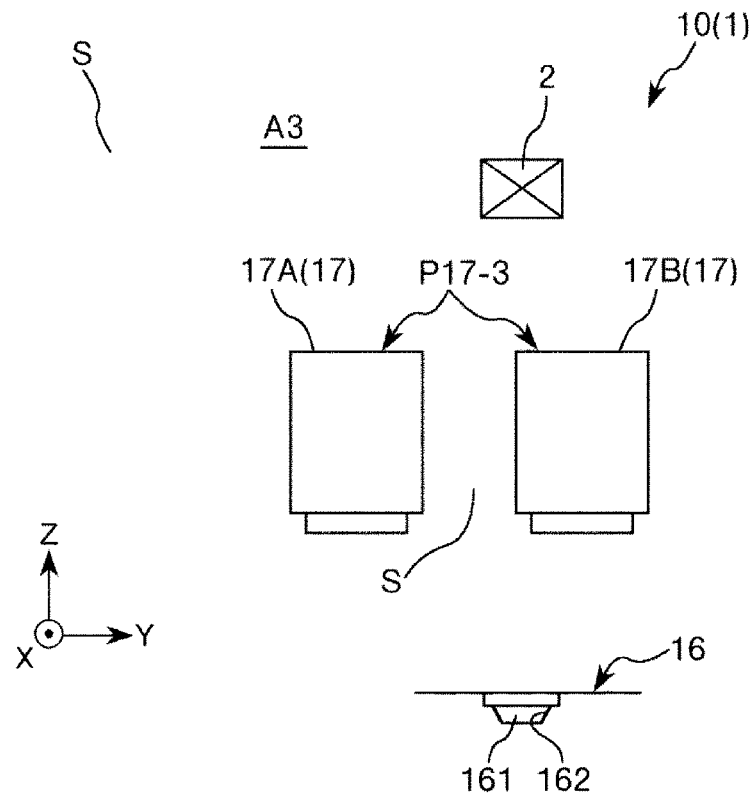
FIG. 67 is a side view of the device transport head of the nineteenth embodiment of the electronic component tester of the present invention, and is a view illustrating a state where adjustment of the imaging timing is performed before test is performed.
Figure 68:
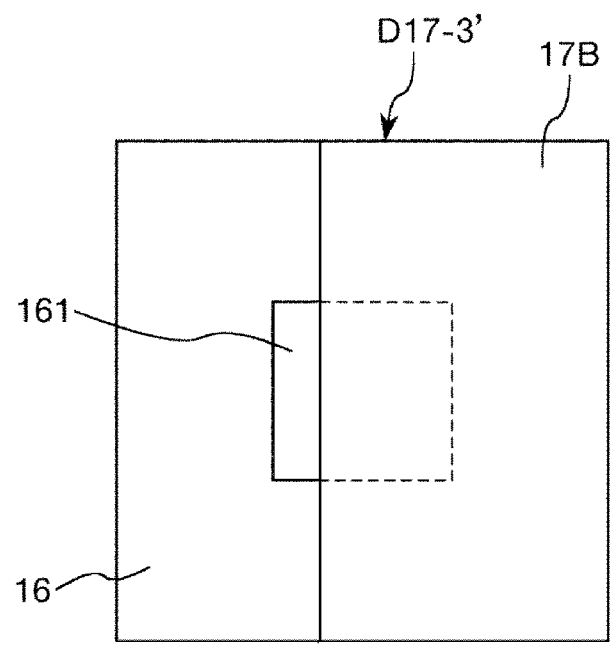
FIG. 68 is a view illustrating an image captured by the imaging section in the state illustrated in FIG. 67.

As illustrated in FIGS. 67 and 68, in the image D17-3' captured at the position P17-3 moved in the −Y direction from the position P17-2, a part of the device transport head 17B is appears, a part of the recess 161 is shielded by the device transport head 17B, and the rest of the recess 161 is reflected.

Figure 69:
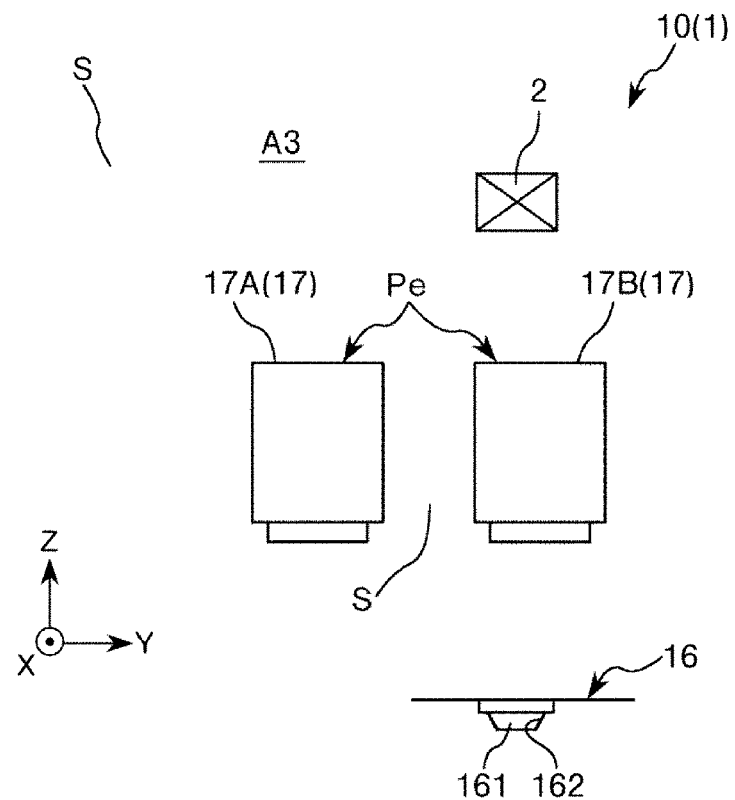
FIG. 69 is a side view of a device transport head of the nineteenth embodiment of the electronic component tester of the present invention, and is a view illustrating a state where adjustment of the imaging timing is performed before test is performed.
Figure 70:
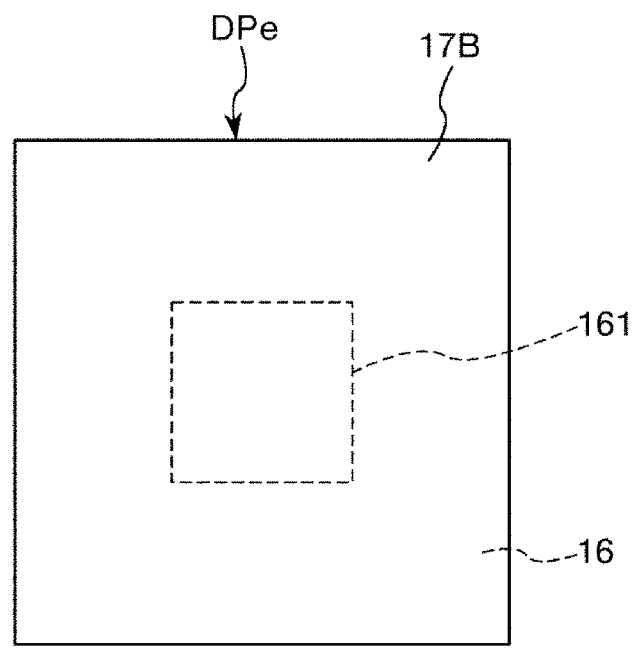
FIG. 70 is a view illustrating an image captured by the imaging section in the state illustrated in FIG. 69.

As illustrated in FIGS. 69 and 70, in the image DPe captured at the end position Pe, the device transport head 17B is reflected on the entire surface, and the recess 161 is not reflected.

As such, in step S902, a plurality of images (five images in this embodiment) are captured in a stopped state.

Next, in step S903, an image suitable for determination from the image DPs, the image D17-1', the image D17-2', the image D17-3', and the image DPe, that is, the image (image D17-2') in which the center of the recess 161 appears is selected.

Next, in step S904, when the selected image D17-2' is captured, that is, the encoder value at the position P17-2, is stored.

Next, in step S905, the device transport head 17A and the device transport head 17B are returned to the start position Ps.

In step S906, imaging is performed at the position P17-2 based on the encoder value while moving the device transport head 17A and the device transport head 17B from the start position Ps toward the end position Pe. In this step, while continuously moving the device transport head 17A and the device transport head 17B, imaging is performed at the position P17-2 in the moving state.

Next, in step S907, the image captured in step S906 is compared with the image selected in step S903. Hereinafter, as an example, a case where the image captured in step S906 is the image D17-3' illustrated in FIG. 68 will be described.

Even if the imaging is performed at the position P17-2, when the obtained image is not the image D17-2' but the image D17-3', how much the device transport head 17B has moved from when the control unit 800 transmits the imaging instruction signal until when the first camera 31 actually performs imaging is calculated, based on the position of the device transport head 17B in the image D17-2' and the position of the device transport head 17B in the image D17-3'.

In this calculation, the movement amount is calculated by comparing arbitrary portions (for example, end portions) with each other among portions appearing in both the image D17-2' and the image D17-3' of the device transport head 17B.

In step S908, an encoder value for transmitting the imaging instruction signal is calculated in consideration of the movement amount for the encoder value of the device transport head 17A and the device transport head 17B at the position P17-2. That is, an encoder value (corrected encoder value) when the device transport head 17A and the device transport head 17B are positioned on the +Y side by the amount of movement than the position P17-2 is calculated. When the imaging instruction signal is transmitted to the first camera 31 at the corrected encoder value, the image D17-2' can be obtained.

As such, the control unit 800 can adjust the timing at which the imaging instruction signal is transmitted to the first camera 31 which is the imaging section. Specifically, it is possible to adjust the timing at which the first camera 31, which is the imaging section, starts imaging. With this configuration, it is possible to transmit the imaging instruction signal to the first camera 31 in consideration of the time lag from when the imaging instruction signal is transmitted until when the first camera 31 actually starts imaging. Therefore, despite the time lag, it is possible to obtain a desired image, that is, an image (image D17-3) suitable for determination.

As described above, in this embodiment, based on the imaging result (image D17-2') of the first camera (imaging section) 31 and the first position information (encoder value when imaging the image D17-2'), the control unit 800 performs a first adjustment (step S904) of determining (adjusting) the timing at which the imaging instruction signal is transmitted to the first camera 31. Then, after the first adjustment, based on the movement amount of at least one hold portion (device transport head 17B) until the first camera 31 starts imaging after the imaging instruction signal is transmitted, the control unit 800 performs a second adjustment of adjusting the timing at which the imaging instruction signal is transmitted to the first camera 31. With this configuration, regardless of individual differences of the first camera 31, in consideration of the time lag from when the imaging instruction signal is transmitted until when the first camera 31 actually starts imaging, the imaging instruction signal can be transmitted at the optimum timing. As a result, it is possible to obtain an image (the image D17-3) suitable for the determination regardless of individual differences of the first camera 31.

The image D17-3 is preferably used by trimming only the center portion of the recess 161 in determination. In this case, it is preferable that the center of the recess 161 coincides with the center of the image D17-3. With this configuration, it is possible to make the trimmed image as small as possible. As a result, it is possible to promptly perform exchange data with the control unit 800.

Twentieth Embodiment

Hereinafter, a twentieth embodiment of the electronic component handler and the electronic component tester of the present invention will be described with reference to FIG. 72, but the differences from the embodiments described above will be mainly described, the description of the same matters will be omitted.

This embodiment is the same as the eighteenth embodiment except that a control unit is provided in the imaging section.

Figure 72:
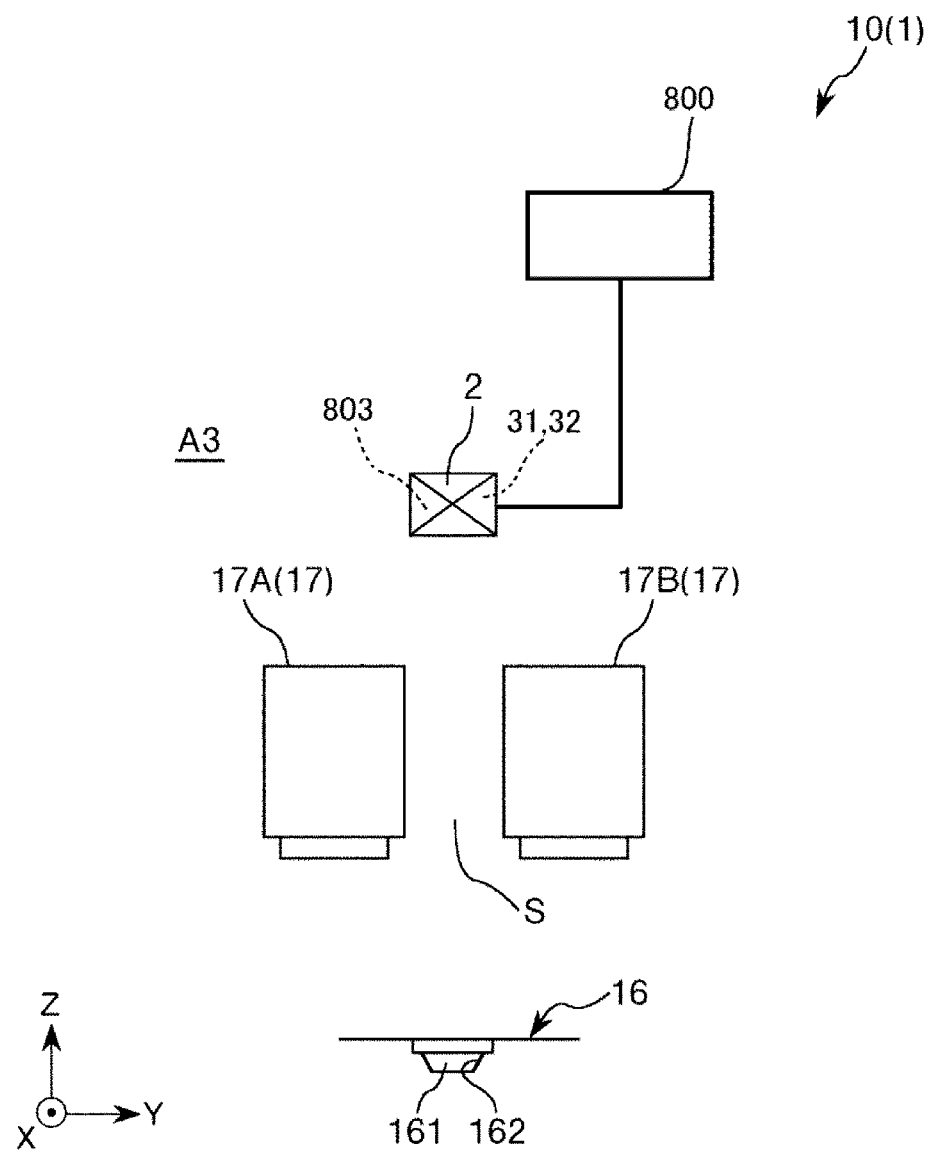
FIG. 72 is a side view of a device transport head of a twentieth embodiment of the electronic component tester of the present invention.

As illustrated in FIG. 72, in this embodiment, the control unit 803 is built in each of the first camera 31 and the second camera 33, separately from the control unit 800. That is, the electronic component handler 10 includes a control unit (first control unit) 800 and a control unit (second control unit) 803. Hereinafter, the control unit 803 of the first camera 31 will be representatively described.

The control unit 803 performs exposure to the imaging elements of the first camera 31 a plurality of times (for example, twice), and determines at least one of the first determination and the second determination based on the image. Then, the control unit 803 transmits the determination result to the control unit 800.

Based on the transmitted determination result, the control unit 800 stops the activation of the device transport head 17A and the device transport head 17B, or notifies the determination result by the monitor 300 and the speaker 500.

According to this embodiment as such, since communication of image data between the control unit 800 and the first camera 31 (the same also applies to the second camera 33) is omitted and only the determination result is transmitted by an electric signal, it is possible to speed up the first determination and the second determination. Furthermore, it is possible to quickly perform the operation after the determination, and it is possible to effectively suppress the reduction in throughput of the electronic component handler 10.

Although the electronic component handler and the electronic component tester according to the present invention have been described with reference to the illustrated embodiments, the present invention is not limited thereto, and respective units constituting the electronic component handler and the electronic component tester can be replaced by those having any configurations which can exhibit the same function. In addition, any constituent element may be added thereto.

The electronic component handler and the electronic component tester of the present invention may be any combination of any two or more of the embodiments described above.

In the electronic component handler of the present invention, the imaging section may be one that captures a full color image or one that captures a monochrome image.

In performing the first determination, although a configuration is used in which the line of the laser light with which the bottom portion of the first recess is irradiated and the line of the laser light with which bottom portion of the second recess or the upper surface of the electronic component is irradiated are compared, that is, a configuration based on the line of the laser light with which the bottom portion of the first recess is irradiated has been described, the present invention is not limited thereto. For example, a line of laser light with which the upper surface of the test unit is irradiated to may be used as a reference.

In each of the embodiments described above, a case where a motor is used as the light reflection portion driving unit has been described, but the present invention is not limited thereto. For example, a solenoid, a micro electro mechanical system (MEMS) structure, or the like may be used.

Further, in each of the embodiments described above, a case is described in which the determination is performed by selecting the image in which all of the recesses is reflected among the images captured by the imaging section, but the present invention is not limited thereto, the whole of the recess may not necessarily be reflected as long as the center of the recess is reflected.

The entire disclosures of Japanese Patent Application Nos. 2016-230939, filed Nov. 29, 2016, 2016-230940, filed Nov. 29, 2016, 2016-239897, filed Dec. 9, 2016, 2016-257051, filed Dec. 28, 2016, 2017-097940, filed May 17, 2017, and 2017-220300, filed Nov. 15, 2017 are expressly incorporated by reference herein.

The invention claimed is:

1. An electronic component handler comprising:
    a first holder that is movable in a first direction and a second direction different from the first direction and is capable of holding an electronic component;
    a second holder that is movable in the first direction and the second direction independently of the first holder and is capable of holding the electronic component;
    a light irradiation section that is arranged so as to be capable of irradiating an electronic component placement portion, on which the electronic component is placed with light through a gap between the first holder and the second holder; and
    an imaging section that is capable of imaging the electronic component placement portion irradiated with the light in the first direction,
    wherein it is determined whether or not the electronic component is placed on the electronic component placement portion based on the imaging result obtained by imaging by the imaging section.

2. The electronic component handler according to claim 1, wherein the first holder and the second holder are arranged in the second direction.

3. The electronic component handler according to claim 1, wherein the first holder and the second holder are simultaneously movable in the second direction.

4. The electronic component handler according to claim 1, wherein the first holder is positioned between the imaging section and the electronic component when pushing the electronic component against the electronic component placement portion, and
the second holder is positioned between the imaging section and the electronic component when pushing the electronic component against the electronic component placement portion.

5. The electronic component handler according to claim 1, wherein the light irradiation section performs irradiation with the light in a direction at least intersecting the first direction and not orthogonal to the first direction.

6. The electronic component handler according to claim 1, wherein the direction of the light with which the light irradiation section performs irradiation is capable of being adjusted.

7. The electronic component handler according to claim 1, further comprising:
an irradiation position determination unit for determining whether or not the direction in which the light irradiation section performs irradiation with the light is a predetermined direction.

8. The electronic component handler according to claim 1, wherein the light irradiation section performs irradiation with the light whose irradiation shape at an irradiation destination is a linear shape extending in the second direction.

9. The electronic component handler according to claim 1, wherein a plurality of the light irradiation sections are provided.

10. The electronic component handler according to claim 9, wherein the electronic component placement portions include a plurality of recesses arranged along a third direction intersecting the first direction and the second direction and accommodate the electronic component, and
the light irradiation sections are arranged along the third direction.

11. The electronic component handler according to claim 1, further comprising:
a light reflection portion that reflects the light emitted from the light irradiation section.

12. The electronic component handler according to claim 11, wherein the light reflection portion is configured to be pivotable,
the light reflection portion has a light reflection surface that reflects the light, and
a pivot axis of the light reflection portion is positioned on the light reflection surface.

13. The electronic component handler according to claim 11, wherein a plurality of the light irradiation sections and a plurality of the light reflection portions are provided, and
the light reflection portions are arranged in a third direction intersecting the first direction and the second direction.

14. The electronic component handler according to claim 13, wherein an optical axis of the imaging section intersects an extension line in a direction in which the light reflection portions are aligned.

15. The electronic component handler according to claim 13, further comprising:
light reflection portion driving units for pivoting the light reflection portion,
wherein respective light reflection portion driving units are arranged along the third direction intersecting the first direction and the second direction, and
the light reflection portion driving units adjacent in the third direction are arranged to be shifted in the second direction.

16. The electronic component handler according to claim 1, wherein the imaging section is capable of imaging the electronic component placement portion through a gap between the first holder and the second holder, between the imaging start time and the imaging end time.

17. The electronic component handler according to claim 1, wherein the light irradiation section performs irradiation with the light before the imaging start time and stops irradiation with the light after the imaging end time.

18. The electronic component handler according to claim 1, wherein the electronic component placement portion is a test unit by which the electronic component is tested.

19. The electronic component handler according to claim 1, wherein the electronic component placement portion includes a recess for accommodating the electronic component,
the recess has an inner circumferential surface inclined with respect to a third direction which is the direction intersecting the first direction and the second direction, and
an incident angle of the light emitted from the light irradiation section is smaller than an angle between the inner circumferential surface of the recess and the third direction.

20. An electronic component tester comprising:
a first holder that is movable in a first direction and a second direction different from the first direction and is capable of holding an electronic component;
a second holder that is movable in the first direction and the second direction independently of the first holder and is capable of holding the electronic component;
a light irradiation section that is arranged so as to be capable of irradiating an electronic component placement portion, on which the electronic component is placed, with light through a gap between the first holder and the second holder;
an imaging section that is capable of imaging the electronic component placement portion irradiated with the light in the first direction; and
a test unit that tests the electronic component, and
wherein it is determined whether or not the electronic component is placed on the electronic component placement portion based on the imaging result obtained by imaging by the imaging section.

* * * * *